(12) United States Patent
Kadota et al.

(10) Patent No.: US 7,568,284 B2
(45) Date of Patent: Aug. 4, 2009

(54) COMPONENTS INSERTION METHOD

(75) Inventors: Shozo Kadota, Osaka (JP); Kazuaki Kosaka, Katano (JP); Minoru Kitani, Takatsuki (JP)

(73) Assignee: Panasonic Corporation, Osaka (JP)

( * ) Notice: Subject to any disclaimer, the term of this patent is extended or adjusted under 35 U.S.C. 154(b) by 330 days.

(21) Appl. No.: 10/521,754

(22) PCT Filed: Jul. 17, 2003

(86) PCT No.: PCT/JP03/09076

§ 371 (c)(1),
(2), (4) Date: Jan. 19, 2005

(87) PCT Pub. No.: WO2004/010758

PCT Pub. Date: Jan. 29, 2004

(65) Prior Publication Data

US 2006/0164794 A1 Jul. 27, 2006

(30) Foreign Application Priority Data

Jul. 19, 2002 (JP) .............. 2002-211441
Sep. 12, 2002 (JP) .............. 2002-266663
Dec. 20, 2002 (JP) .............. 2002-370637

(51) Int. Cl.
*H05K 3/30* (2006.01)
(52) U.S. Cl. .............. 29/837; 29/833; 29/836; 29/741
(58) Field of Classification Search ........ 29/832–838, 29/739–741
See application file for complete search history.

(56) References Cited

U.S. PATENT DOCUMENTS

| 4,530,636 A | | 7/1985 | Inaba et al. | |
|---|---|---|---|---|
| 4,628,595 A | * | 12/1986 | Fujita et al. | ........ 29/741 |
| 4,680,523 A | | 7/1987 | Goumas et al. | |
| 4,810,018 A | | 3/1989 | van de Ven et al. | |
| 4,833,776 A | | 5/1989 | Wakamiya et al. | |
| 4,944,086 A | * | 7/1990 | Nishihara et al. | ........ 29/837 |

FOREIGN PATENT DOCUMENTS

| EP | 1 117 286 | 7/2001 |
|---|---|---|
| JP | 57-66887 | 4/1982 |
| JP | 5-198967 | 8/1983 |
| JP | 59-227200 | 12/1984 |
| JP | 63-236400 | 10/1988 |
| JP | 1-162300 | 11/1989 |
| JP | 06-039651 | 2/1994 |
| JP | 8-51300 | 2/1996 |
| JP | 9-008496 | 1/1997 |
| JP | 11-177294 | 7/1999 |
| JP | 2001-102795 | 4/2001 |

* cited by examiner

*Primary Examiner*—Donghai D. Nguyen
(74) *Attorney, Agent, or Firm*—Wenderoth, Lind & Ponack, L.L.P.

(57) ABSTRACT

In a component insertion head, by grasping of a device portion of a component by a device chuck, a lead wire is stretched on a fulcrum given by a grasping position of the lead wire by a transfer chuck so that the device portion is placed at a component insertion position, by which correction of an insertion posture of the component is performed, and the lead wire of the component that has been corrected in terms of its insertion posture is inserted into an insertion hole of a board.

3 Claims, 39 Drawing Sheets

Fig. 30
| COMPONENT CATEGORY | GRASPING PRESSURE | | | |
|---|---|---|---|---|
| | GRASPING NO GOOD | | GRASPING GOOD | |
| A | STRONG | 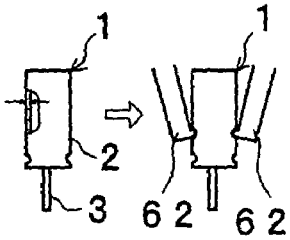<br>OCCURRENCE OF DEFORMATION | WEAK | 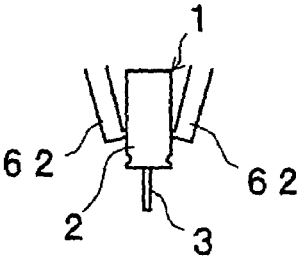 |
| B | WEAK | 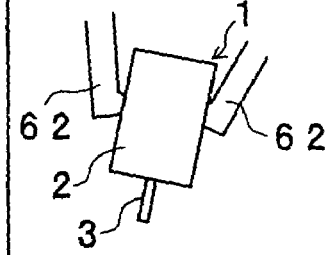<br>UNSTABLE | STRONG | 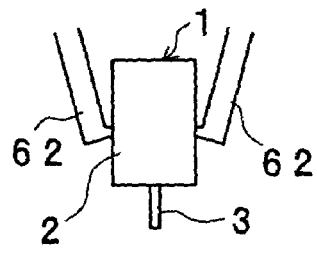 |
| C | STRONG | 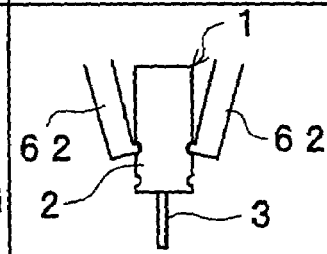<br>OCCURRENCE OF DEFORMATION (POTENTIAL) | WEAK | 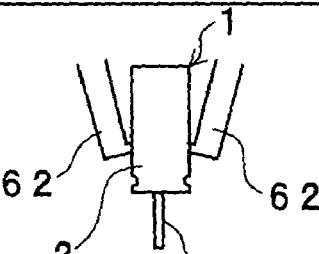 |
| D | WEAK | 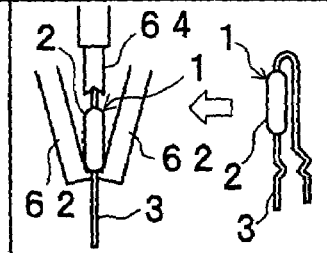<br>OCCURRENCE OF SLIDE | STRONG | 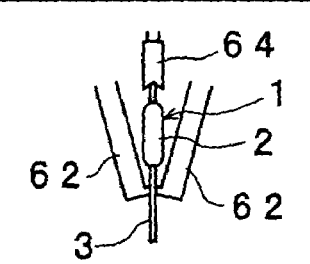 |

Fig. 31
| COMPONENT CATEGORY | PUSHER PRESSING FORCE (FOR PRESS-DOWN) | | | |
|---|---|---|---|---|
| | NO GOOD | | GOOD | |
| A | STRONG | 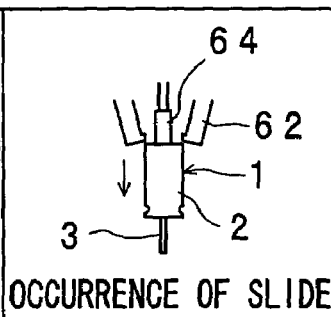<br>OCCURRENCE OF SLIDE | WEAK | 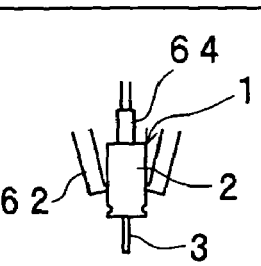 |
| B | WEAK | 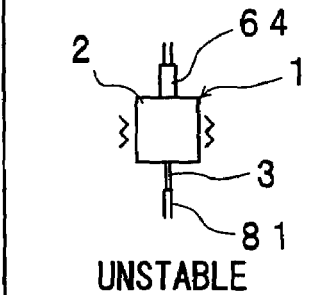<br>UNSTABLE | STRONG | 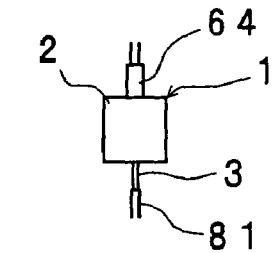 |
| C | STRONG | 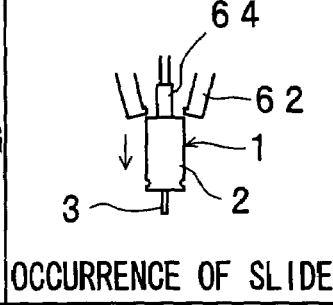<br>OCCURRENCE OF SLIDE | WEAK | 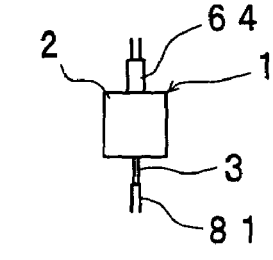 |
| D | STRONG | 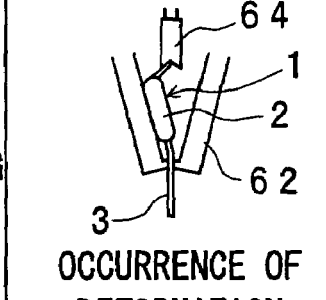<br>OCCURRENCE OF DEFORMATION | WEAK | 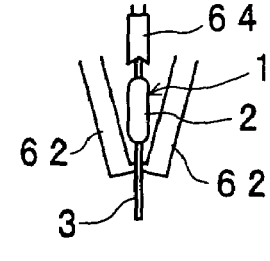 |

Fig. 32
| COMPONENT CATEGORY | PUSHER PRESSING FORCE (FOR CUT-AND-CLINCH) | | | |
|---|---|---|---|---|
| | NO GOOD | | GOOD | |
| A | STRONG | 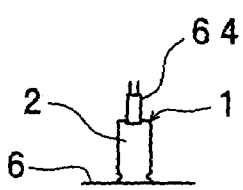<br>OCCURRENCE OF DEFORMATION | WEAK | 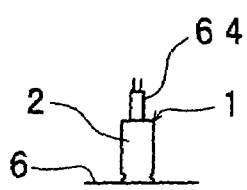 |
| B | STRONG | 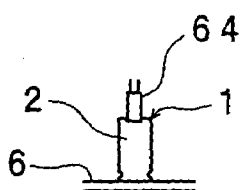<br>OCCURRENCE OF DEFORMATION | WEAK | 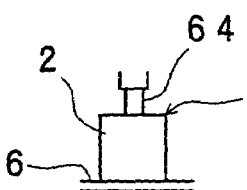 |
| C | WEAK | 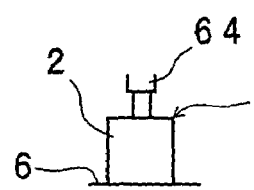<br>INSUFFICIENT BENDING | STRONG | 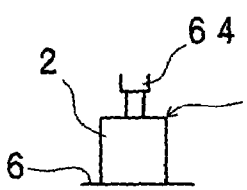 |
| D | STRONG | 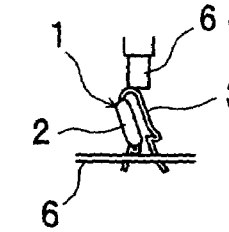<br>OCCURRENCE OF BUCKLING | WEAK | 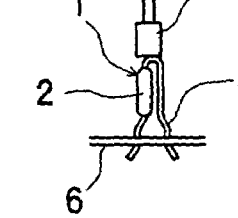 |

Fig. 33
| COMPONENT CATEGORY | COMPONENT EXAMPLE | GRASPING PRESSURE | PRESSING FORCE (FOR PRESS-DOWN) | PRESSING FORCE (FOR CUT-AND-CLINCH) |
|---|---|---|---|---|
| STANDARD | LEAD-EXTENDED TYPE  PRE-SET VOLUME TYPE  | 100% | 100% | 100% |

Fig. 34

| COMPONENT CATEGORY | COMPONENT EXAMPLE | GRASPING PRESSURE | PRESSING FORCE (FOR PRESS-DOWN) | PRESSING FORCE (FOR CUT-AND-CLINCH) |
|---|---|---|---|---|
| A | ELECTROLYTIC CAPACITOR RELATED<br><br>OSCILLATOR RELATED | 80% | 80% | 80% |
| B | LARGE-SIZED ELECTROLYTIC CAPACITOR RELATED<br><br>SHIELDED COIL RELATED | 120% | 120% | 100% |

Fig. 35

| COMPONENT CATEGORY | COMPONENT EXAMPLE | GRASPING PRESSURE | PRESSING FORCE (FOR PRESS-DOWN) | PRESSING FORCE (FOR CUT-AND-CLINCH) |
|---|---|---|---|---|
| C | CONNECTOR TYPE (I)<br>CONNECTOR TYPE (II) | 100% | 100% | 120% |
| D | AXIAL TYPE<br>FLOATING TYPE | 100% | 100% | 80% |

*Fig.38* - PRIOR ART
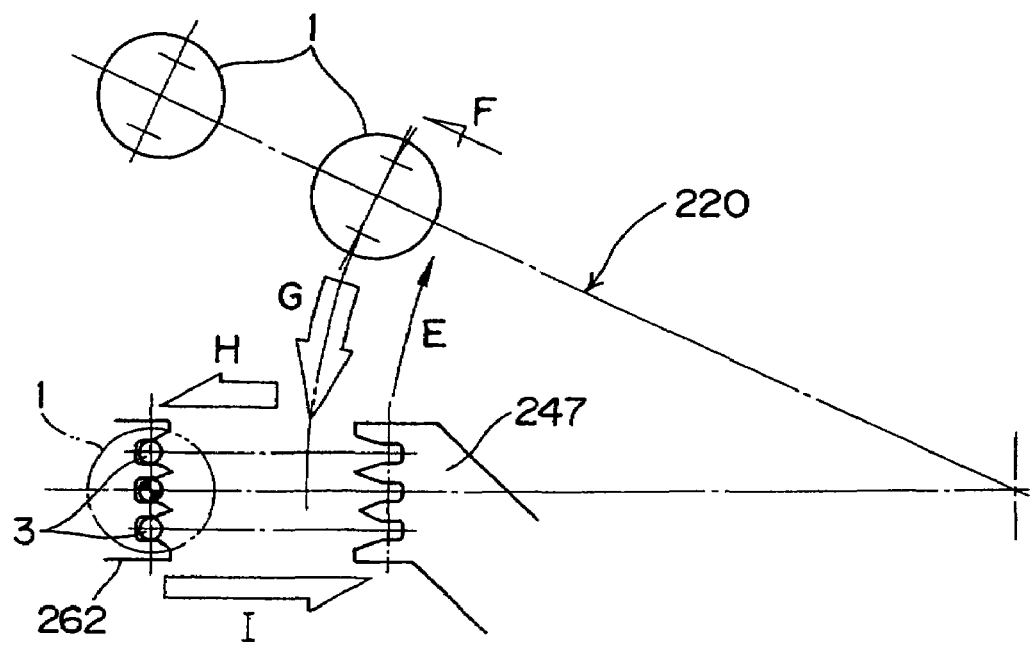
*Fig.39*
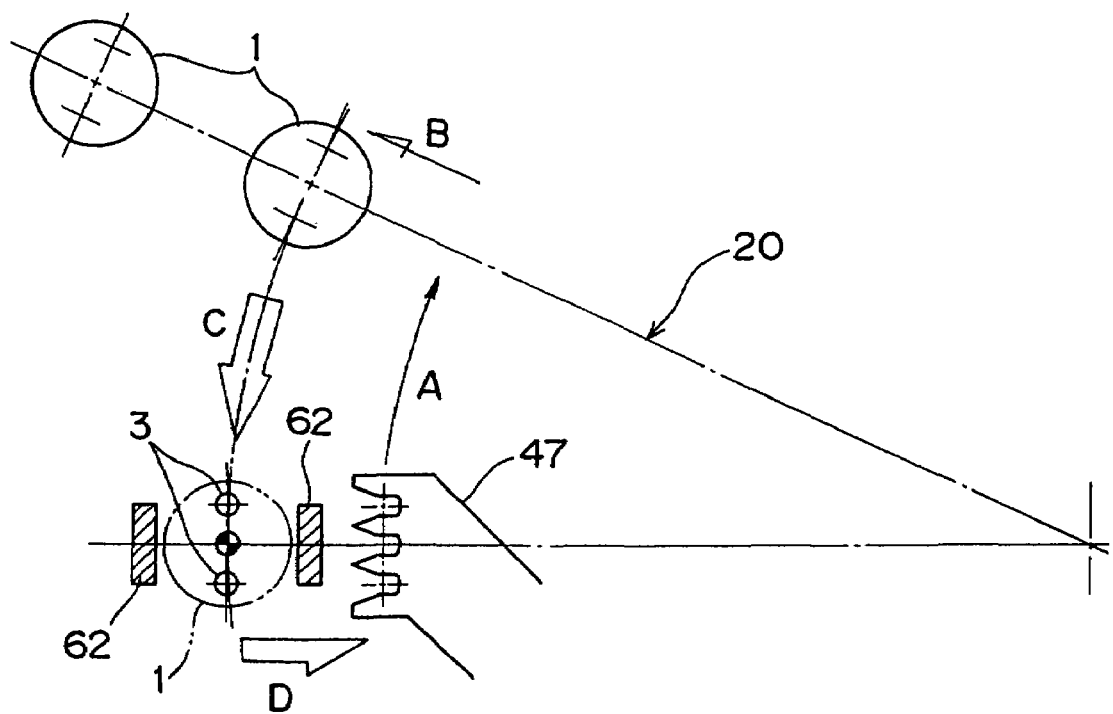

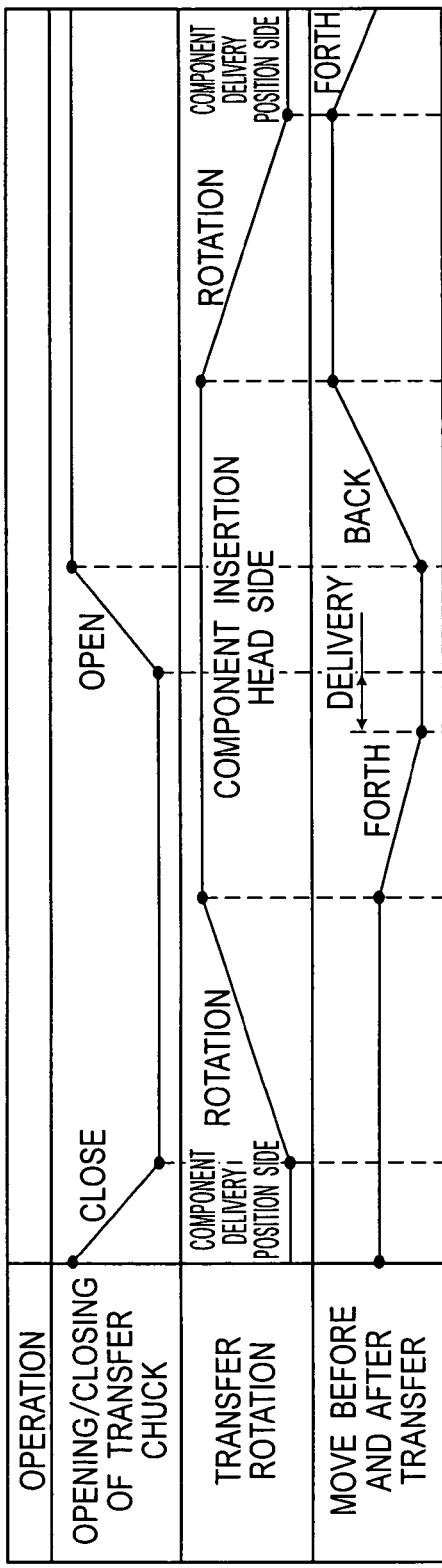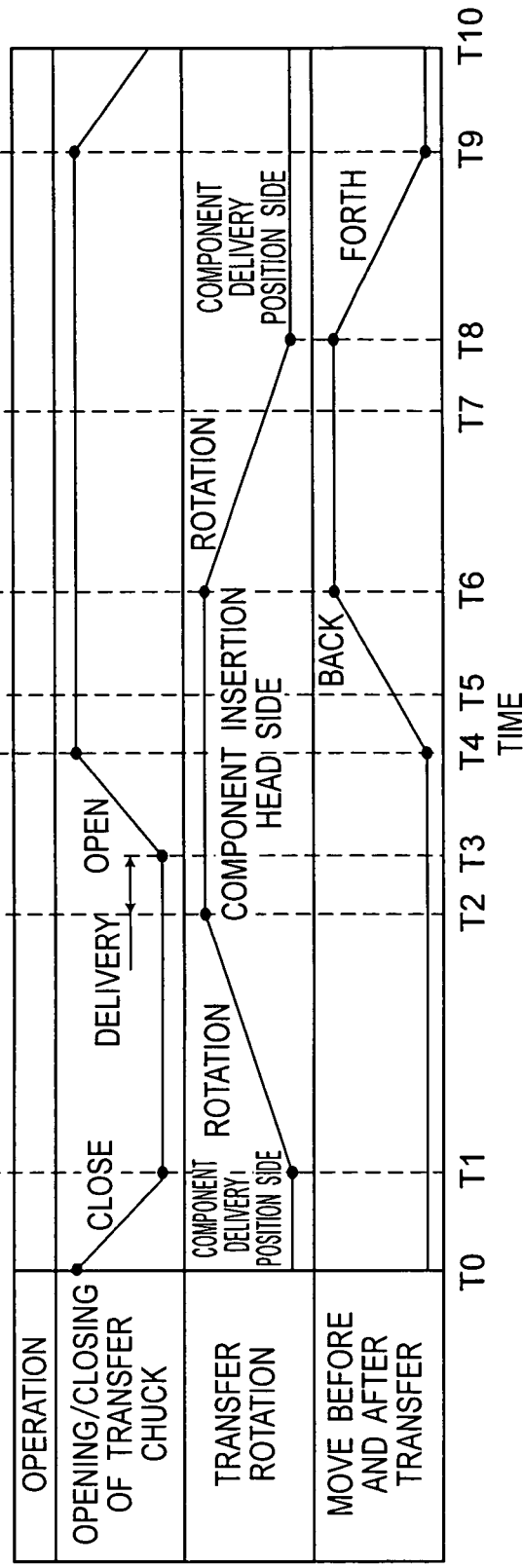

*Fig. 43* - PRIOR ART
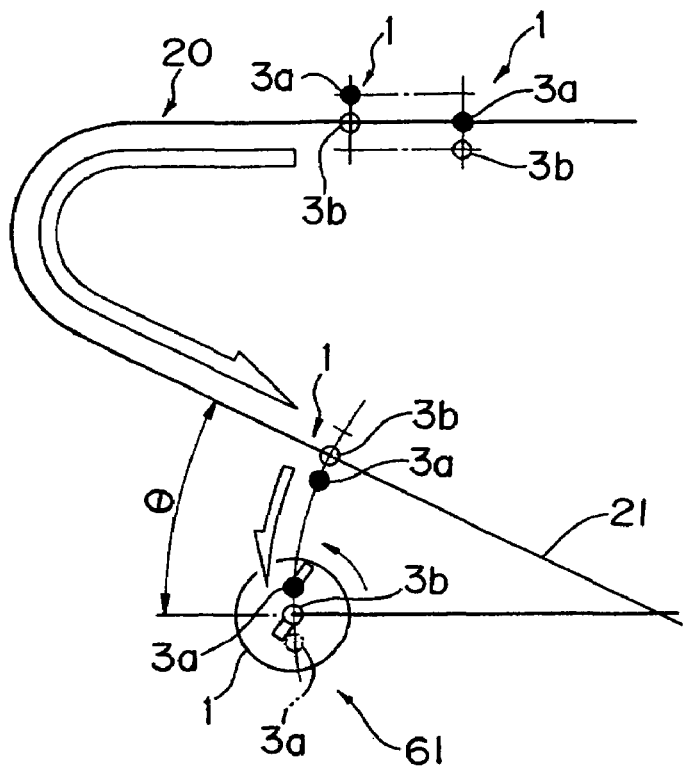
*Fig. 44*
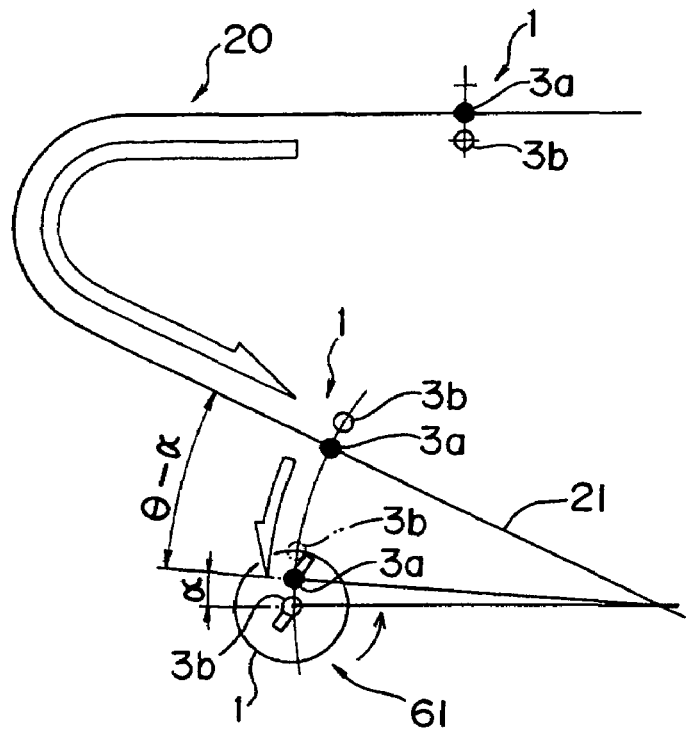

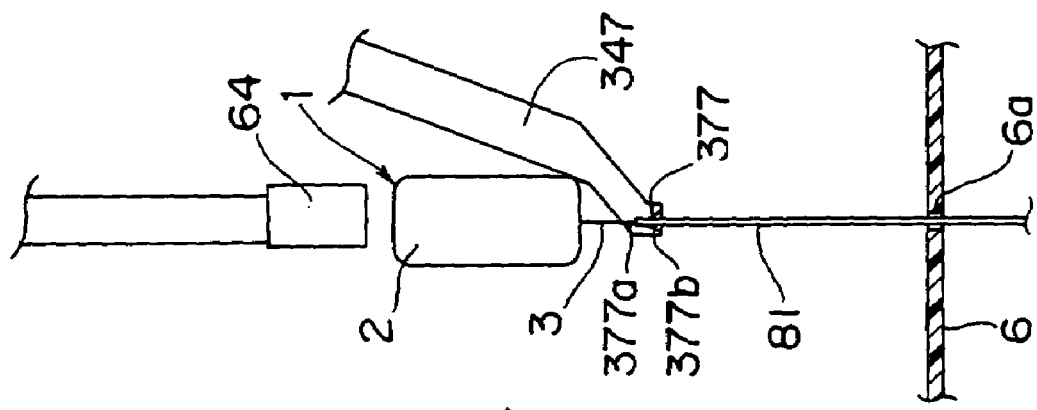
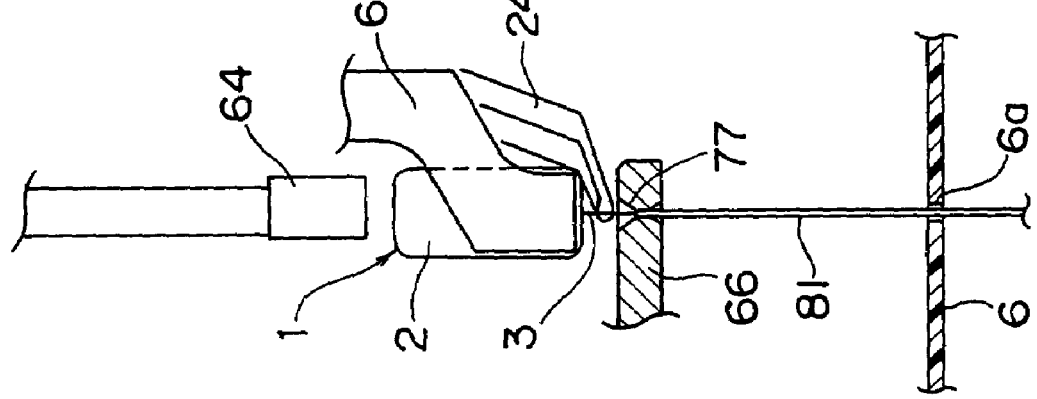
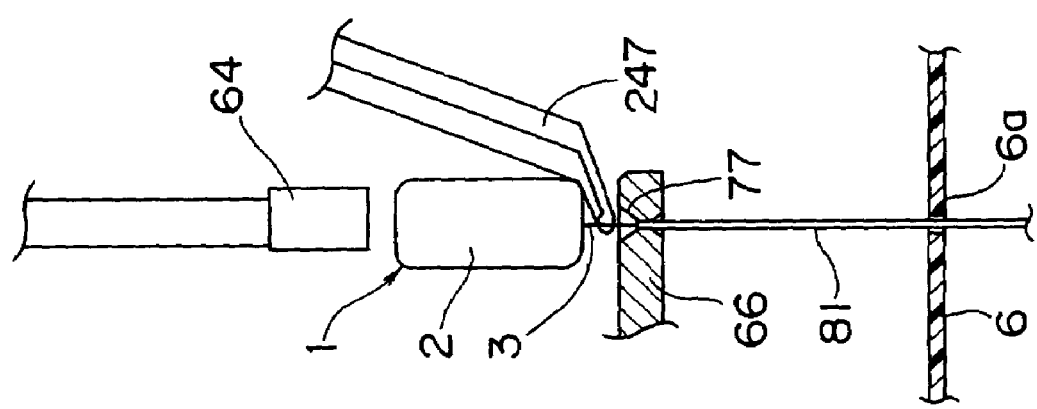
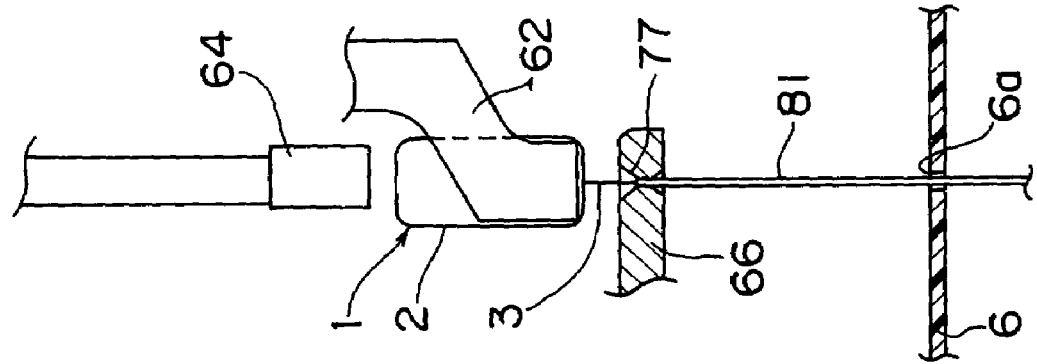

COMPONENTS INSERTION METHOD

TECHNICAL FIELD

The present invention relates to a component insertion head apparatus, a component insertion apparatus and a component insertion method for inserting lead wires of a plurality of components, in which the lead wires are formed at device portions, respectively, into their corresponding insertion holes for each lead wire formed in a circuit board, and thereby inserting each of the components into the circuit board, so as to enable each of these inserted components to be mounted on the circuit board.

BACKGROUND ART

Conventionally, as a general component insertion method for this kind of component insertion head apparatus and component insertion apparatus, it has been practiced to perform a procedure comprising steps of grasping a device portion of a fed component, engaging an end portion of a lead wire of the component with an engagement portion of a guide pin, and guiding and inserting the lead wire by the guide pin into an insertion hole formed at an insertion position of a board while maintaining this engagement by pressing the device portion by a pusher member, and thereafter performing fixation of the component onto the board by cutting-and-clinching (i.e., cutting off and bending) the lead wire inserted into the insertion hole while the device portion is pressed into contact with the board by the pusher member (see, e.g., Japanese unexamined patent publication No. S59-227200).

On the other hand, component-mounting boards that are formed by such respective components being inserted into and mounted onto a board have been strongly demanded from the market along with the days' current desire to multiply functions of electronic circuits formed by the component-mounting board and reduce their production cost.

SUMMARY OF THE INVENTION (Technical Issues to be Solved by the Invention)

However, together with implementation of multiplied functions and production cost reduction, components have been under structural changes and moreover kinds of the components have been under diversification, so that there can arise cases in which reliable component insertion is difficult to achieve by merely using the above-described conventional component insertion method.

An example of structural changes of the components is that a formation thickness of a shell membrane in a device portion of an electrolytic capacitor, which is an example of one of the components, has been being made thinner and thinner in order to reduce a manufacturing cost of the electrolytic capacitor, while rigidity of the device portion has been becoming lower and lower along with that. During insertion of such an electrolytic capacitor into a board, there is an issue that the device portion of the electrolytic capacitor may be plastically deformed and damaged because of lowered rigidity during grasping of the device portion.

Also, as diversification of the kinds of components, it is desired, for example, to mount onto a board those components which are formed large in weight with a large-sized configuration of their device portion or those components which have special configurations. During insertion of such large-sized or specially configured components onto the board, there is an issue that there can arise cases in which the large-sized, heavyweight or specially configured device portions are difficult to securely grasp.

Further, it has become more often a case that a wire diameter of a lead wire of components and their rigidity come in various types and forms. For example, in some of such components as connector components, lead wires of high rigidity are used in terms of their component characteristics. During fixation of such components as connector components to a board by cutting-and-clinching after their insertion into the board, there is an issue that a force involved in bending of the lead wire becomes so large that a force of grasping the component to the board cannot counter the force involved in the bending, thereby causing positional shifts of the component or the like.

In particular, in a component insertion head apparatus in a conventional component insertion apparatus, a mechanical spring member is often used in a mechanism for grasping a device portion of a component or in a mechanism for pressing the same, thereby giving rise to an issue that insertion of such various components as described above cannot flexibly be managed.

Also, as this kind of component insertion apparatus has been targeting radial components particularly among the above-described components, conventionally, there have been known apparatuses in various configurations. In this kind of component insertion apparatus, as component insertion methods, there have been known, for example, a guide pin method in which a guide pin holding a lead wire of a component is moved down through an insertion hole for the component on a circuit board to guide the lead wire to the insertion hole so that the component is inserted into the circuit board, and a lead chuck method in which a component is held by use of a lead chuck that grasps a lead wire of a component, and this grasped component is moved by the lead chuck so that the lead wire of the component is inserted into an insertion hole on a circuit board, by which the component is inserted into the circuit board.

Also, as component feeding methods for feeding components, which are to be inserted into a circuit board by a component insertion apparatus, to a component insertion head that inserts components into the circuit board, there have been known, for example, a random access method in which with use of a combination of parallel displacement of a component feed section and parallel displacement of a component pick-up head, the component feed section and the component pick-up head are aligned so that the component pick-up head picks up and feeds the components to the component insertion head, and a sequence method in which components are delivered from the component feed section to a component conveyance section having a conveyor belt, where the components are fed in sequence to the component insertion head so as to be inserted into a circuit board.

While various methods as described above are available, there have been known, as a conventional component insertion apparatus, a component insertion apparatus combining the guide pin method and the random access method, as well as a component feed apparatus combining the lead chuck method and the sequence method.

In recent years, in the field of component-mounting boards that are manufactured through mounting of components on circuit boards, a need for increase of productivity has been strong. Also, the components that are to be mounted on such component-mounting boards are roughly of two kinds: one is a discreet component having lead wires for connection to a circuit board (e.g., a radial component such as a capacitor or resistor); and the other is a chip component formed to be leadless also such as a resistor or capacitor. Because of a difference in characteristics of each component (i.e., presence of lead wires), these two kinds of components are mounted on circuit boards in two component mounting processes: a discreet component mounting process; and a chip component mounting process, and in the discreet component mounting process, a component insertion apparatus is used to mountably insert the discreet component into a circuit board.

Also, in order to meet a need for an increase of productivity, it is desirable that the discreet component mounting process and the chip component mounting process are in-lined (go online), and that an in-lined component-mounting board manufacturing apparatus is used to manufacture component-mounting boards so as to reduce stocked semimanufactured products (circuit boards on which either one of the discreet component and the chip component is mounted). Further, from a view point of preventing occurrence of board failure caused by missing of mounted components due to a transfer operation of circuit boards between each of the above processes, the above-stated in-lining is desirable.

For conducting in-lining as described above, generally it is effective to perform screen printing as one step in the chip component mounting process, which requires conduction of the chip component mounting process before the discreet component mounting process. Consequently in the discreet component mounting process, circuit boards on which the chip components are already mounted are fed, and therefore the discreet components should be mounted on the circuit boards in such state. Eventually, in the discreet component mounting process, when the discreet components are inserted into the circuit board, the guide pin method which is free from restriction due to their surrounding space is effective compared to the lead chuck method, and therefore it is preferable to use a component insertion apparatus that adopts the guide pin method (see, e.g., Japanese unexamined patent publication No. 2001-102795).

However, in a component insertion apparatus adopting the guide pin method, at a time of inserting a component into a circuit board, a device portion (also called body portion) that is a head part of the component (radial component) is pushed down by an insertion pusher in a head portion or the like and is inserted into the circuit board. However, there is a case, for example, that lead wires of the component are bent and so the device portion of the component is curved against the lead wires. In such a case, the device portion is not positioned below the insertion pusher, which may cause miss pushing by the insertion pusher when the pusher tries to push down the device portion, thereby resulting in occurrence of component insertion error. Also, even if such miss pushing does not occur, a lead wire may not be smoothly inserted into a component insertion hole.

Accordingly, the component insertion apparatus should be equipped with a component-insertion-posture correcting unit for performing bending correction of a lead wire (or inclination correction of a device portion) by a time of component insertion. Consequently, some conventional component insertion apparatuses are provided with a dedicated (special) component-insertion-posture correcting unit aiming at performing bending correction of the lead wire. Provision of such a dedicated component-insertion-posture correcting unit is one of factors that inhibit downsizing of the component insertion apparatuses, which causes a problem of inhibiting productivity of component mounting boards from increasing through downsizing of entire in-lined component mounting board manufacturing apparatuses achieved by downsizing of the component insertion apparatuses. Also, in a case where the component insertion apparatuses are used not in the in-lined component mounting board manufacturing apparatuses but as stand-alone apparatuses, downsizing of the component insertion apparatuses is still demanded for increasing per-unit-area productivity.

Further, it is difficult to achieve remarkable increase of productivity by simply downsizing the apparatuses, and therefore in addition, it is necessary to shorten time taken for component mounting and to more simplify a configuration of each component unit of the component insertion apparatuses for increasing maintainability or the like of the apparatuses.

Accordingly, for solving the above problems, it is an object of the present invention to provide a component insertion head apparatus, a component insertion apparatus and a component insertion method capable of flexibly managing insertion of components to meet respective characteristics of diversified various types of components, thereby making it possible to reliably achieve insertion, and moreover capable of increasing productivity during insertion of components into circuit boards by simplifying an apparatus configuration, downsizing the apparatus, and further by shortening time taken for component insertion.

(Solution Therefor)

In order to accomplish the above object, the present invention has the following constitution.

According to a first aspect of the present invention, there is provided a component insertion head apparatus for inserting a plurality of components which are to be fed and in each of which a lead wire is formed at each device portion, the components including a first component and a second component lower in terms of rigidity of the device portion than the first component, into a lead-wire insertion hole formed at a component insertion position in a board by grasping the components one by one at a component grasping position, the component insertion head apparatus comprising:

a grasping unit for releasably grasping the device portion of each of the components at the component grasping position; and a grasping unit control section for controlling a grasping operation of the device portion of each of the components while controlling a grasping pressure of the grasping unit, and which is operable to control each grasping pressure so that the grasping pressure for the second component becomes lower than the grasping pressure for the first component.

According to a second aspect of the present invention, there is provided a component insertion head apparatus as defined in the first aspect, wherein the grasping unit comprises:

a pair of grasping members which are disposed in opposition to each other and which are operable to perform a grasping operation or grasping-release operation of the device portion of the component placed at the component grasping position by moving so as to approach or separate from each other; and a grasping member driving section for performing each movement operation of approach or separation of the pair of grasping members.

According to a third aspect of the present invention, there is provided a component insertion head apparatus as defined in the second aspect, wherein in the grasping unit, the grasping member driving section comprises:

a cylinder portion for performing each movement operation of the pair of grasping members; and a pressure-variable supply section for supplying a fluid, which is to be supplied to the cylinder portion, while varying a pressure of the fluid, wherein the grasping unit control section is operable to control the pressure-variable supply section so that a pressure of supplied fluid for grasping of the second component by respective grasping members becomes lower than a pressure of supplied fluid in grasping of the first component.

According to a fourth aspect of the present invention, there is provided a component insertion head apparatus as defined in the first aspect, wherein each of the grasping pressures is a pressure which permits grasping and holding of each device portion of the first component or the second component without plastically deforming a configuration of each device portion.

According to a fifth aspect of the present invention, there is provided a component insertion head apparatus as defined in the first aspect, wherein the second component is a component in which rigidity of the device portion in a direction of grasping is lower than rigidity of the device portion of the first component in the same direction.

According to a sixth aspect of the present invention, there is provided a component insertion head apparatus as defined in the first aspect, comprising:

a lead wire guide unit which has a guide pin, equipped with an engagement portion for engaging with an end portion of the lead wire of the component grasped by the grasping unit, for guiding the lead wire to the insertion hole of the board in engagement with the engagement portion to thereby insert the component into the board;

a pusher unit for holding the engagement between the lead wire and the engagement portion by pressing the device portion of the component having its lead wire engaged with the engagement portion of the guide pin toward the insertion position in the board, and for pushing down the component guided by the guide pin so that the component is inserted into the insertion hole while maintaining this engagement state; and a pusher unit control section which is operable to control a push-down operation of each component while controlling a pressure for pressing in the pusher unit, and which performs control of pressure for each pressing so that the pressure for pressing of the first component becomes lower than the pressure for pressing of the second component.

According to a seventh aspect of the present invention, there is provided a component insertion head apparatus as defined in the sixth aspect, wherein the pusher unit comprises:

a pusher member for making contact with the device portion of the component and moving up and down along a direction generally perpendicular to a surface of the board at the insertion position of the component; and a pusher up/down moving unit for performing up/down movement of the pusher member.

According to an eighth aspect of the present invention, there is provided a component insertion head apparatus as defined in the seventh aspect, wherein in the pusher unit, the pusher up/down moving unit comprises:

a cylinder portion for performing the up/down movement of the pusher member; and a pressure-variable supply section for supplying a fluid to be supplied to the cylinder portion while varying a pressure of the fluid, wherein the pusher unit control section is operable to control the pressure-variable supply section so that the pressure of supplied fluid in pressing of the device portion of the second component by the pusher member becomes lower than the pressure of supplied fluid in pressing of the device portion of the first component.

According to a ninth aspect of the present invention, there is provided a component insertion head apparatus as defined in the seventh aspect, wherein the lead wire guide unit comprises a lead wire bending portion for bending the lead wire of the component to fix the component to the board while the component inserted into the insertion hole of the board has its device portion pressed and held at the insertion position of the board by the pusher member, and the pusher unit control section performs control of pressure for each pressing so that a pressure for pressing on the device portion in holding it to the insertion position of the board by the pusher member becomes higher than a pressure for pressing the device portion in holding of engagement between the engagement portion of the guide pin and the lead wire.

According to a tenth aspect of the present invention, there is provided a component insertion head apparatus as defined in the sixth aspect, wherein the pressure for each pressing is such a pressure that a configuration of each device portion of the first component or the second component is not plastically deformed by the pressing.

According to an eleventh aspect of the present invention, there is provided a component insertion head apparatus as defined in the ninth aspect, wherein the pusher unit control section performs control of each of the pressures, for a third component having a lead wire whose rigidity is higher than those of the lead wires of the first component and the second component, so that a pressure for pressing a device portion in pressing and holding to an insertion position of the board by the pusher member becomes higher than the pressures for the pressing on the first component and the second component.

According to a twelfth aspect of the present invention, there is provided a component insertion head apparatus as defined in the sixth aspect, wherein the second component is a component in which a rigidity of its device portion in a direction of pressing is lower than a rigidity of the device portion of the first component in the same direction.

According to a thirteenth aspect of the present invention, there is provided a component insertion apparatus comprising:

the component insertion head apparatus as defined in any one of the first aspect to twelfth aspect;

a component feed section in which the components are stored so as to be feedable;

a component conveyor for grasping a component fed from the component feed section and conveying the component to a component delivery position;

a transfer chuck for grasping the component positioned at the component delivery position of the component conveyor and moving the component to a component grasping position in the component insertion head apparatus; and an alignment section for performing positional alignment in a direction extending along a surface of the board between the component insertion head apparatus and the insertion position on the board.

According to a fourteenth aspect of the present invention, there is provided a component insertion apparatus, comprising:

a component feed section in which a plurality of components, which are radial components, are stored so as to be feedable;

a component conveyor for grasping a component fed from the component feed section and conveying the component to a component delivery position;

a transfer chuck for grasping a lead wire of the component positioned at the delivery position of the component conveyor and moving the component;

a component insertion section equipped with the component insertion head apparatus as defined in the first aspect for inserting the lead wire of the component moved by the transfer chuck into an insertion hole for the lead wire formed in an insertion position for the component in the board; and an alignment section for performing positional alignment in a direction extending along a surface of the board between the component insertion head apparatus and the insertion position in the board, wherein the grasping unit provided in the component insertion head apparatus includes a device chuck for grasping the device portion of the component grasped by the transfer chuck and moved to the insertion position, and, in the component insertion head, by grasping of the device portion of the component by the device chuck, a bend of the lead wire is corrected on a fulcrum given by a grasping position of the lead wire by the transfer chuck so that the device portion comes to be positioned at the component insertion position, whereby correction of an insertion posture of the component is performed, and the lead wire of the component that has been corrected in terms of its insertion posture is inserted into the insertion hole of the board that has been aligned by the alignment section.

According to a fifteenth aspect of the present invention, there is provided a component insertion apparatus as defined in the fourteenth aspect, wherein the component insertion section further comprises a guide pin for holding an end portion of the lead wire of the component and guiding this held component so that the component becomes insertable into the insertion hole of the board, and the component insertion head apparatus further includes a component push-out portion for pushing out the device portion of the component held by the guide pin toward the insertion position in the board, and concurrently inserting the lead wire into the insertion hole under guidance by the guide pin.

According to a sixteenth aspect of the present invention, there is provided a component insertion head apparatus as defined in the fourteenth aspect, wherein movement of the component from the delivery position in the component conveyor to the component insertion section by the transfer chuck is performed by rotation of the transfer chuck along the surface of the board, and the component insertion position aligned in the component insertion section is placed on a locus of the rotation of the transfer chuck with the component held by the transfer chuck at the delivery position.

According to a seventeenth aspect of the present invention, there is provided a component insertion apparatus as defined in the sixteenth aspect, wherein the rotation of the transfer chuck is performed at such a rotation angle that a positional shift amount between the component in the component insertion section and the component insertion position is corrected.

According to an eighteenth aspect of the present invention, there is provided a component insertion apparatus as defined in any one of the fourteenth aspect to seventeenth aspect, wherein each of the components that are the radial components has a plurality of lead wires formed so as to be each arrayed in one line, the device chuck includes a pair of grasping plates which are disposed so as to be opposed to each other along this array direction of the lead wires of the component that has been placed at the component insertion position and for moving so as to approach or separate from each other, for thereby performing a grasping operation or grasping-releasing operation of the device portion, and the device portion of the component that has been placed at the component insertion position is moved in a direction extending along the surface of the board and generally perpendicular to the array direction of the lead wires while the pair of grasping plates that have been away from each other are approaching each other, whereby correction of an insertion posture of the component is performed and concurrently grasping of the device portion by the pair of grasping plates is performed.

According to a nineteenth aspect of the present invention, there is provided a component insertion method for inserting a plurality of components, in each of which a lead wire is formed at each device portion and the components include a first component and a second component lower in terms of rigidity of the device portion than the first component, into a lead-wire insertion hole formed at a component insertion position in a board by grasping the components one by one at a component grasping position and inserting each lead wire into the insertion hole so that the first component and the second component are inserted into the board and compositely mounted thereon, the component insertion method comprising:

grasping the component releasably at the component grasping position so that a grasping pressure for the second component becomes lower than a grasping pressure for the first component;

along with grasping of the component, performing positional alignment in a direction extending along a surface of the board between the lead wire of the component and the insertion hole of the board; and thereafter, inserting the lead wire of this grasped component into the insertion hole of the board.

According to a twentieth aspect of the present invention, there is provided a component insertion method as defined in the nineteenth aspect, further comprising:

after grasping of the component, making an end portion of the lead wire of the component engage with an engagement portion of a guide pin through the insertion hole of the board, and in pressing the device portion of the component toward the insertion position of the board by a pusher to hold this engagement between the guide pin and the lead wire, holding this engagement by pressing in such a manner that a pressure for this pressing of the second component becomes lower than a pressure for pressing of the first component; and releasing grasping of the component and guiding the lead wire into the insertion hole by the guide pin so as to be inserted therein, while holding the engagement.

According to a twenty-first aspect of the present invention, there is provided a component insertion method as defined in the twentieth aspect, wherein in fixing the component, which has been inserted in the insertion hole of the board, to the board by bending the lead wire of the component while the device portion is pressed and held at the insertion position of the board by the pusher member, each pressing is performed so that a pressure for pressing the device portion in holding it to the insertion position of the board by the pusher member becomes higher than a pressure for pressing the device portion in holding of the engagement between the engagement portion of the guide pin and the lead wire.

According to a twenty-second aspect of the present invention, there is provided a component insertion method as defined in the twenty-first aspect, wherein each pressing is performed so that a pressure for pressing the device portion during pressing and holding of a third component to an insertion position of the board by the pusher member, with the third component having a lead wire higher in terms of rigidity than respective lead wires of the first component and the second component, becomes higher than a pressure for pressing the first component and the second component.

According to a twenty-third aspect of the present invention, there is provided a component insertion method as defined in the nineteenth aspect, wherein each of the grasping pressures is such a pressure which permits grasping and holding each device portion of the first component or the second component without plastically deforming a configuration of each device portion.

According to a twenty-fourth aspect of the present invention, there is provided a component insertion method as claimed in any one of the twentieth aspect to twenty-second aspect, wherein a pressure for each pressing is such a pressure that configuration of each device portion of the first component or the second component is not plastically deformed by the pressing.

According to a twenty-fifth aspect of the present invention, there is provided a component insertion method as defined in the nineteenth aspect, wherein the components are radial components, the method further comprising:

grasping a lead wire of a component and performing positional alignment in a direction along a surface of the board between the lead wire of the component and the insertion hole of the board;

along with that, grasping a device portion of the component whose lead wire has been grasped, thereby correcting a bend of the lead wire on a fulcrum given by a grasping position of the lead wire so that the device portion is placed at the component insertion position in a direction along the surface of the board, whereby correction of an insertion posture of the component is performed; and inserting the lead wire of the component, which has been corrected in terms of its insertion posture, into the insertion hole of the board.

According to a twenty-sixth aspect of the present invention, there is provided a component insertion method as defined in the twenty-fifth aspect, further comprising:

after correction of the insertion posture of the component, holding an end portion of the lead wire of the component by a guide pin through the insertion hole of the board, and further releasing grasping of the device portion and grasping of the lead wire; and subsequently, moving the guide pin so that the end portion of the lead wire is guided to the insertion hole of the board, thereby inserting the lead wire of the component into the insertion hole.

According to a twenty-seventh aspect of the present invention, there is provided a component insertion method according to the twenty-fifth aspect or twenty-sixth aspect, wherein each of the components that are radial components has a plurality of lead wires formed so as to be arrayed in one line, and correction of the insertion posture of the component is performed by moving the device portion in a direction extending along a surface of the board and generally perpendicular to this array direction of the lead wires.

(Working Effects Over the Prior Art)

According to the first aspect of the present invention, in the component insertion head apparatus, since the grasping unit for performing the grasping operation for each component to be fed is so constructed as to be able to control the grasping pressure on each of the components by the grasping unit control section, it becomes implementable to control the grasping pressure to an optimum pressure according to characteristics (or type or properties) of fed and grasped individual components. Thus, a reliable grasping can be achieved for the individual components, and a component insertion operation for various types of components can be managed flexibly.

More specifically, for individually grasping a first component and a second component as a plurality of types of components, with the second component being lower in terms of rigidity of the device portion than the first component, the grasping pressure by the grasping unit is controlled by the grasping unit control section so that the grasping pressure for the second component becomes lower than the grasping pressure for the first component. As a result, the first component can securely be grasped with a relatively strong grasping pressure, and moreover the second component is grasped with a relatively weak grasping pressure so that its device portion can be prevented from damage or the like due to the grasping.

In particular, with regard to the second component exemplified by those which have been increasing in recent years and which are thin in terms of formation thickness of a shell membrane of a device portion with a view to reducing a manufacturing cost of the component, since such a component is lower in terms of rigidity of its device portion, grasping by the grasping unit can be controlled by the grasping unit control section so that the grasping pressure becomes relatively low. Controlling the grasping pressure to be lower like this makes it possible to prevent damage or the like of the component due to occurrence of plastic deformation or the like of the device portion of the second component during the grasping, so that the grasping can be managed flexibly for various types of components.

According to the second aspect of the invention, working effects of the first aspect can be obtained by a construction in which the grasping unit includes a pair of grasping members which are moved so as to approach or separate from each other, by which a grasping operation or grasping-release operation of the device portion of the component placed at the component grasping position can be achieved, and a grasping member driving section for performing each movement operation of approach or separation of the pair of grasping members.

According to the third aspect of the invention, the grasping member driving section comprises a cylinder portion for performing the movement operation of the grasping members, and a pressure-variable supply section capable of supplying a fluid, which is to be supplied to the cylinder portion, with pressure of the fluid varied, wherein the grasping unit control section can control the pressure-variable supply section so that a pressure of the supplied fluid for grasping of the second component by the grasping members becomes lower than a pressure of the supplied fluid in grasping of the first component. As a result of this, the above-described individual working effects can be made obtainable. That is, for the grasping of the first component, a fluid of relatively high pressure is supplied to the cylinder portion to obtain a relatively high grasping pressure, while for the grasping of the second component, a fluid of relatively low pressure is supplied to the cylinder portion to obtain a relatively low grasping pressure. Thus, the above working effects can be achieved by controlling the pressure-variable supply section as shown above.

According to the fourth aspect or the twenty-third aspect of the invention, each of the grasping pressures is such a pressure that each device portion of the first component or the second component can be grasped and held by this grasping, and moreover a configuration of each device portion is not plastically deformed. Thus, a grasping operation according to individual characteristics of the first component and the second component can be performed, so that an insertion operation of diversified components can be managed flexibly.

According to the fifth aspect of the invention, the rigidity of the device portion of the second component in a direction of the grasping is lower than the rigidity of the device portion of the first component in the same direction. Thus, working effects by individual aspects can be made effective.

According to the sixth aspect of the invention, in the component insertion head apparatus, the pusher unit that presses the device portion of the component fed and grasped (or grasping-released) by the grasping unit is so constructed that pressure for this pressing can be controlled by the pusher unit control section. Thus, the pressure for the pressing can be controlled to an optimum pressure according to characteristics (or type or properties) of pressed individual components, so that a reliable pressing can be achieved for individual components and that a component insertion operation for various types of components can be managed flexibly.

More specifically, in pressing the first component and the second component separately, with the second component being lower in terms of rigidity of the device portion than the first component, the pressure for the pressing in the pusher unit is controlled by the pusher unit control section so that the pressure for pressing of the second component becomes lower than the pressure for the pressing of the first component, by which the first component can be pressed reliably with a relatively strong pressure for the pressing, and moreover, the second component can be pressed with a relatively weak pressure for pressing so that its device portion can be prevented from damage or the like due to this pressing.

In particular, in a case where, for example, a component in which a shell membrane of a device portion is formed thin is used as the second component, pressing is performed with pressure for this pressing controlled to be relatively low, by which the component can be prevented from damage or the like due to occurrence of plastic deformation of the device portion of the second component caused by the pressing, so that pressing for various types of components can be managed flexibly.

According to the seventh aspect of the invention, the pusher unit comprises a pusher member which is capable of making contact with the device portion of the component and which can be moved up and down along a direction generally perpendicular to a surface of the board at the insertion position of the component, and a pusher up/down moving unit for performing up/down movement of the pusher member. By virtue of this, the working effects by the fifth aspect can be obtained.

According to the eighth aspect of the invention, the pusher up/down moving unit comprises a cylinder portion which performs the up/down movement of the pusher member, and a pressure-variable supply section capable of supplying a fluid, which is to be supplied to the cylinder portion, with pressure of the fluid varied, wherein the pusher unit control section can control the pressure-variable supply section so that the pressure of the supplied fluid in pressing of the device portion of the second component by the pusher member becomes lower than the pressure of the supplied fluid in pressing of the device portion of the first component. By virtue of this, the above-described individual working effects can be made obtainable. That is, for the pressing of the first component, a fluid of relatively high pressure is supplied to the cylinder portion to obtain a relatively high pressing pressure, while for the pressing of the second component, a fluid of relatively low pressure is supplied to the cylinder portion to obtain a relatively low pressing pressure. Thus, the above working effects can be achieved by controlling the pressure-variable supply section as shown above.

According to the ninth aspect of the invention, further, the pusher unit control section performs control of pressure for each pressing so that a pressure for the pressing the device portion in holding of the component to the insertion position of the board by the pusher member becomes higher than a pressure for the pressing the device portion in holding of the engagement between the engagement portion of the guide pin and the lead wire. Thus, holding of the component can reliably be performed against an external force applied to the component during a so-called cut-and-clinch performed for holding of the component to the insertion position of the board. Therefore, this cut-and-clinch operation can reliably be performed for the component, and fixation of the component to the board can reliably be performed, thereby allowing a component insertion quality to be enhanced.

According to the tenth aspect or the twenty-fourth aspect of the invention, the pressure for each pressing is such a pressure that configuration of each device portion of the first component or the second component is not plastically deformed by the pressing. By virtue of this, a pressing operation can be performed according to respective characteristics of the first component and the second component, so that an insertion operation of diversified components can be managed flexibly.

According to the eleventh aspect of the invention, further, the pusher unit control section performs control on each of pressures, for a third component having a lead wire whose rigidity is higher than those of the lead wires of the first component and the second component, so that a pressure for the pressing the device portion in pressing and holding it to the insertion position of the board by the pusher member becomes higher than pressures for the pressing of the first component and the second component. Thus, an insertion operation of diversified various components can be managed flexibly. The third component is given by, for example, a connector type component and the like that has been increasing in recent years, and such a component has a feature that rigidity of lead wires is relatively enhanced in terms of characteristics. Also, in performing a cut-and-clinch operation for such a third component, in which case a relatively larger external force as compared with the first component and the second component is applied for bending of the lead wire having enhanced rigidity, this enhanced pressure for the pressing makes it possible to counter the external force sufficiently so that the cut-and-clinch operation for the third component can reliably be performed and fixation to the board can be achieved.

According to the twelfth aspect of the invention, since the rigidity of the device portion of the second component in the direction of the pressing is lower than the rigidity of the device portion of the first component in the same direction, the above-described individual working effects can be made more effective.

According to the thirteenth aspect of the invention, in a component insertion apparatus equipped with the above-described component insertion head apparatus, the working effects by the above individual aspects can be obtained.

According to the fourteenth aspect of the invention, whereas there are some cases where the component is a radial component and this component, which is the radial component and whose lead wire is grasped by the transfer chuck, has its lead wire bent and its device portion inclined, for example, due to some external force applied to the component during its conveyance process, correction of an insertion posture of the component can, even in such a case, be performed along with grasping when the component is moved to the component insertion position by movement of the transfer chuck and then, in the component insertion head apparatus, grasping for an insertion operation of the component is performed by the transfer chuck.

That is, when the component whose lead wire has been grasped by the transfer chuck is grasped by the device chuck, a component insertion posture can be corrected while an inclined device portion is being pressed by the device chuck on a fulcrum given by a grasping position of the lead wire by the transfer chuck in such a way that bend of the lead wire is corrected. Along with this, grasping of the device portion of the component whose insertion posture has been corrected can be achieved.

As a result of correcting the insertion posture of the component before its insertion operation into the board as shown above, it becomes implementable to perform the component insertion operation while interference between the component to be inserted and its neighboring other components is prevented on the board. Thus, reliable, accurate component insertion can be achieved.

In particular, in some conventional component insertion apparatuses, measures for such correction of the insertion posture of the component are taken by installing an exclusive device for performing the correction in the is component conveyance section or by other like means. However, according to this first aspect, there is no need for providing such exclusive device, and correction of the insertion posture can be achieved by using the device chuck provided in the component insertion head apparatus to perform the insertion operation of the component. Thus, a construction of the component insertion apparatus can be simplified. Moreover, since a space in the component insertion apparatus can be utilized effectively, a downsizing of the component insertion apparatus can be implemented, and area productivity in the component insertion apparatus can be improved.

Further, since correction of the insertion posture can be performed along with grasping of the component by the device chuck for the insertion operation of the component, no special working time is required for performing the correction alone, so that time required for the insertion operation of the component can be reduced, and productivity of the component insertion apparatus can be improved.

According to the fifteenth aspect of the invention, even in a case where component insertion structure of a so-called guide pin method is adopted, i.e., in a case where the component insertion section is equipped with a guide pin for holding an end portion of the lead wire, and where the component is inserted into the board by pushing out the device portion of the component held by the guide pin toward the insertion position of the board by the component push-out portion included in the component insertion head apparatus and, meanwhile, inserting the lead wire into the insertion hole under guidance by the guide pin, it is implementable to securely push out the device portion by the component push-out portion without miss-pushing by virtue of an arrangement that the correction of the component insertion posture by the grasping of the device chuck has been done before the component insertion operation by the component push-out portion and the guide pin. Thus, there can be provided a component insertion apparatus capable of performing a more accurate, reliable component insertion operation and improving productivity.

According to the sixteenth aspect of the invention, the component conveyor and the component insertion section are disposed so that the component delivery position of the component conveyor and the component insertion position in the component insertion section are each placed on a rotational arc that is the locus of the rotation of the transfer chuck. In conventional component insertion apparatuses, a combination of rotation and forward or backward motion of the transfer chuck would be involved in movement operations of similar components. However, according to this third aspect, by virtue of the above arrangement, transfer movement operations of the component can be performed only by a rotational operation of the transfer chuck. Accordingly, time required for a transfer operation of the component can be reduced, and a component insertion apparatus capable of performing a more efficient, higher-productivity component insertion operation can be provided.

According to the seventeenth aspect of the invention, whereas there are some cases where, for example, an inversion operation of a component itself may be performed for polarity adjustment of the component in the component insertion section so that a positional shift of the lead wire may occur due to such inversion operation, it is implementable, particularly in such cases, to rotate the transfer chuck with such a rotation angle that a positional shift amount between the component in the component insertion section and the insertion position of the component is correctable, so that the positional shift can be corrected and solved by the rotation angle. As a result, an accurate, reliable component insertion operation can be performed, and productivity of the component insertion apparatus can be enhanced. Further, since a positional shift correction can be performed in a movement operation of the component to the component insertion section without requiring provision of any exclusive device for such correction of positional shifts, time required for component insertion can be reduced, and productivity can be enhanced.

According to the eighteenth aspect of the invention, generally, the component has a characteristic that the lead wires are easier to bend in a direction perpendicular to the array direction of the lead wires, depending on an array of each lead wire. Since a pair of grasping plates for grasping the component are disposed and provided in the device chuck so that the component to be grasped by the device chuck is grasped in a direction perpendicular to the array direction of the lead wires and extending along the surface of the board, correction of the insertion posture of the component can be performed in the perpendicular direction. Therefore, more effective correction of the insertion posture can be achieved, and productivity of the component insertion apparatus can be improved.

According to the nineteenth aspect of the invention, in the component insertion method, since the grasping pressure for each component can be controlled in the grasping operation for each fed component, the grasping pressure can be controlled to an optimum pressure according to characteristics (or type or properties) of fed and grasped individual components, so that a reliable grasping can be achieved for individual components and that an insertion operation for various types of components can be managed flexibly.

More specifically, for individually grasping a first component and a second component as a plurality of types of components, with the second component being lower in terms of rigidity of the device portion than the first component, the grasping pressure is controlled so that the grasping pressure for the second component becomes lower than the grasping pressure for the first component. As a result, the first component can securely be grasped with a relatively strong grasping pressure, and moreover, the second component is grasped with a relatively weak grasping pressure so that the device portion can be prevented from damage or the like due to this grasping.

According to the twentieth aspect of the invention, in the component insertion method, since the pressure for pressing is made controllable for holding the engagement between the guide pins and the lead wires by pressing the device portion of the component by the pusher member, the pressure for the pressing can be controlled to an optimum pressure according to characteristics (or type or properties) of pressed individual components, so that a reliable pressing can be achieved for the individual components and that a component insertion operation for various types of components can be managed flexibly.

More specifically, for individually pressing the first component and the second component that is lower in terms of rigidity of the device portion than the first component, the pressure for the pressing is controlled so that the pressure for the pressing of the second component becomes lower than the pressure for the pressing of the first component. As a result, the first component can securely be pressed with a relatively strong pressure for pressing, and moreover, the second component is pressed with a relatively weak pressure for pressing so that the device portion can be prevented from damage or the like due to this pressing.

According to the twenty-first aspect of the invention, further, the pressure for each pressing is controlled so that a pressure for the pressing the device portion in holding of the component to the insertion position of the board by the pusher member becomes higher than a pressure for the pressing the device portion in holding of the engagement between the engagement portions of the guide pins and the lead wires. Thus, holding of the component can reliably be performed against an external force applied to the component during a so-called cut-and-clinch performed for holding of the component to the insertion position of the board. Therefore, this cut-and-clinch operation can reliably be performed for the component, and fixation of the component to the board can reliably be performed, thereby allowing component insertion quality to be enhanced.

According to the twenty-second aspect of the invention, further, each pressure is controlled so that a pressure for the pressing on the device portion in the pressing and holding of a third component to the insertion position of the board by the pusher member, with the third component having lead wires higher in terms of rigidity than respective lead wires of the first component and the second component, becomes higher than a pressure for the pressing of the first component and the second component. As a result of this, an insertion operation of diversified various components can be managed flexibly. In performing the cut-and-clinch operation for such a third component, in which case a relatively larger external force as compared with the first component and the second component is applied for bending of the lead wires having enhanced rigidity, an enhanced pressure for the pressing makes it possible to counter the external force sufficiently so that the cut-and-clinch operation for the third component can reliably be performed and fixation to the board can be achieved.

According to the twenty-fifth aspect of the invention, whereas there are some cases where the component is a radial component, and this radial component with its lead wires grasped has the lead wires bent and its device portion inclined, for example, due to some external force applied to the component during its conveyance process, correction of an insertion posture of the component can, even in such a case, be performed along with the grasping when the grasping of the device portion for the insertion operation of the component is performed at the component insertion position.

That is, in holding of the device portion of the component, which has its lead wires grasped, the insertion posture of the component can be corrected while this inclined device portion is being pressed on a fulcrum given by a grasping position of the lead wires of the component in such a way that a bend of the lead wires is corrected. Along with this, the grasping of the device portion of the component whose insertion posture has been corrected can be achieved.

As a result of correcting the insertion posture of the component before its insertion operation into the board as shown above, it becomes implementable to perform the insertion operation while interference between the component to be inserted and its neighboring other components is prevented on the board. Thus, reliable, accurate component insertion can be achieved.

In particular, in some conventional component insertion apparatuses, measures for such correction of the insertion posture of the component are taken by installing an exclusive device for performing correction in the component conveyance section or by other like means. However, according to the sixth aspect, there is no need for providing such exclusive device, and correction of the insertion posture can be achieved simultaneously when holding of the device portion for the component insertion operation is performed. Thus, there can be provided a component insertion method by which construction of the component insertion apparatus for performing such a component insertion method can be simplified, a space in the component insertion apparatus can be utilized effectively so that a downsizing of the component insertion apparatus can be implemented, and further area productivity in the component insertion apparatus can be improved.

Further, since correction of the insertion posture can be performed along with grasping of the device portion of the component for the insertion operation of the component, there can be provided a component insertion method by which no special working time is required for performing the correction alone so that time required for the insertion operation of the component can be reduced, and by which productivity of the component insertion apparatus can be improved.

According to the twenty-sixth aspect of the invention, even in a case where the component insertion method of the so-called guide pin method is adopted, i.e., in a case where the component is inserted into the board by guiding lead wires to the insertion holes in the board while an end portion of a lead wire of the component whose insertion posture has been corrected is grasped, it is implementable to accurately and securely perform the component insertion operation by virtue of an arrangement that correction of a component insertion posture has been performed. Thus, there can be provided a component insertion method capable of performing a more accurate, reliable component insertion operation and improving productivity.

According to the twenty-seventh aspect of the invention, generally, the component has a characteristic that the lead wires are easier to bend in a direction perpendicular to the array direction of the lead wires, depending on the array of each lead wire. Since correction of the insertion posture of the component can be performed by performing correction of bends of the lead wires in such a direction, there can be provided a component insertion method by which a more effective correction of the insertion posture can be achieved, and by which productivity of the component insertion apparatus can be improved.

BRIEF DESCRIPTION OF DRAWINGS

These and other aspects and features of the present invention will become clear from the following description taken in conjunction with preferred embodiments thereof with reference to the accompanying drawings, in which:

FIGS. 6A and 6B are timing charts of a component insertion operation performed relative to a circuit board in the component insertion apparatus, wherein FIG. 6A is a schematic explanatory view showing respective insertion operational states and FIG. 6B is a timing chart showing presence or absence of grasping pressure and a time of switching between a strong and weak pressing force;

FIG. 30 is a schematic explanatory view in the form of a table showing a relationship between components belonging to respective component categories treated in the component insertion apparatus and a grasping pressure in the insertion chuck mechanism;

FIG. 31 is a schematic explanatory view in the form of a table showing a relationship between components belonging to respective component categories and a pressing force during press-down in the pusher mechanism;

FIG. 32 is a schematic explanatory view in the form of a table showing a relationship between components belonging to respective component categories and a pressing force during cut-and-clinch in the pusher mechanism;

FIG. 33 is a schematic explanatory view in the form of a table showing relative values of a grasping pressure and respective pressing forces against standard components, with the view relating to the standard components;

FIG. 34 is a schematic explanatory view in the form of a table showing relative values of a grasping pressure and respective pressing forces against standard components, with the view relating to component categories A and B;

FIG. 35 is a schematic explanatory view in the form of a table showing relative values of a grasping pressure and respective pressing forces against standard components, with the view relating to component categories C and D;

FIG. 38 is an explanatory view of a component transfer operation performed by the transfer chuck in a conventional component insertion apparatus;

FIG. 39 is an explanatory view of a component transfer operation performed by the transfer chuck in the component insertion apparatus in the one embodiment;

FIGS. 40A and 40B are timing charts of a component transfer operation, wherein FIG. 40A shows a conventional transfer operation of FIG. 38 while FIG. 40B shows the transfer operation in the embodiment of FIG. 39;

FIG. 43 is an explanatory view of a polarity inverting operation with an inverting operation of a component in a conventional component insertion apparatus;

FIG. 44 is an explanatory view of a polarity inverting operation with an inverting operation of a component in the component insertion apparatus of the one embodiment;

FIGS. 47A, 47B, 47C, and 47D are schematic explanatory views showing applied examples in a component insertion method of the one embodiment, wherein FIG. 47A shows the component insertion method in the one embodiment, FIG. 47B shows a component insertion method with use of a lead chuck instead of a component transferer, FIG. 47C is a component insertion method in a case where an operation of correcting bending of lead wires is performed by a body chuck in the component insertion method of FIG. 47B, and FIG. 47D is a component insertion method in a case where a lead chuck also functions as a guide chuck.

DETAILED DESCRIPTION OF THE PREFERRED EMBODIMENTS

Figure 1:
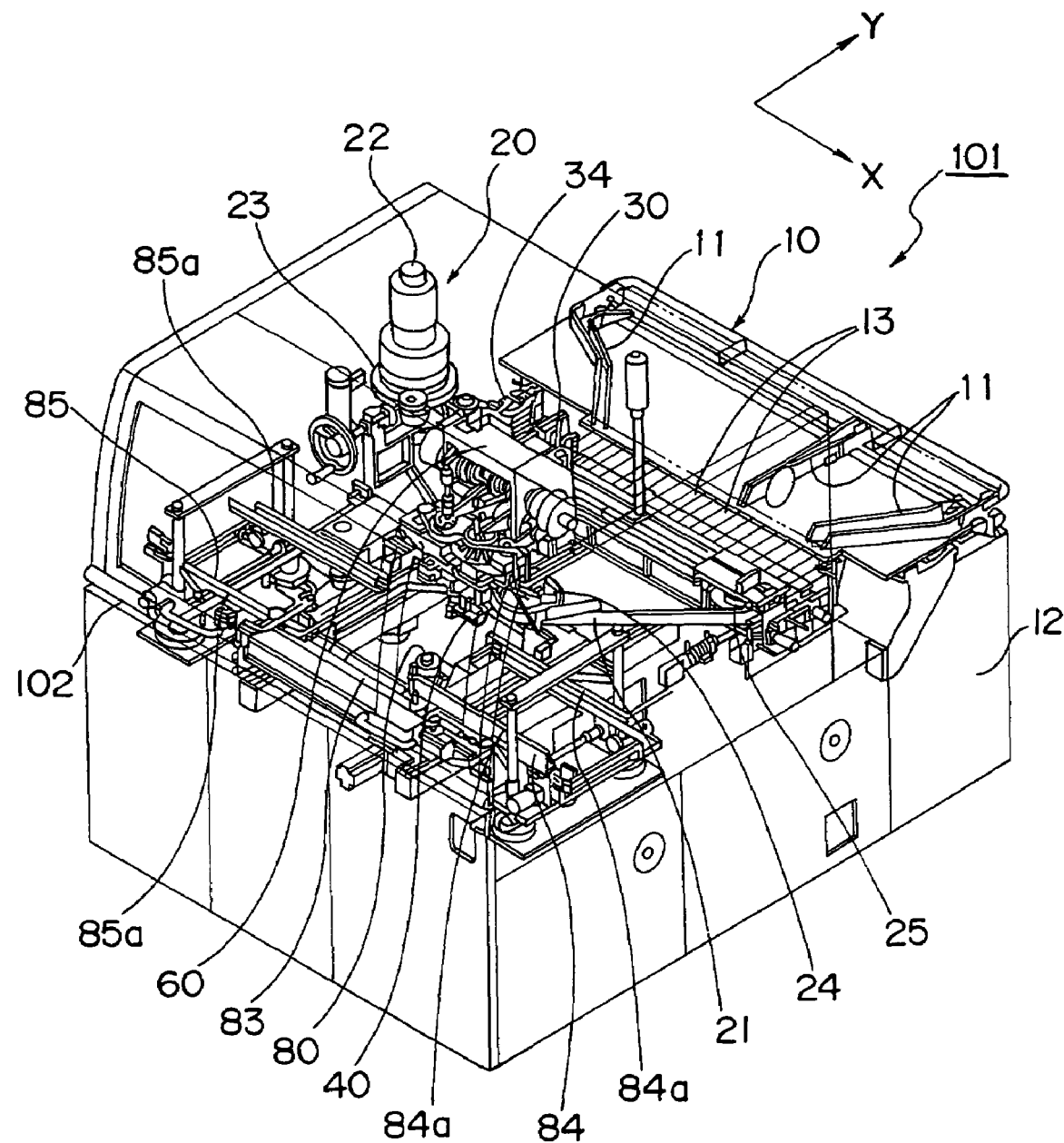
FIG. 1 is a perspective view of a component insertion apparatus according to one embodiment of the present invention.

Before description of the present invention proceeds, it is to be noted that like parts are designated by like reference numerals throughout the accompanying drawings.

Hereinbelow, embodiments of the present invention will be described in detail with reference to the drawings.

(Outlined Configuration of Component Insertion Apparatus)

FIG. 1 shows a semi-transparent perspective view of a component insertion apparatus 101 exemplifying a component insertion apparatus in one embodiment of the present invention.

As shown in FIG. 1, the component insertion apparatus 101 is an apparatus for inserting a discreet component 1, as one example of a component (such as a resistor, capacitor, tantalum capacitor, light emitting diode, and diode, each having lead wires, which are hereinbelow simply called components except for a case where comparison with components of other kinds is conducted), which has a plurality of lead wires 3 formed on a device portion 2 (or a body portion) for connection to a circuit board, into a circuit board 6, and for bringing the component 1 into a mountable state through a soldering process or the like that is later conducted by other apparatuses, in which the lead wires 3 of this inserted component 1 are soldered to a lower portion of the circuit board 6. It is noted that examples of the board include circuit boards such as resin boards, paper-phenol boards, ceramic boards, glass epoxy boards, and film boards.

Also, the component insertion apparatus 101 includes a taped component train 5 made up of a plurality of such components 1 housed in a taping member 4, and a component feed section 10 for housing a plurality of taped component trains 5 in a manner enabling feeding of the components 1 from each of the taped component trains 5. Further, the component insertion apparatus 101 includes a component insertion head 61, which is an example of a component insertion head apparatus that performs insertion of the component 1 into the circuit board 6, a component insertion section 60 in which insertion of the component 1 fed from the component feed section 10 into the circuit board 6 is performed by use of the component insertion head 61 (this means that the component insertion section 60 includes the component insertion head 61), a component conveyance section 20 for conveying the component 1 fed from the component feed section 10 with use of a conveyor belt 21, exemplifying a component conveyor, to the component insertion section 60 in a feedable manner, and a component transferer 40 for displacing, like transferring, the component 1 conveyed by the conveyor belt 21 to the component insertion section 60. It is noted that in the component insertion apparatus 101, a so-called sequence method is adopted as a component feed method and a so-called guide pin method is adopted as a component insertion method.

The guide pin method refers to a component insertion method in which a guide pin holding a lead wire of a component is moved down through an insertion hole, for the component on a circuit board, to guide the lead wire to the insertion hole so that the component is inserted into the circuit board.

Also, the sequence method refers to a component feed method in which components are delivered from a component feed section to a component conveyance section having a conveyor belt, where the components are fed in sequence to a component insertion head so as to be insertable into a circuit board. Although this embodiment will be described for a case where the sequence method as an example is adopted as the component feed method, the invention is not limited only to such cases, and a case may be one, for example, in which the component feed method is given by adopting a random access method in which with use of a combination of parallel displacement of a component feed section and parallel displacement of a component pick-up head, the component feed section and the component pick-up head are aligned so that the component pick-up head picks up and feeds the components to the component insertion head.

(Configuration of Each Component Unit)

Next, description will be given in sequence to each of the above-described component units of the component insertion apparatus 101.

(Component Feed Section)

First, in the component feed section 10 shown in FIG. 1, each of the taped component trains 5 is housed in a component housing section 12 disposed on a lower side in a state of being separately wound up onto a reel (not shown) or the like. Also, on an upper side of the component housing section 12, there are provided a plurality of component feed guides 11 for pulling out each taped component train 5 that is housed in the component housing section 12 and guiding this pulled-out taped component train 5. Also, on an end portion of each component feed guide 11, there is provided a component feeder 13. It is noted that the component 1 is fed from the component feed section 10 to the component conveyance section 20 by each component feeder 13. It is noted that each component feeder 13 is arrayed in an X-axis direction as viewed in this figure at constant intervals.

Figure 2:
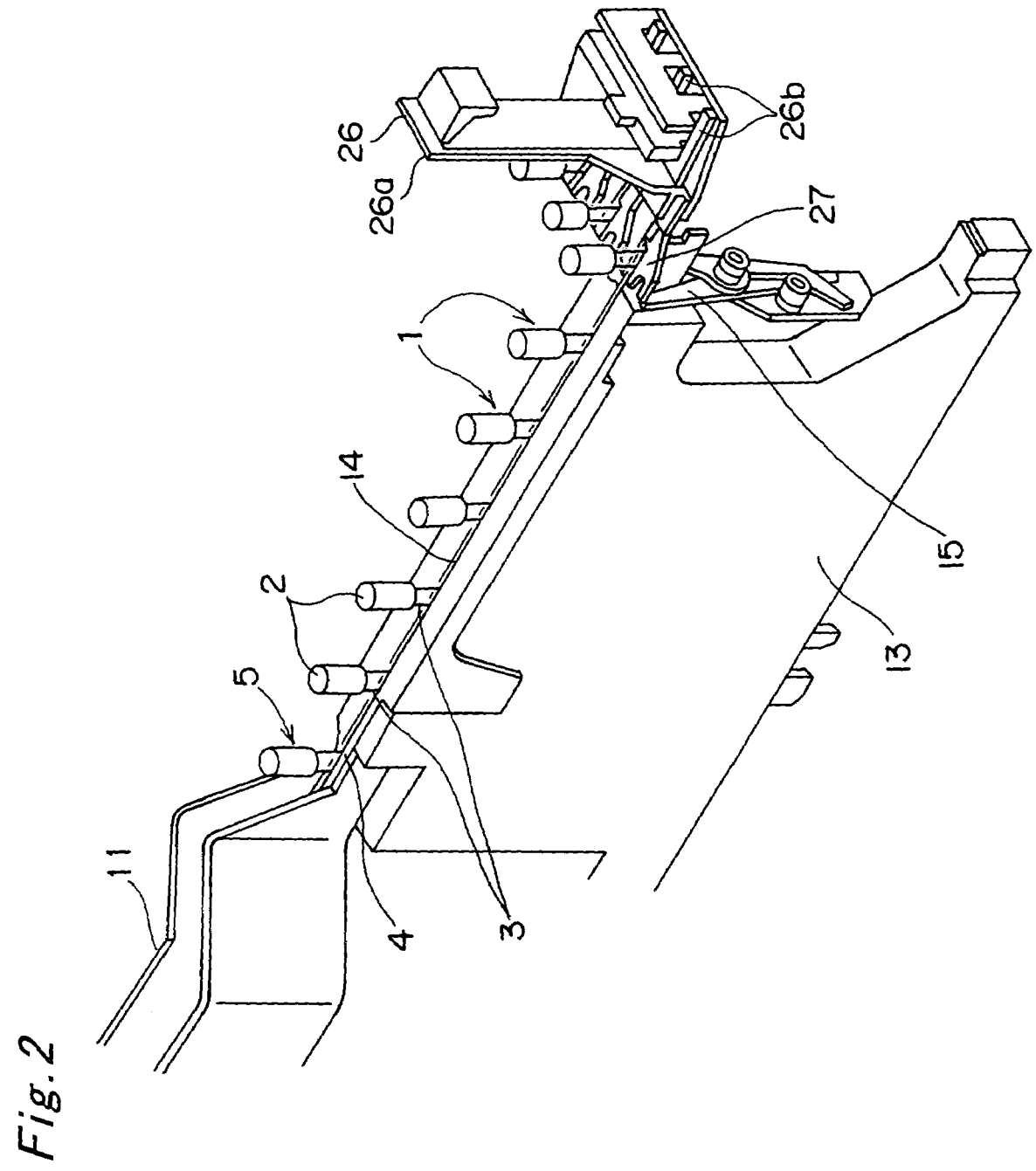
FIG. 2 is a perspective view of a component feeder in the component insertion apparatus.

Herein, a relationship between the component feed guide 11 and the component feeder 13 is shown in FIG. 2. As shown in FIG. 2, the taped component train 5 is structured such that the component 1, having a device portion 2 and two lead wires 3 formed so as to extend in generally the same direction as the device portion 2, is taped on the taping member 4 at specified intervals. Also, on an upper side of the component feeder 13, there is formed a guide groove 14 for guiding the taping member 4. In a state that the device portion 2 of each component 1 is positioned on an upper side and the lead wire 3 is positioned on a lower side, the taping member 4 is guided by the guide groove 14 along an array direction of two lead wires 3 of the component 1 (that is a direction along a virtual line connecting each of the lead wires 3 as well as a direction along a surface of the circuit board 6 fixed on the component insertion apparatus 101), by which the taped component train 5 may be fed to the component conveyance section 20. It is noted that hereinbelow, the array direction of the above two lead wires 3 is simply referred to as an array direction of the lead wires.

Also, as shown in FIG. 2, on an end portion of the component feeder 13 on a side of the component conveyance section 20, there is provided a first cutting blade unit 15 for cutting the taping member 4 and segmenting the taping member 4 into each component 1. The taped component train 5 guided by the guide groove 14 is cut by the first cutting blade unit 15 into segments so that each segment may be fed to the component conveyance section 20.

(Component Conveyance Section)

Next, description will be given of the component conveyance section 20. As shown in FIG. 1, the conveyor belt 21 of the component conveyance section 20, which is, for example, an annular conveyor belt made of rubber or synthetic resin, is hung in an approximate triangular shape by three pulleys 23, 24, 25 provided on an upper surface of an apparatus base 102 of the component insertion apparatus 101. Inside the conveyor belt 21, there are provided dozens of annular metal lines, which serve for decreasing extension of the conveyor belt 21 if tension is applied to the conveyor belt 21.

Also, projections and depressions are provided on front and back surfaces of the conveyor belt 21, and the projections and depressions on the back surface are to be engaged with a patterned indented portion formed on an outer periphery of the pulleys 23, 24, 25.

Also, the pulley 23 is rotationally drivable by an intermittently-driving motor 22, so that the pulley 23 is driven into intermittent rotation by intermittent driving of the motor 22, which enables intermittent rotation of the conveyor belt 21 engaged with the pulley 23. It is noted that the conveyor belt 21 is rotated in a rotational direction in the order of the pulleys 23, 24, 25; that is a counterclockwise direction in FIG. 1.

Figure 3:
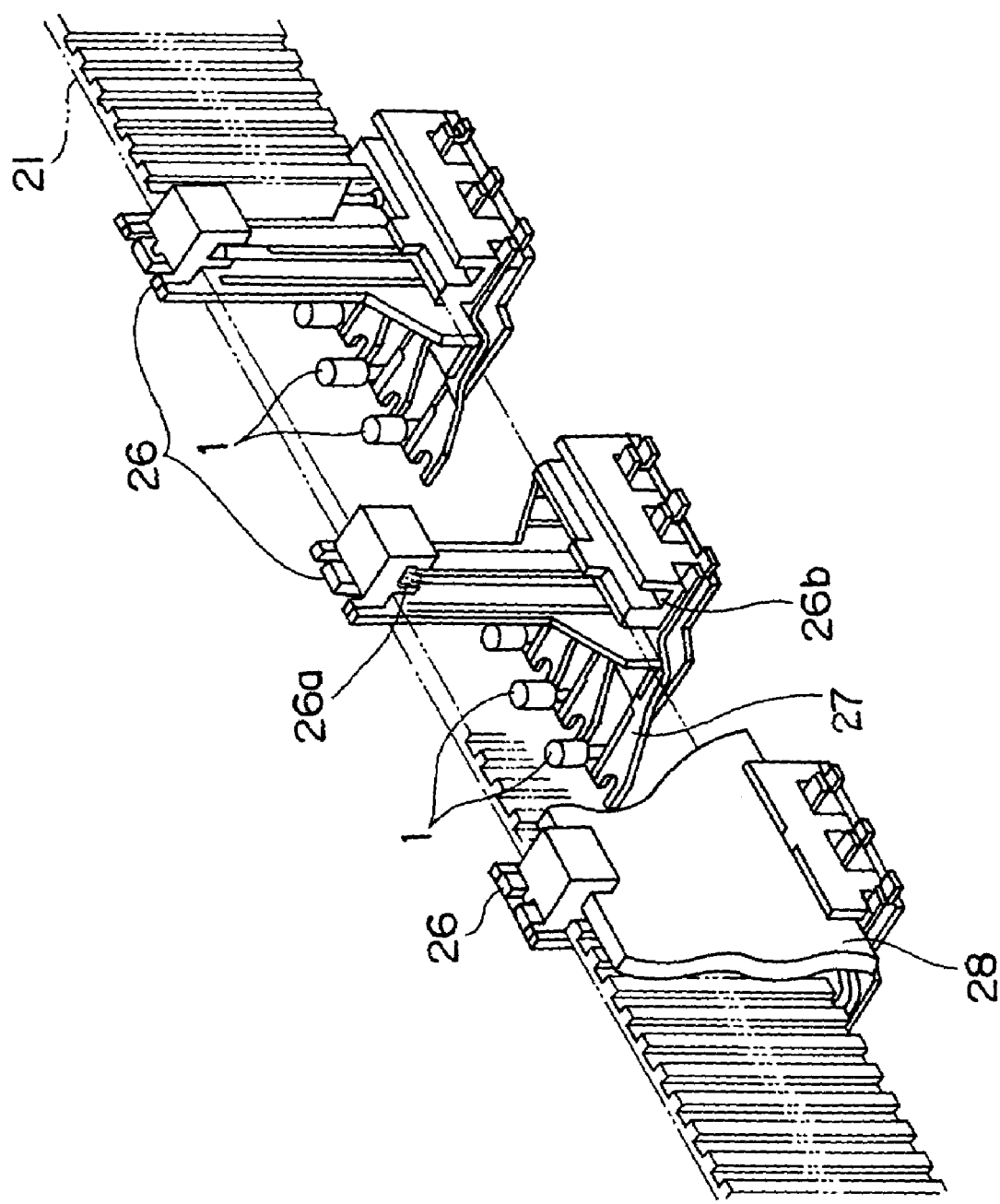
FIG. 3 is an enlarged fragmentary perspective view of a component conveyance section in the component insertion apparatus.

Herein, FIG. 3 shows an enlarged fragmentary perspective view of conveyor belt 21. As shown in FIG. 3, the conveyor belt 21 is equipped with chuck holders 26 at specified intervals. Also, a surface of each chuck holder 26 facing a front surface side of the conveyor belt 21 is a patterned indented face engagable with a patterned indented portion on the front surface side. Further, an upper end and a lower end of each chuck holder 26 are extended to a back surface side of the conveyor belt 21, and a part thereof is engaged with projected and depressed portions on the back surface side of the conveyor belt 21 so as to ensure mounting of each chuck holder 26 on the conveyor belt 21.

Further as shown in FIG. 3, with presence of an extended portion of an upper end and lower end of each chuck holder 26, guide portions 26a, 26b are formed integrally with the chuck holder 26, and the guide portions 26a, 26b are each slidably engaged with upper and lower ends of a plate-shaped guide rail 28 disposed on the back surface side portion of the conveyor belt 21 between each of the pulleys 23, 24, 25 along the guide rail 28. Consequently, when the conveyor belt 21 rotates, the guide portions 26a, 26b of each chuck holder 26 mounted on the conveyor belt 21 are slid along the guide rail 28 and thereby prevent vibration of the conveyor belt 21.

Also as shown in FIG. 2 and FIG. 3, on a lower end portion of each chuck holder 26, three chucks 27 are provided. Each of these chucks 27 is capable of holding (or grasping) a segmented taped component train 5 fed from the component feeder 13. Rotation of the conveyor belt 21 enables conveyance of the segmented taped component train 5 held by each chuck 27. Also, each chuck 27 is capable of holding the segmented taped component train 5 in a direction where the array direction of the lead wires of the component 1 is approximately orthogonal to a longitudinal direction of the conveyor belt 21. It is noted that an array pitch of the chucks 27 in the conveyor belt 21 is the same as an array pitch of the component feeders 13.

It is noted that as shown in FIG. 1, each of the component feeders 13 in the component feed section 10 are placed on the apparatus base 102 of the component insertion apparatus 101 in a state capable of sending out the taped component train 5 along a Y-axis direction as viewed in this figure, and feeding the same to the component conveyance section 20 and in a state adjacent to each other along the X-axis direction as viewed in the figure. Also, the pulleys 23 and 25 are disposed such that the conveyor belt 21 in the component conveyance section 20 runs along the X-axis direction as viewed in the figure in a section between the pulley 23 and the pulley 25 that is in the vicinity of the component feed section 10. Also, in the above-stated section, specified space sufficient for avoiding interference of each other is secured between a top end of each chuck 27 mounted on the conveyor belt 21 and an end portion of each component feeder 13. It is noted that the X-axis direction and Y-axis direction in FIG. 1 are orthogonal to each other.

Also, as shown in FIG. 1, on a lower side of the chuck 27 attached to the conveyor belt 21 on a left side of each component feeder 13 in the X-axis direction as viewed in this figure, a holding position corrector 30 for correcting a position of the lead wires 3 of the component 1 held by the chuck 27 is placed on the apparatus base 102 of the component insertion apparatus 101.

Figure 4:
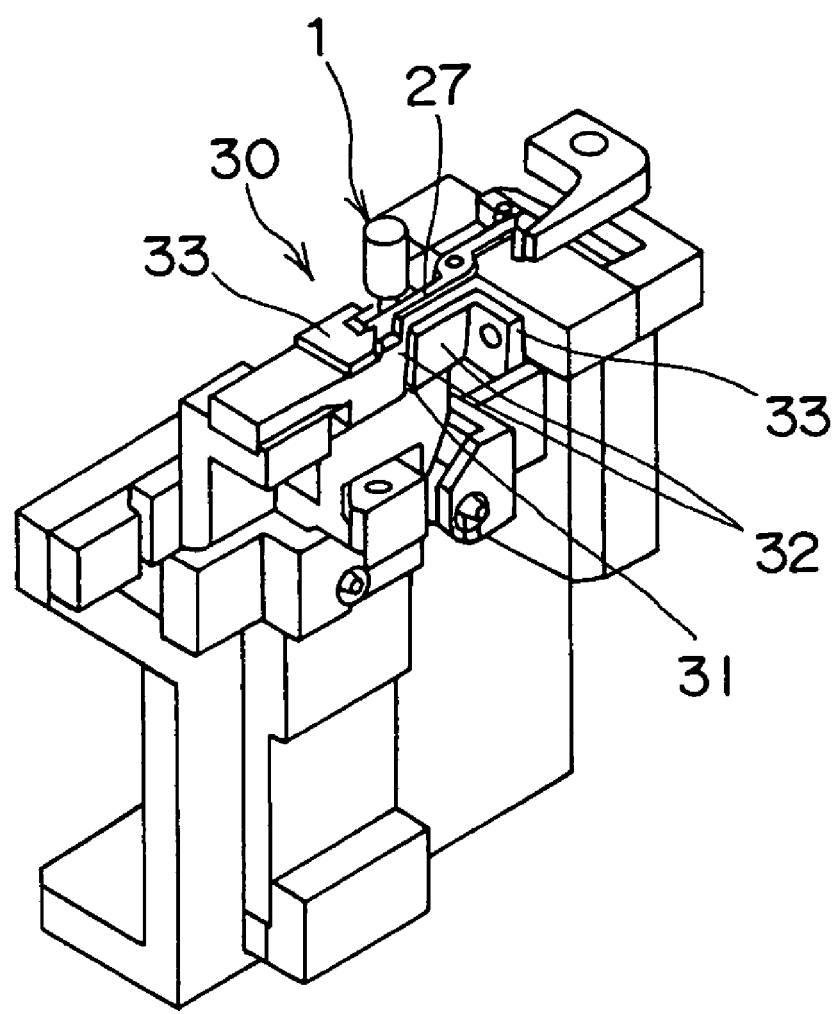
FIG. 4 is a perspective view of a holding position corrector disposed in the component conveyance section of FIG. 3.

FIG. 4 shows a perspective view of the holding position corrector 30. As shown in FIG. 4, the holding position corrector 30 includes a placement base 31 for placing a base of the taping member 4, a holder 32 for holding the taping member 4 such that both faces of the taping member 4 in a direction orthogonal to a longitudinal direction thereof (that is a thickness direction of the taping member 4) are sandwiched between the holder 32, and a pusher 33 for pushing the lead wires 3 of the component 1 to move the taping member 4 in the longitudinal direction.

In a case of correcting the position of the lead wires 3 held by the chuck 27, the segmented taped component train 5 in a state of being held by the chuck 27 is moved to an upper side of the holding position corrector 30 by rotation of the conveyor belt 21. After that, the segmented taping member 4 is placed on the placement base 31 and is released from the state of being held by the chuck 27, and the taping member 4 is moved in its longitudinal direction by each pusher 33 so as to move the lead wires 3 in the above direction and to implement a holding position correction, after which the chuck 27 is closed again to hold the lead wires 3.

Figure 5:
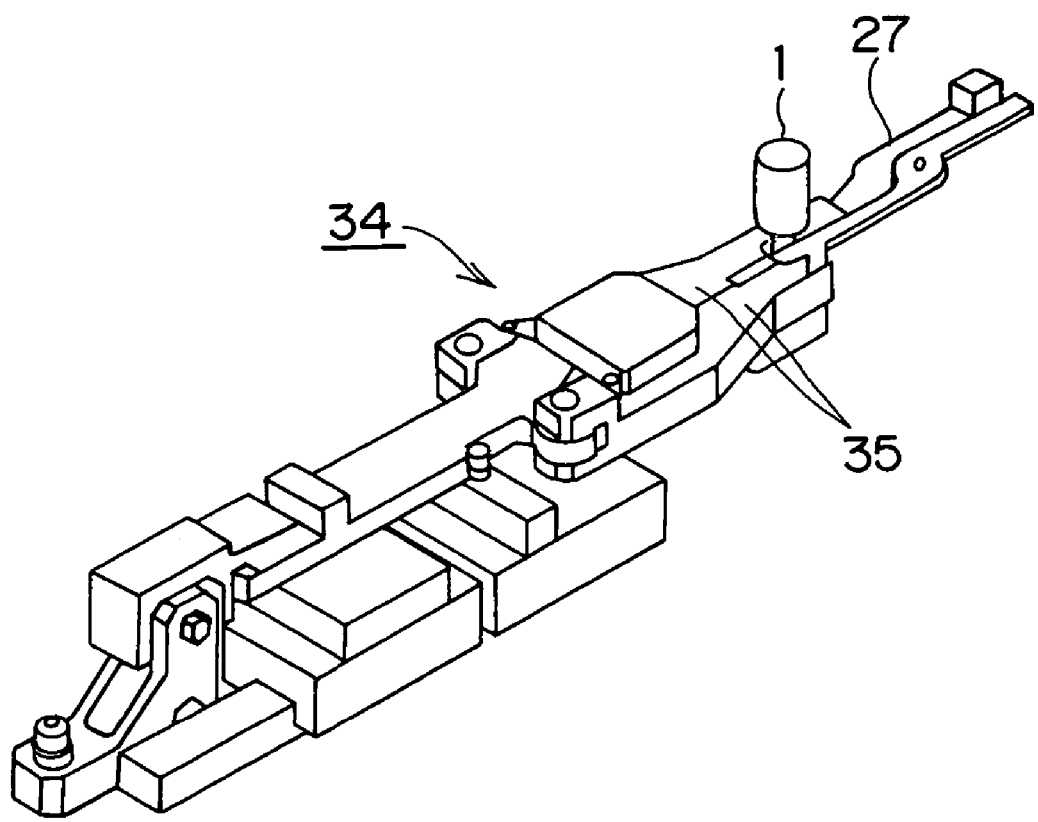
FIG. 5 is perspective view of a second cutting blade disposed in the component conveyance section of FIG. 3.

Next, FIG. 5 shows a second cutting blade unit 34, which is provided on a downstream side of the holding position corrector 30 for a purpose of cutting the lead wires 3. The second cutting blade unit 34 is structured detachably from each chuck 27 of the conveyor belt 21. More specifically, after a position of the lead wires 3 held by the chuck 27 is corrected, the lead wires 3 are cut down by the second cutting blade unit 34 so as to obtain appropriate lengths of the lead wires 3.

As shown in FIG. 5, the second cutting blade has two blades 35 that are freely opened and closed. On a lower surface side of top ends of these two blades 35, taper faces are formed, and in a state that the upper side of the segmented taping member 4 held by the chuck 27 is brought into contact with the taper faces, the taping member 4 is cut down so as to stabilize a length of these cut lead wires 3. Also, cutting the lead wires 3 makes it possible to remove the taping member 4 attached to a lower part of the lead wires 3 together with the lower part of the lead wires 3.

(Component Transferer)

Figure 7:
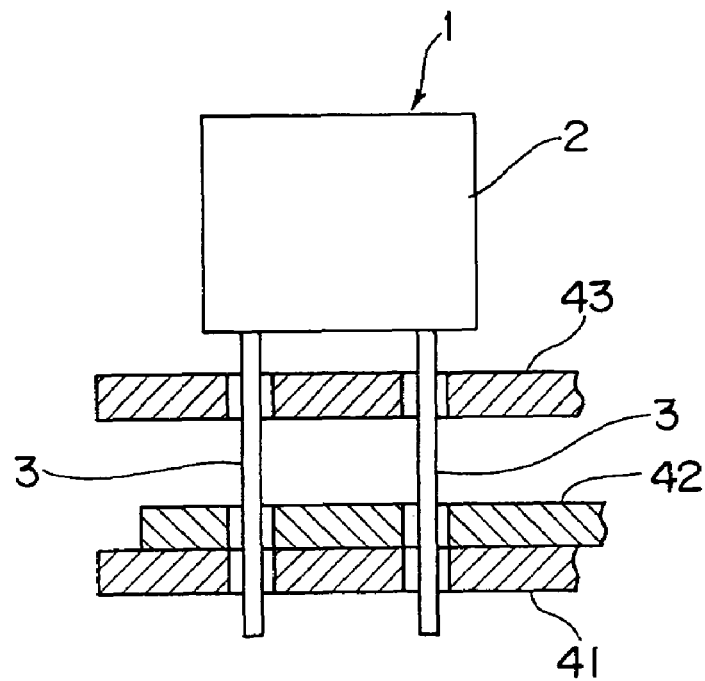
FIG. 7 is an explanatory view of a component grasping operation performed by a transfer chuck in the component insertion apparatus before component grasping.
Figure 8:
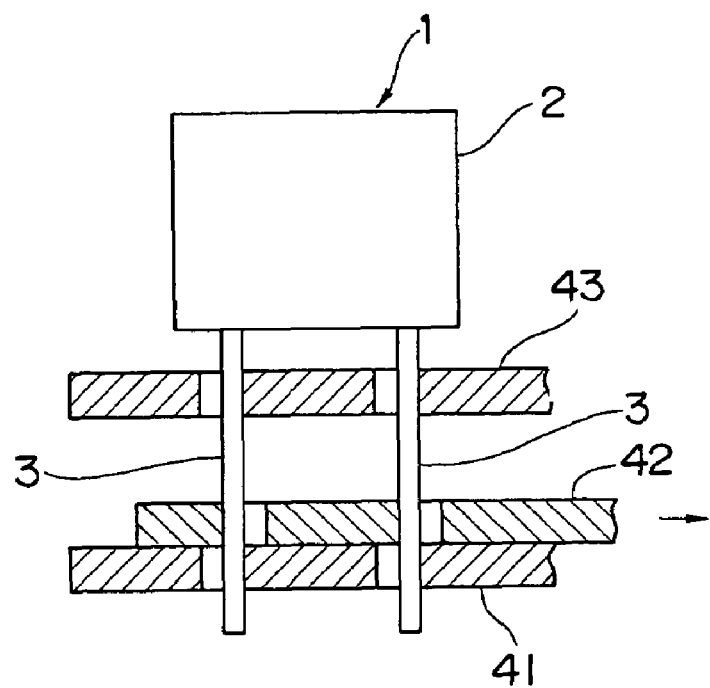
FIG. 8 is an explanatory view of a component grasping operation performed by the transfer chuck during component grasping.
Figure 9:
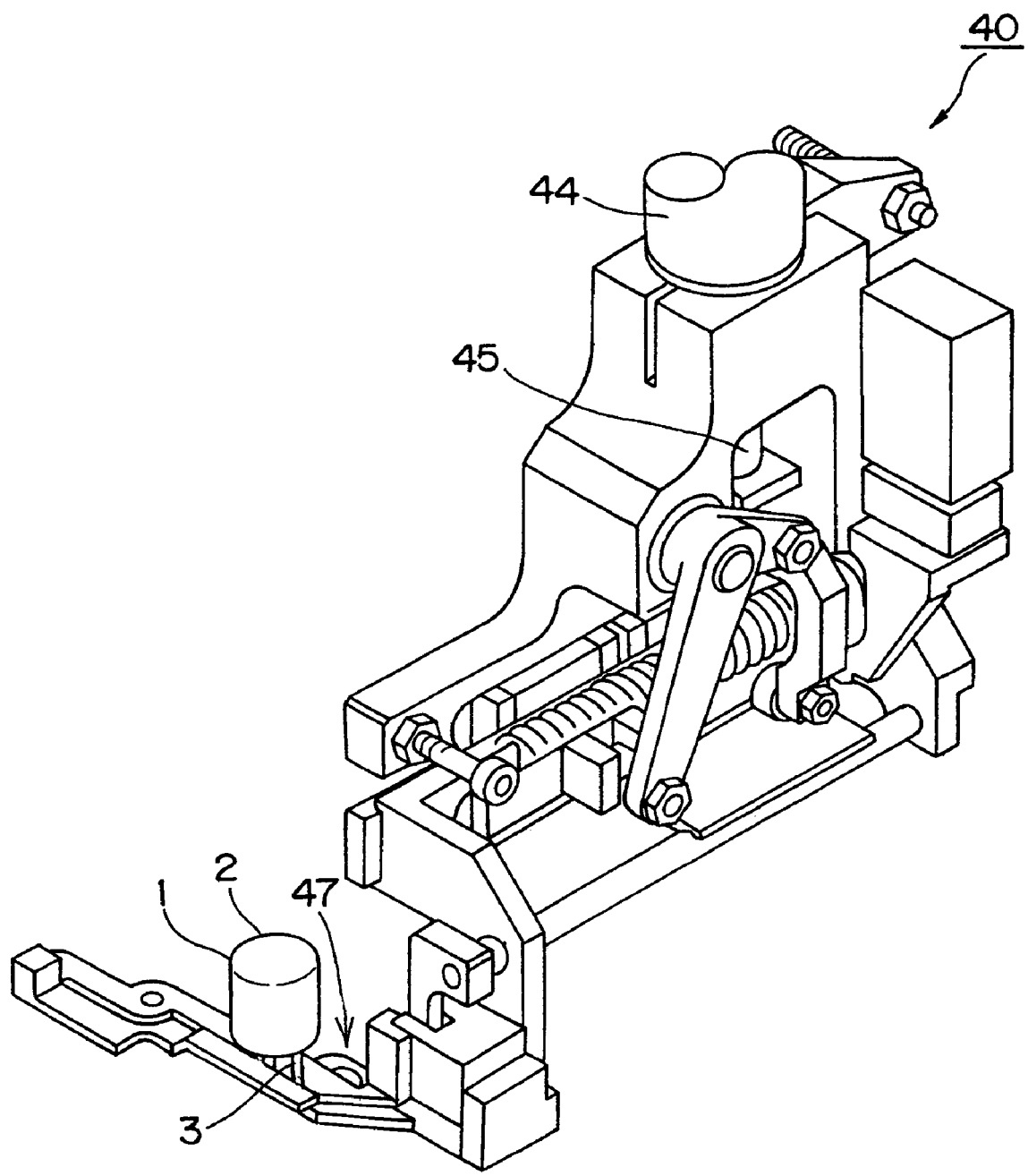
FIG. 9 is a perspective view of a component transferer in the component insertion apparatus.

Next, the component transferer 40 is described. As shown in FIG. 1, the component transferer 40, for transferring and feeding the component 1 whose lead wires 3 are each held by each chuck 27 of the conveyor belt 21 to a component insertion section 60, is disposed in the vicinity of the pulley 24 between the pulley 23 and the pulley 24 and placed on the apparatus base 102. On the conveyor belt 21 between the pulley 23 and the pulley 24, there is positioned a component delivery position for delivering the component 1 held by the chuck 27 from the component conveyance section 20 to the component transferer 40. FIG. 9 shows a perspective view of the component transferer 40. As shown in FIG. 9, the component transferer 40 is provided with a transfer chuck 47 capable of releasably grasping the lead wires 3 of the component 1 on its top end portion. FIG. 7 and FIG. 8 are side views showing the transfer chuck 47 in a fragmental and schematic way.

As shown in FIG. 7, the transfer chuck 47 has a plurality of claws for grasping the lead wires 3 of the component 1, with each claw being composed of two grasping claws 41, 42 for grasping the lower part of the lead wires 3 of the component 1, and a support claw 43 for supporting an upper part of the lead wires 3. Out of these two grasping claws 41, 42, the grasping claw 41 is integrated with the support claw 43, and another grasping claw 42 is movable against the grasping claw 41. Also, since one grasping claw 41 and the support claw 43 are integrated, not only a configuration of each claw may be simplified, but also, as shown in FIG. 8, another grasping claw 42 may be moved rightward as viewed in this figure so as to move each lead wire 3 in a movable direction of the grasping claw 42. As a result, while a left-side portion of each lead wire 3 in this figure is in contact with the grasping claw 42, a right-side portion of each lead wire 3 is in contact with the grasping claw 41 on a lower side in the figure and in contact with the support claw 43 on an upper side in the figure. In this state, the lead wires 3 are pressed to the right side in the figure, which enables the lead wires 3 to be supported by the grasping claws 41, 42 and the support claw 43, thereby accomplishing stable grasping of the lead wires 3.

Also, as shown in FIG. 9, the component transferer 40 includes three shafts 44, 45, 46 disposed coaxially in a vertical direction. Among these axes, the shaft 44 provided on an outermost side is for rotating the component transferer 40 in a direction along the surface of the circuit board 6. The shaft 45 provided on an inner side of the shaft 44 is for moving a transfer chuck 47 in a direction away from or approximating to the shaft 45 on a plane along the surface of the circuit board 6. For example, the shaft 45 is a shaft for moving the transfer chuck 47 in a direction approximating to or away from the chuck 27 provided on the conveyor belt 21.

Figure 10:
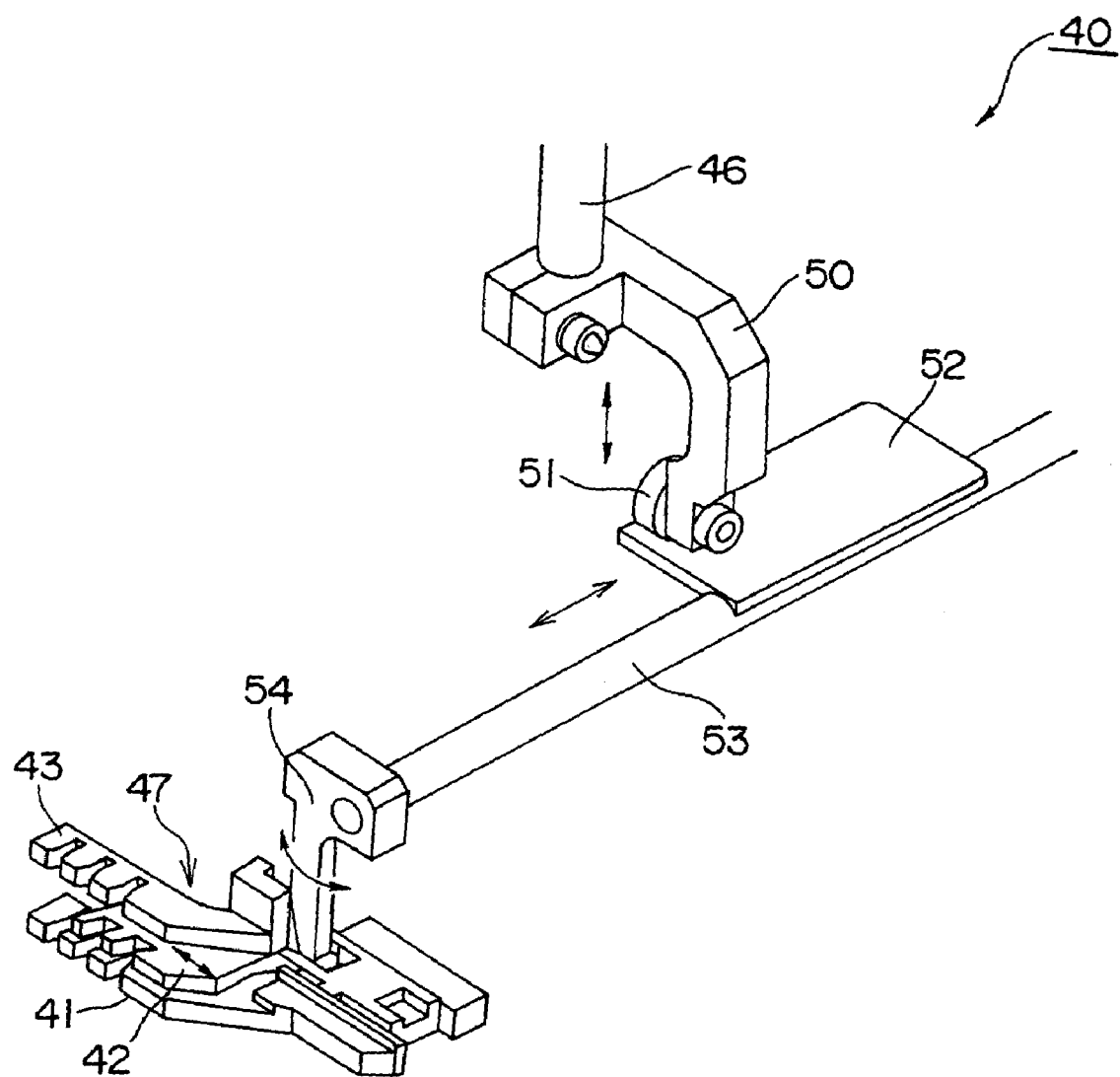
FIG. 10 is a fragmentary structural view of the component transferer of FIG. 9.
Figure 11:
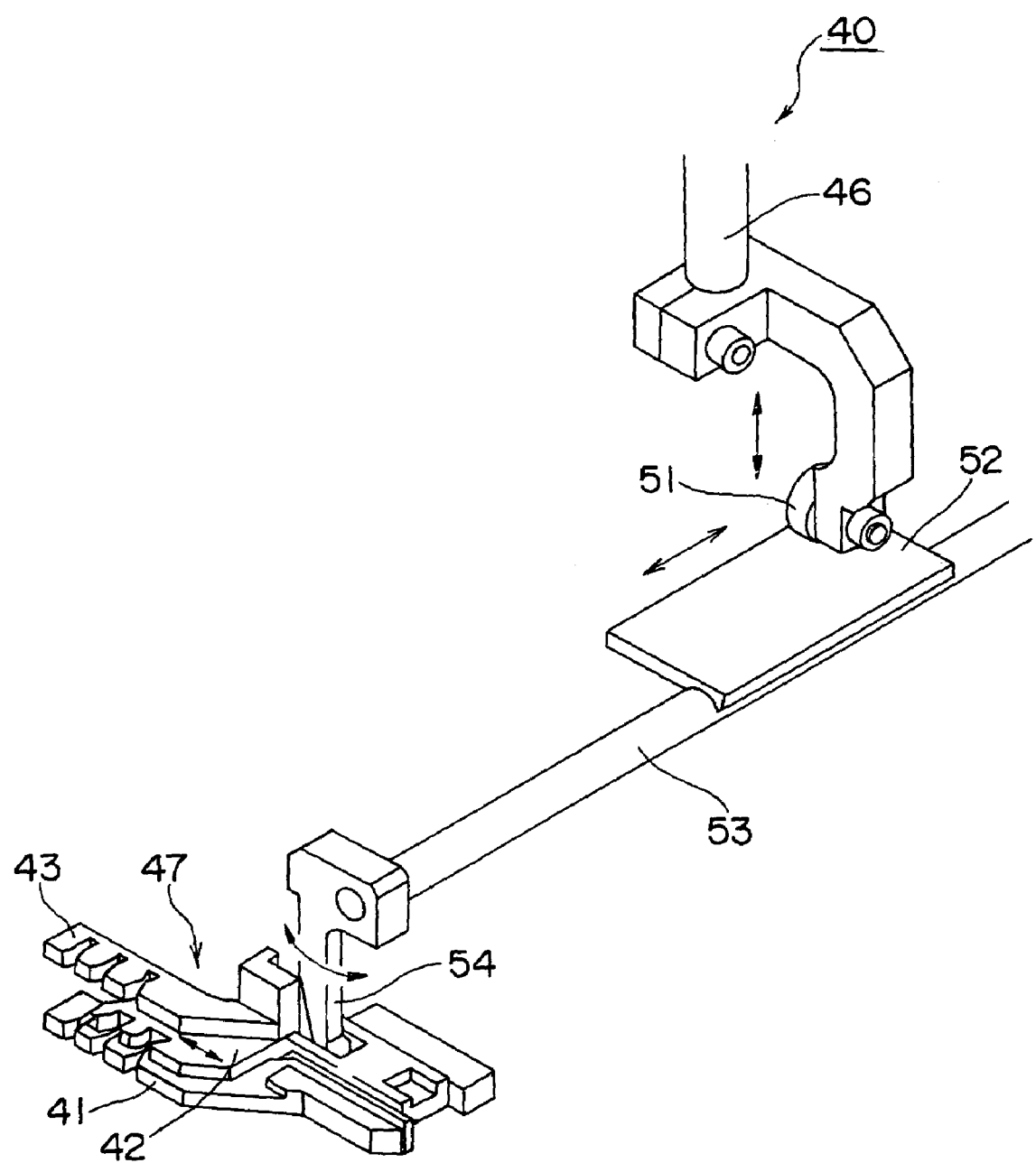
FIG. 11 is a fragmentary structural view of the component transferer of FIG. 9.

Further, a fragmentary configuration of the component transferer 40 is shown in perspective views of FIG. 10 and FIG. 11. FIG. 10 and FIG. 11 are perspective views of the transfer chuck 47 showing a configuration of the shaft 46, in which the shafts 44, 45 are removed. The shaft 46 provided on an innermost side relative to the shafts 44 and 45 is for opening and closing the transfer chuck 47, and more particularly is a shaft for performing a movable operation of the grasping claw 42 so as to grasp or release the lead wires 3. It is noted that as shown in FIG. 10, a plurality of recessed claw portions composed of the grasping claws 41, 42 and the support claw 43 for grasping the lead wires 3 are taper-shaped so as to be easily engaged with the lead wires 3.

Next, detailed descriptions will be given of respective configurations of the shafts 44, 45, 46. First, on an upper side higher than shown in FIG. 9, outermost shaft 44 is provided with, for example, an unshown driving mechanism such as motors and pulleys for rotatively driving the shaft 44 around its axial center as a center of rotation, and rotative driving of the shaft 44 by the driving mechanism implements rotation of the component transferer 40.

Figure 12:
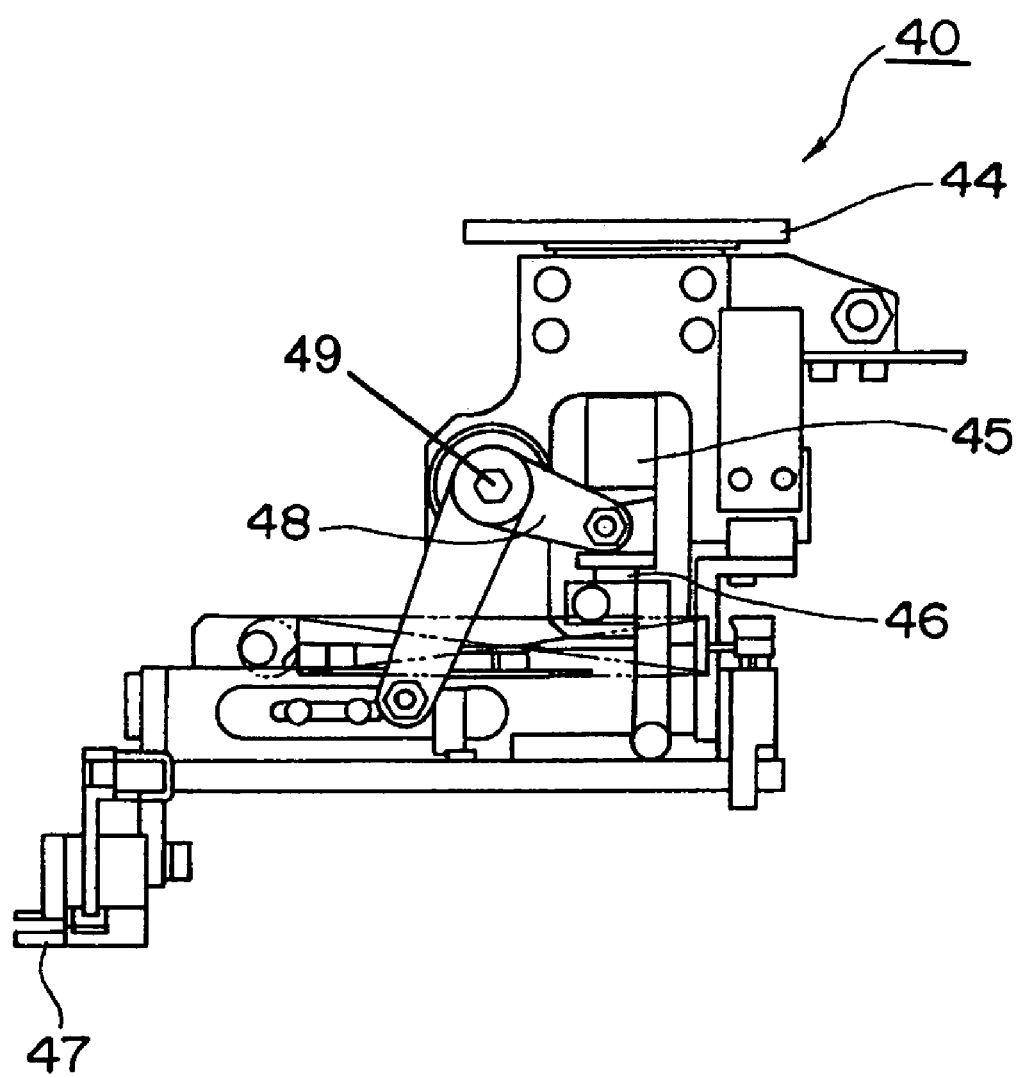
FIG. 12 is a side view of the component transferer of FIG. 9.
Figure 13:
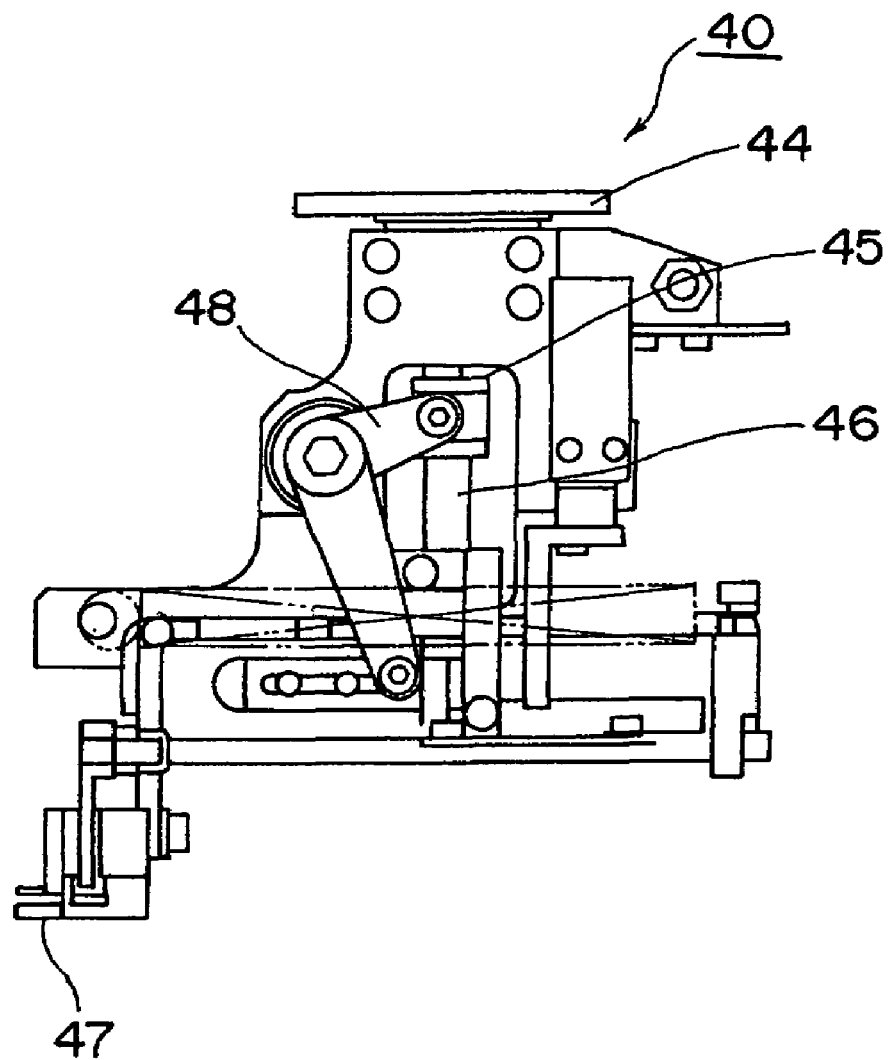
FIG. 13 is a side view of the component transferer of FIG. 9.

Also, as shown in side views of the component transferer 40 in FIG. 12 and FIG. 13, the shaft 45 shown in the middle is in a state that a moving lever 48 is rotatively engaged with a lower portion of the shaft 45. As shown in FIG. 12 and FIG. 13, the moving lever 48 is in an approximate L shape and is fixed rotatably by a shaft 49 on a middle portion of its side face. Consequently, when one end side of the moving lever 48 is pushed down at a lower end of the shaft 45, for example, from a state of FIG. 13 to a state of FIG. 12, the transfer chuck 47 is structured to be moved by the lower end side of the moving lever 48 leftward as viewed in the figures from a state of FIG. 13 to a state of FIG. 12.

Next, as for the shaft 46 provided on the innermost side, as shown in FIG. 10 and FIG. 11, a lower end of the shaft 46 is attached to an upper end of a lever 50, and a lower end of the lever 50 is attached to a roller 51. The roller 51 is constantly in contact with an upper face of a rotational plate 52 disposed on its lower side, and in the vicinity of one end of the rotational plate 52, the roller 51 is able to run along the one end. Also, on a rotational shaft 53, to a top end portion of which a transfer chuck 47 is attached and which is disposed approximately parallel to the surface of the circuit board 6, there is mounted an end portion of the rotational plate 52 opposite to the above one end. Also, the rotational shaft 53 is equipped with a slide lever 54 for disposing the grasping claw 42, constituting the transfer chuck 47, in between the support claw 43 and the grasping claw 41 and sliding the grasping claw 42 approximately parallel to each of them. One end of the slide lever 54 is attached to the rotational shaft 53, and another end is attached to the grasping claw 42 in a way of enabling the grasping claw 42 to be slid by pushing-out of the grasping claw 42 in a sliding direction. Consequently, as the rotational shaft 53 is rotated around its axial center as a center of rotation, the slide lever 54 is also rotated around the center of rotation, by which at the other end of the slide lever 54, the grasping claw 42 may be moved in the sliding direction. Thus, moving the grasping claw 42 in the sliding direction makes it possible to grasp or release the lead wires 3 of the component 1.

Also, the lever 50 attached to the lower end of the shaft 46 is brought into the state of constantly being in contact with the one end of the upper face of the rotational plate 52 by the roller 51 disposed on a lower end of the lever 50. In such a state, moving the shaft 46 down enables the lever 50 to push down the one end of the rotational plate 52 through the roller 51. The rotational plate 52, whose one end is pushed down, rotates the rotational shaft 53 around its center of rotation, and rotation of the rotational shaft 53 slides the grasping claw 42, by which the above-described grasping or releasing operation is implemented. It is noted that, after such operation, reverse operation of the shaft 46, that is upward movement of the shaft 46, makes it possible to slide the grasping claw 42 in a direction opposite to the sliding operation, thereby enabling a reverse operation of the above-stated grasping or releasing operation.

Also, the roller 51 which is attached to the lower end of the lever 50 capable of pushing down the rotational plate 52 is able to run along the one end of the rotational plate 52, that is, along the rotational shaft 53. Also, transfer of the transfer chuck 47 in the direction away from or approximately toward the shaft 45 by an up and down operation of the shaft 45 is implemented by transfer of the rotational shaft 53 along its axial center. Accordingly, if the rotational shaft 53 is moved along its axial center, the roller 51 runs along the same direction on the upper face of the rotational plate 52, which prevents a mechanism for sliding the grasping claw 42 by use of the shaft 46 from disturbing a transfer operation of the transfer chuck 47 away from or approximately toward the shaft 45 by virtue of the shaft 45.

(Component Insertion Section)

Next, description will be given of the component insertion section 60. As shown in FIG. 1, the component insertion section 60 is disposed on the apparatus base 102 adjacent to the component transferer 40 and is provided with a component insertion head 61 fixed by a plurality of rigid frames fixed on the apparatus base 102. On the apparatus base 102, there is provided a slide base 83 for releasably fixing the circuit board 6 fed to the component insertion apparatus 101, and moving the circuit board 6 along a surface thereof. It is noted that a detailed configuration of the slide base 83 will be described later. The component insertion head 61, which is disposed on an upper side of the circuit board 6 fixed to the slide base 83, performs insertion of each component 1 at each component insertion position in the circuit board 6. Also, a component-insertion guide unit 80, which is an example of the lead-wire guide unit for performing insertion of the component 1 into the circuit board 6 with the component insertion head 61 while guiding the lead wires 3 of the component 1, is disposed on an apparatus base 101 on a lower side of the circuit board 6 fixed by the slide base 83. It is noted that in the present specification, a component insertion position (or an insertion position of the component), which refers to a position of the circuit board 6 where the component 1 is inserted, is herein used in a broader sense and includes positions on a virtual line in a direction orthogonal to the surface of the circuit board 6 from the above-stated position.

Figure 14:
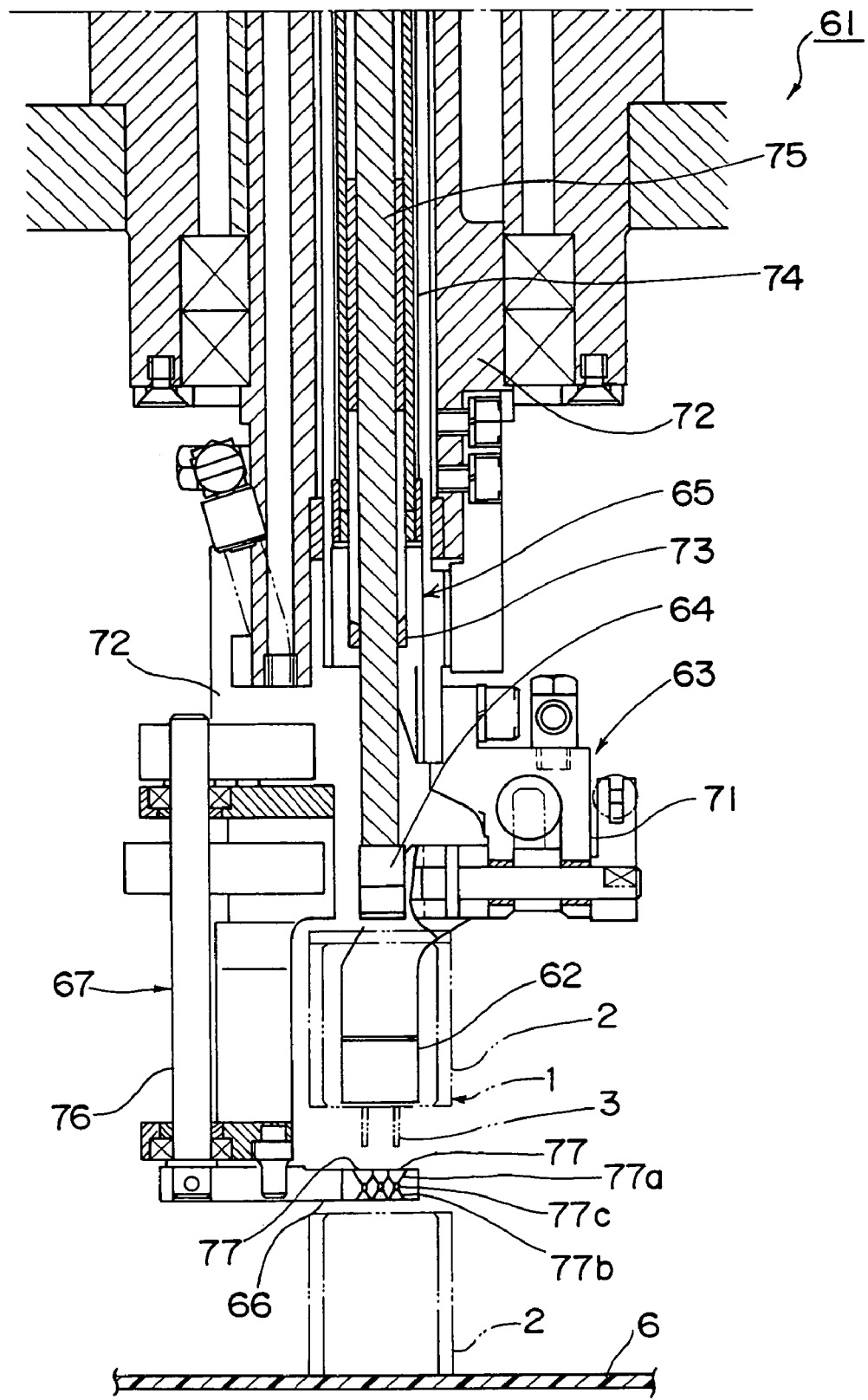
FIG. 14 is a cross sectional side view of a component insertion head in the component insertion apparatus.

First, description will be given of the component insertion head 61. FIG. 14 shows a cross sectional side view of the component insertion head 61, and FIG. 15 shows an enlarged fragmentary perspective view of a top end portion of the component insertion head 61.

Figure 15:
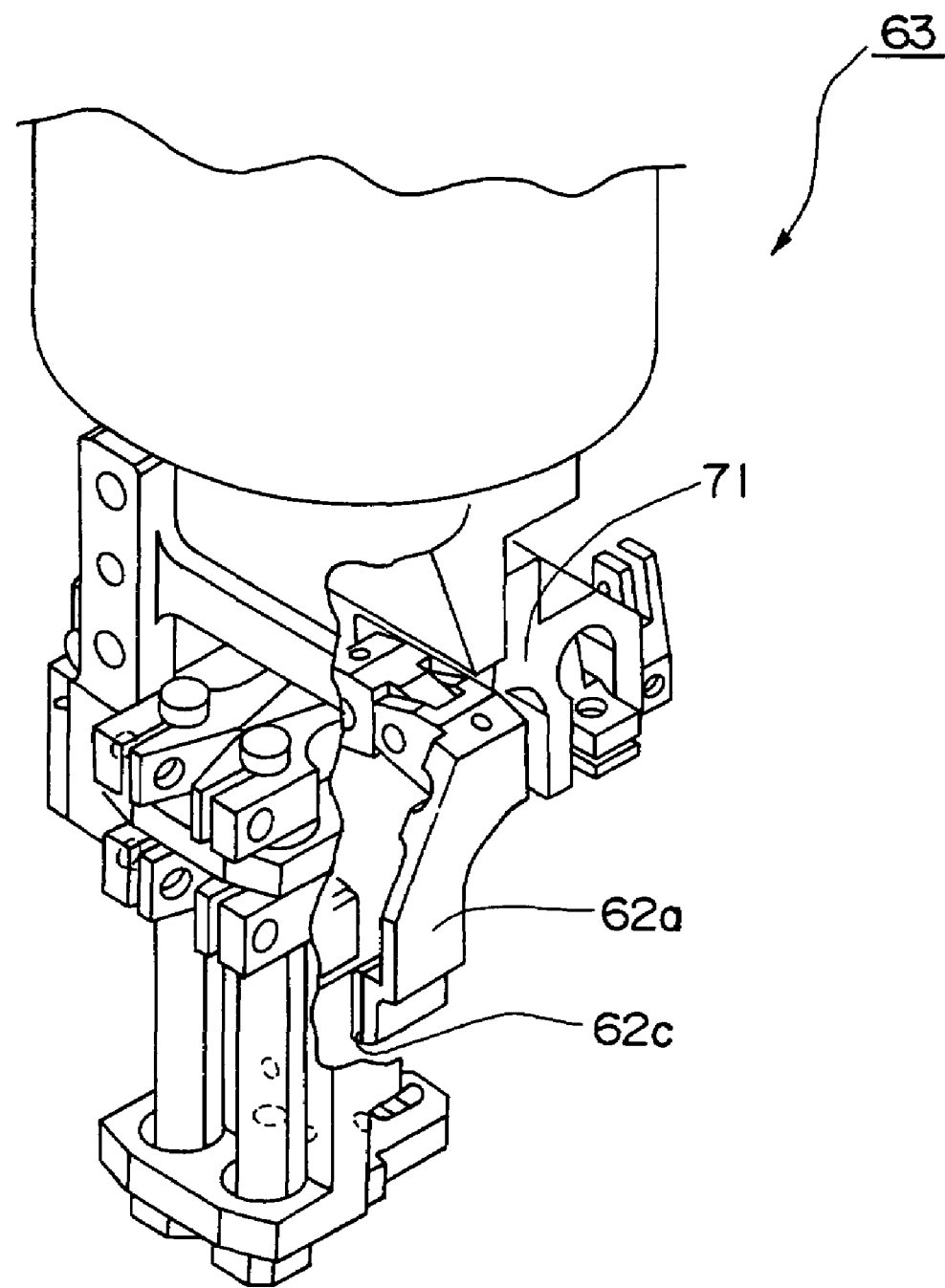
FIG. 15 is an enlarged fragmentary view of an insertion chuck in the component insertion head of FIG. 14.

As shown in FIG. 14 and FIG. 15, the component insertion head 61 includes an insertion chuck mechanism 63 which is an example of a grasping unit having an insertion chuck 62 which is an example of a pair of grasping members for grasping the device portion 2 of a component 1, a pusher mechanism 65 which is an example of a pusher unit having a pusher 64 which is an example of a pusher member for pushing out the device portion 2 of the component 1 downward, and a guide chuck mechanism 67 having a guide chuck 66 for guiding and holding the contact between a top end of the lead wires 3 and guide pins 81 of the component-insertion guide unit 80 at a time of inserting the component 1 into the circuit board 6.

Figure 16:
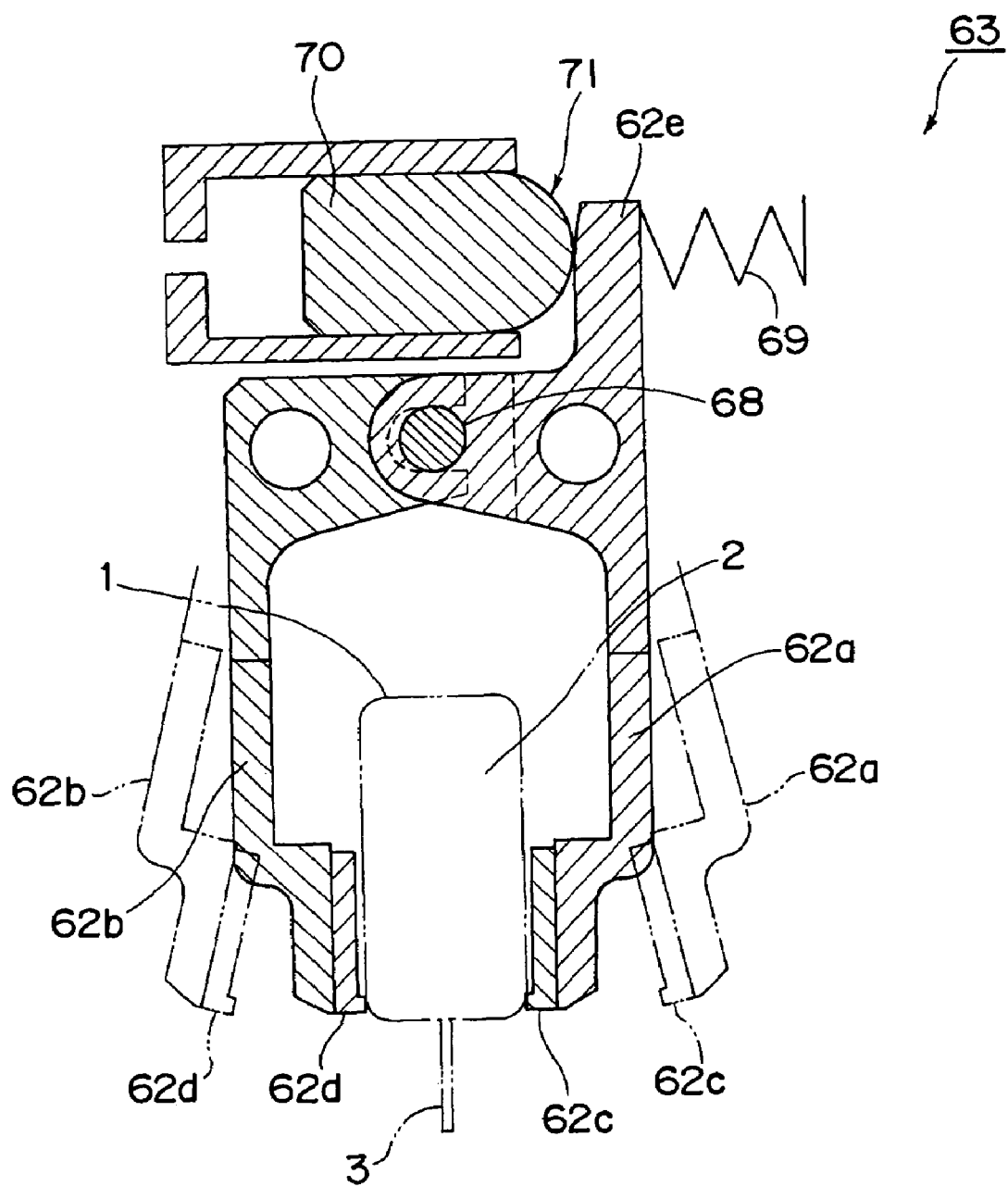
FIG. 16 is an explanatory structural view of the insertion chuck.

First, FIG. 16 shows a schematic side view showing a schematic configuration of the insertion chuck mechanism 63, and with reference to FIG. 14 to FIG. 16, the configuration of the insertion chuck mechanism 63 is described. As shown in FIG. 16, the insertion chuck mechanism 63 includes a pair of insertion chucks 62a and 62b mounted rotatably around a supporting point pin 68, and an insertion chuck driving section 71 which is an example of a grasping-member driving portion for conducting opening and closing operations by driving the insertion chucks 62a and 62b. The pair of insertion chucks is composed of the insertion chuck 62a on a right side in FIG. 16 and the insertion chuck 62b on a left side in this figure. On a lower end of their faces facing each other, there are formed chuck end portions 62c, 62d having protruded portions for grasping the device portion 2 of the component 1. It is noted that there may be a case in which, instead of the device portion 2 of the component 1 being grasped, the lead wires 3 are grasped by the pair of insertion chucks 62a and 62b. A reason for this is that since the component 1 is, in some cases, one having the device portion 2 formed small like a resistor or the like, not the device portion 2 but the lead wires 3 are grasped generally in such a component 1. Also, each of the chuck end portions 62c, 62d is preferably formed from, for example, rubber-based materials. This is because in grasping the device portion 2, by utilizing elasticity that is a characteristic of rubber-based materials, the device portion 2 may be securely grasped and shock generated in the grasping operation may be alleviated, thereby enabling prevention of damage on this grasped device portion 2.

Also, each insertion chuck 62a, 62b may be simultaneously driven by each rotating operation around the supporting point pin 68 as a center of rotation, with the rotating operation being symmetric in each relative direction. Also, an upper end of the insertion chuck 62a on the right side as viewed in FIG. 16 forms a driving end portion 62e to which driving force is transmitted by the insertion chuck driving mechanism 71. To the driving end portion 62e, a spring 69 is attached on the right side in this figure, with the spring 69 constantly pressing the driving end portion 62e leftward as viewed in the figure. Consequently, the insertion chuck 62a on the right side in the figure is rotated counterclockwise in the figure around the supporting point pin 68 as the center of rotation, while the insertion chuck 62b performing the operation symmetric to the insertion chuck 62a is rotated clockwise in the figure, which brings about a state in which the chuck end portions 62c, 62d are opened (i.e., the insertion chuck 62 is in an open state). It is noted that a distance between the chuck end portions 62c and 62d in an open state is set constant by mechanically controlling a limit of rotation of each insertion chuck 62a, 62b in each direction. It is noted that in FIG. 16, the open state of the insertion chuck 62 is described with a virtual line.

Also, on a left side of the driving end portion 62e of the insertion chuck 62a in FIG. 16, there is disposed a cylinder portion 70 for pressing the driving end portion 62e rightward as viewed in the figure against a pressing force of the spring 69. In a case where the cylinder portion 70 is driven rightward as viewed in the figure by compressed air or the like, the driving end portion 62e is driven by the cylinder portion 70 rightward as viewed in the figure while constricting the spring 69. As a result, the insertion chuck 62a constantly in an open state is rotated clockwise in the figure around the supporting point pin 68 as the center of rotation, while the insertion chuck 62b is rotated counterclockwise in the figure, by which the chuck end portions 62c, 62d approximate to each other to form a closed state. The device portion 2 of the component 1 is structured to be disposed between the chuck end portions 62c, 62d, so that the device portion 2 may be grasped by each of the chuck end portions 62c, 62d. It is noted that as shown in FIG. 14, the insertion chuck mechanism 63 is fixed to and supported by a main unit frame 72 of the component insertion head 61. Also, the insertion chuck mechanism 63 has an unshown up/down moving mechanism, which makes it possible to move up and down the insertion chuck driving section 71 and the insertion chuck 62, so that, for example, the component 1 grasped by the insertion chuck 62 may be moved down in this grasped state.

Figure 25:
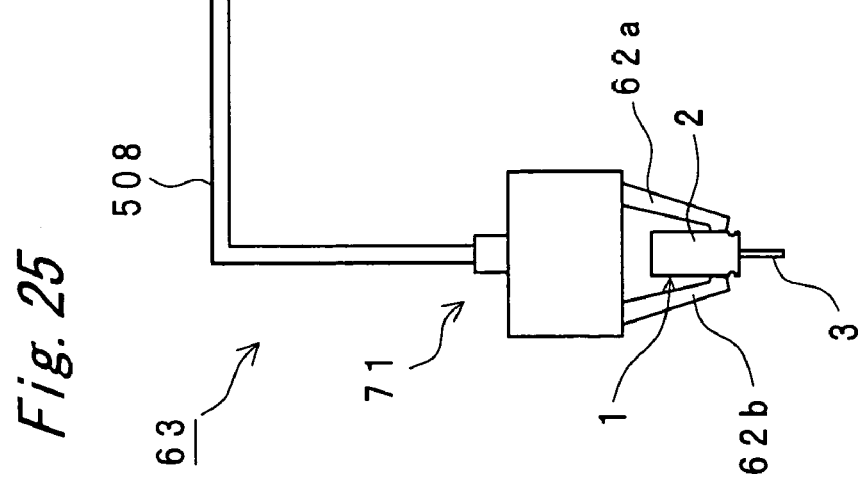
FIG. 25 is a schematic explanatory view of structure for performing pressure control of compressed air of an insertion chuck mechanism in the component insertion head.

Now the insertion chuck driving section 71 is described in more detail by using a schematic explanatory view shown in FIG. 25. As shown in FIG. 25, the insertion chuck driving section 71 is equipped with a pressure-variable supply section (for use of driving the insertion chuck) for supplying compressed air, which is an example of fluid to be supplied to the cylinder portion 70, with pressure of the compressed air varied to a desired pressure. The pressure-variable supply section is provided with a connecting pipe 508 connected to the cylinder portion 70, and with a mechanical valve 501, which is an openable-and-closable valve provided along the connecting pipe 508 and which is capable of conducting and stopping supply of compressed air that is supplied by the opening and closing operations. This mechanical valve 501 is provided, as a mechanism for performing the opening and closing operations, with a cam follower portion 502 which is placed on one end of the mechanical valve 501 and capable of the opening and closing operations by being slidingly moved in left and right directions as viewed in FIG. 25, and a cam portion 503 which, while normally kept in contact with the cam follower portion 502, is rotationally driven to effectuate a sliding movement of the cam follower portion 502. Further, as shown in FIG. 25, to the connecting pipe 508 through the mechanical valve 501, high-pressure compressed air through a high-pressure use regulator 506 or low-pressure compressed air through a low-pressure use regulator 507 can selectively be supplied so as to pass each through a shuttle valve 504. Also, a solenoid valve 505 capable of opening and closing control is provided between the high-pressure use regulator 506 and the shuttle valve 504, and the solenoid valve 505, when opened, allows supply of the high-pressure compressed air through the connecting pipe 508, and the solenoid valve 505, when closed, allows supply of the low-pressure compressed air through the connecting pipe 508. It is noted that the shuttle valve 504 is a three-directional check valve provided with two compressed air inlets at which connecting pipes for high- and low-pressure compressed air are connected, respectively, and one compressed air outlet from which compressed air led in through the two compressed air inlets is supplied out. In more detail, the shuttle valve 504 has a function of, while permitting passage of a predetermined one of compressed air flows led in through the two compressed air inlets, mechanically interrupting (e.g., interrupting by use of a mechanical spring member or the like) other compressed air flow, as well as a function of, while not permitting passage of the one compressed airflow, releasing mechanical interruption of the other compressed air with pressure of the other compressed airflow so as to permit passage of the other compressed airflow. In this embodiment, the shuttle valve 504 is used on an assumption that the one compressed airflow is of high-pressure compressed air while the other compressed airflow is of low-pressure compressed airflow. Use of such a shuttle valve 504 can make one compressed air less susceptible to pressure of the other compressed airflow, so that accuracy of pressure of the compressed air supplied through the shuttle valve 504 can be maintained within a certain range. Furthermore, opening and closing operations of the solenoid valve 505 and opening and closing operations of the mechanical valve 501 (i.e., rotational operation of the cam portion 503) are performed under control by an insertion chuck control section 509 which is an example of a grasping unit control section provided in the insertion chuck mechanism 63.

Next, description will be given of a configuration of the pusher mechanism 65. As shown in FIG. 14, the pusher mechanism 65 includes a pusher 64 provided on a lower end thereof, and a pusher up/down moving unit 73 for performing an up-and-down operation of the pusher 64. The pusher up/down moving unit 73 is composed of a slide shaft 74 that is a hollow shaft vertically movably supported on the main unit frame 72, a rod 75 that is slidable in a vertical direction inside the vertically movable slide shaft 74 independent of movement of the slide shaft 74 and that has the pusher 64 fixed at its lower end portion, and an unshown driving mechanism for driving the slide shaft 74 in the vertical direction. The slide shaft 74 is moved up or down by the driving mechanism in a vertical direction, while supported by the main unit frame 72, along an up/down operational axis that is an axial center of the slide shaft 74, which allows the rod 75 to move up or down along the axial-center up/down operational axis, thus making it possible to perform an up/down operation of the pusher 64. It is noted that on a lower end face of the pusher 64, there is formed a recess portion (not shown) in an approximately recessed shape, which is structured to be able to push down an upper part of the device portion 2 of the component 1 positioned on the up/down operational axis of the pusher 64 and under the pusher 64, while holding the same in a way to accommodate it in that recess portion while pressing it with the lower end face.

Figure 26:
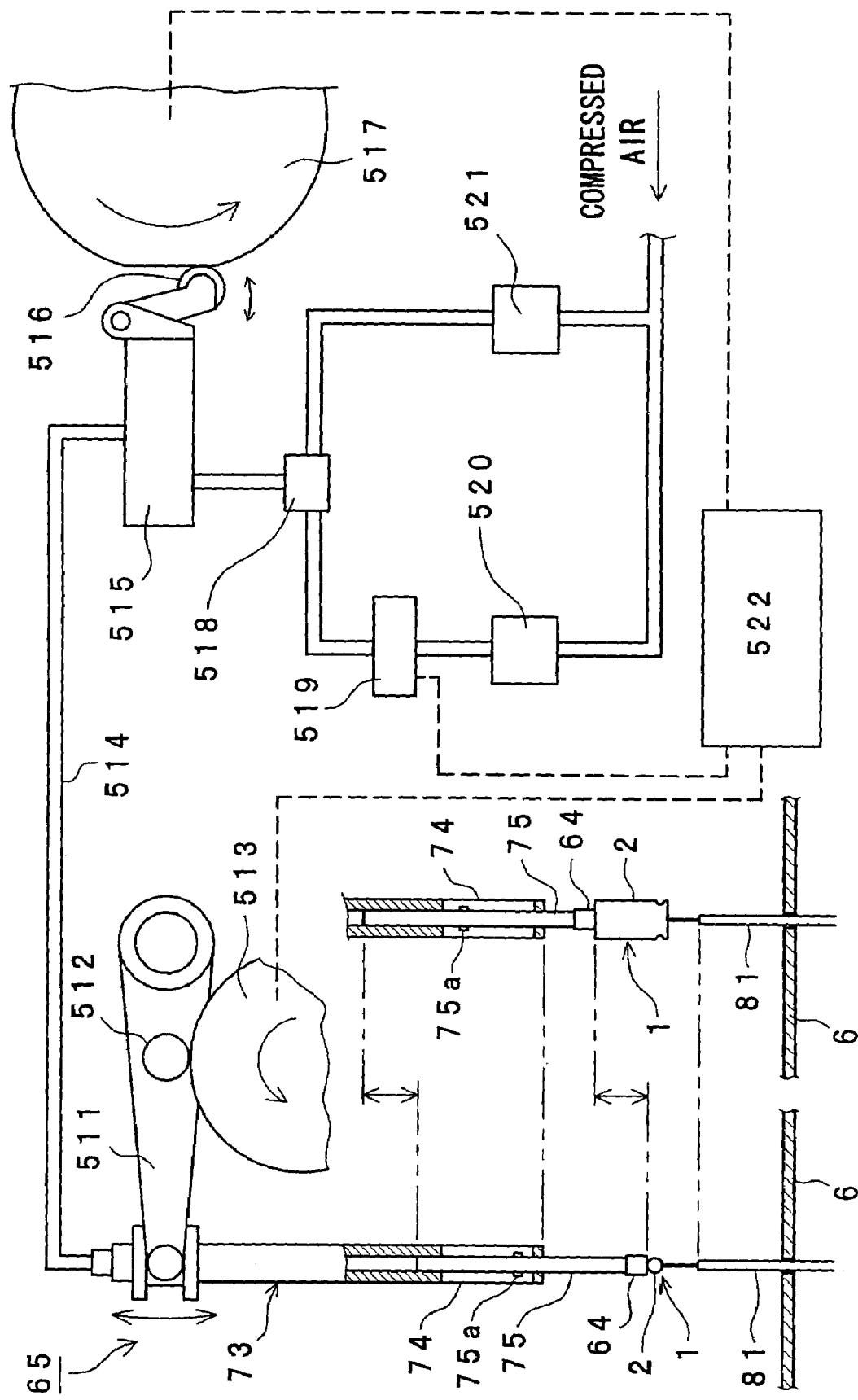
FIG. 26 is a schematic explanatory view of structure for performing pressure control of compressed air of a pusher mechanism in the component insertion head, and structure for performing an up-and-down operation of the pusher.

The pusher up/down moving unit 73, which is a mechanism for performing up-and-down movement and a pressing operation of the pusher 64, is described in more detail by using a schematic explanatory view shown in FIG. 26. As shown in FIG. 26, the pusher up/down moving unit 73 is provided with a pressure-variable supply section (dedicated to the pusher) for supplying compressed air, which is an example of fluid, to a hollow portion of a cylinder mechanism which is composed of a hollow portion within the slide shaft 74 and the rod 75 that is movable vertically along the hollow portion, with pressure of compressed air varied to a desired pressure. The pressure-variable supply section is provided with a connecting pipe 514 connected to the hollow portion, and a mechanical valve 515 which is an openable-and-closable valve provided along the connecting pipe 514 and which is capable of conducting and stopping supply of compressed air that is supplied by the opening and closing operations. This mechanical valve 515 is provided, as a mechanism for performing the opening and closing operations, with a cam follower portion 516 which is placed on one end of the mechanical valve 515 and capable of the opening and closing operations by being slidingly moved in left and right directions as viewed in FIG. 26, and a cam portion 517 which, while normally kept in contact with the cam follower portion 516, is rotationally driven to effectuate a sliding movement of the cam follower portion 516. Further, as shown in FIG. 26, to the connecting pipe 514 through the mechanical valve 515, high-pressure compressed air through a high-pressure use regulator 520 or low-pressure compressed air through a low-pressure use regulator 521 can selectively be supplied so as to pass each through a shuttle valve 518 (having the same functions as the shuttle valve 504). Also, a solenoid valve 519 capable of opening and closing control is provided between the high-pressure use regulator 520 and the shuttle valve 518, and the solenoid valve 519, when opened, allows selective supply of high-pressure compressed air through the connecting pipe 514, and the solenoid valve 519, when closed, allows selective supply of low-pressure compressed air through the connecting pipe 514. Furthermore, the opening and closing operations of the solenoid valve 519 and the opening and closing operations of the mechanical valve 515 (i.e., rotational operation of the cam portion 517) are performed under control by a pusher control section 522 which is an example of a pusher unit control section provided in the pusher mechanism 65.

Further, as shown in FIG. 26, an up/down lever 511 for mechanically performing an up/down operation of the slide shaft 74 is provided at an upper portion of the slide shaft 74. The up/down lever 511, which has one end vertically movably fitted to an upper portion of the slide shaft 74 and another end rotatably fitted to the main unit frame 72, is enabled to move the slide shaft 74 up and down by the one end being moved vertically with the other end serving as a fulcrum (center of rotation). Also, an up/down cam follower portion 512 is fitted at a generally intermediate place between the one end and the another end of the up/down lever 511. Further, an up/down cam portion 513 which, while normally kept in contact with the up/down cam follower portion 512, is rotationally driven to effectuate up/down movement of the up/down cam follower portion 512. As a result, it is enabled to perform an up/down operation of the rod 75 along with the slide shaft 74, i.e. an up/down operation of the pusher 64, by rotationally driving the up/down cam portion 513 so that motion of this rotation is transformed into vertical up/down motion by the up/down cam follower portion 512, thereby performing the up/down motion of the one end of the up/down lever 511. It is noted that rotational drive of the up/down cam portion 513 is controlled by the pusher control section 522. By controlling the rotational drive amount of the up/down cam portion 513 by the pusher control section 522, an up/down motion amount of the up/down lever 511 can be controlled, by which the pusher 64 can be positioned to a desired up/down height position. Also, since compressed air is supplied to the hollow portion of the slide shaft 74, the rod 75 is enabled to move vertically with external force applied thereto in the vertical direction while the hollow portion serves as an air spring portion. As a result, for example as shown in FIG. 26, the pusher 64 is enabled to move vertically so that a contact position of the pusher 64 with the device portion 2 of the component 1 can be varied in accordance with a heightwise size of the component 1. It is noted that, as shown in FIG. 26, a protruding portion 75*a* is formed on an outer peripheral portion of the rod 75, and a vertical movement range of the rod 75, i.e. a vertical movement range of the pusher 64, is restricted by contact of this protruding portion 75*a* within the slide shaft 74.

Next, description will be given of a configuration of the guide chuck mechanism 67. As shown in FIG. 14, the guide chuck mechanism 67 includes a pair of guide chucks 66 attached to a lower end thereof, and a guide chuck driving portion 76 for opening and closing each guide chuck 66. It is noted that the guide chuck driving portion 76 is supported by being fixed to the main unit frame 72, and a pair of guide chucks 66 is disposed so as to be positioned below the insertion chuck 62.

Figure 17:
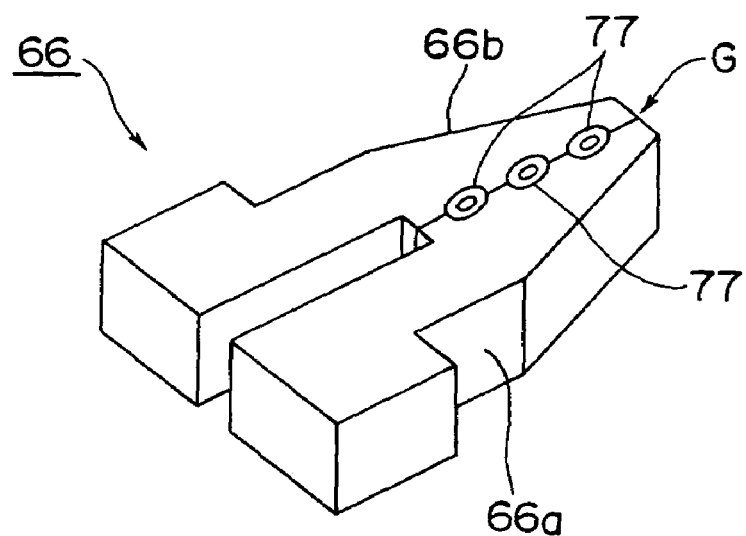
FIG. 17 is an enlarged fragmentary view of a guide chuck of the component insertion head of FIG. 14.

Here, FIG. 17 shows an enlarged fragmentary perspective view of a pair of the guide chucks 66. As shown in FIG. 17, two guide chucks 66*a*, 66*b* are disposed so as to face each other, and on a butting surface G formed when both chucks are closed, there are formed three through holes 77. The guide chuck 66 shown in FIG. 14 is a cross section along the butting surface G. Each of the through holes 77 formed on the butting surface G is structured such that an upper-side funnel-shaped hole 77*a* formed from an upper part toward a lower side, and a lower-side funnel-shaped hole 77*b* formed from a lower part toward an upper side, are integrally formed so as to be confronted with each other at a small-diameter hole 77*c* formed in an approximately middle portion between the upper and lower side and be connected to each other. Also, each of the through holes 77 is formed on the butting surface G so as to be halved, so that in a closed state of the guide chucks 66*a*, 66*b*, each of the through holes 77 comes into a full form. Also in each of the through holes 77, the upper-side funnel-shaped hole 77*a* is capable of guiding the top end portion of the lead wires 3 of the component 1 from an upper side of the guide chucks 66*a*, 66*b* to the small-diameter hole 77*c*, whereas the lower-side funnel-shaped hole 77*b* is capable of guiding a top end portion of the guide pins 81 in the component-insertion guide unit 80 from a lower side of the guide chucks 66*a*, 66*b* to the small-diameter hole 77*c*. It is noted that an inside diameter of each small-diameter hole 77*c* is formed to be slightly larger than a diameter of the lead wires 3 of the component 1 and to be slightly smaller than a diameter of the guide pin 81. Therefore, the lead wires 3 guided by each small-diameter hole 77*c* may go through each small-diameter hole 77*c*, though the guide pins 81 may not go through each small-diameter hole 77*c*. It is noted that instead of a case of forming an inner diameter of each small-diameter hole 77*c* to be slightly smaller than a diameter of the guide pin 81, there may be a case where an inner diameter of each small-diameter hole 77*c* is formed approximately equal to or slightly larger than a diameter of each guide pin 81, and a top end of each guide pin 81 is guided by the lower-side funnel-shaped hole 77*b* to each small-diameter hole 77*c*.

Also, the guide chuck driving portion 76 is provided with an unshown driving mechanism (e.g., cylinder mechanism or the like) for moving a pair of the guide chucks 66*a*, 66*b* such that the guide chucks 66*a*, 66*b* are spaced away from or approximately together at the butting surface G, more specifically for performing opening and closing operations of the guide chucks 66*a*, 66*b*. Under normal conditions, the driving mechanism puts each of the guide chucks 66*a*, 66*b* in an open state.

Herein, description is given of a positional relationship of the pusher 64, the insertion chuck 62, and the guide chuck 66. The pusher 64 is moved up and down along an up/down operational axis, on which the insertion chuck 62 and the guide chuck 66 are positioned. Particularly, the insertion chuck 62 is capable of grasping the component 1 fed by the component transferer 40 in the grasping position of the component 1 on the up/down operational axis, and is also capable of up or down movement on the up/down operational axis. Also, the through holes 77 positioned in the middle of the guide chuck 66 are aligned with the up/down operational axis. Further, the component insertion head 61 is provided with a head rotating mechanism (not shown) for integrally rotating the insertion chuck mechanism 63, the pusher mechanism 65, and the guide chuck mechanism 67 around the up/down operational axis as a center of rotation. It is noted that the up/down operational axis is disposed approximately orthogonal to the surface of the circuit board 6 fixed to a later-described slide base.

Figure 18:
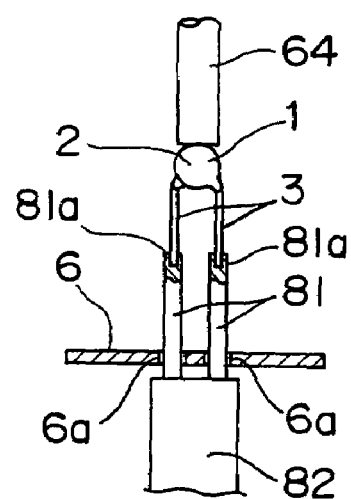
FIG. 18 is an explanatory view of a component insertion operation performed by a guide pin before insertion.

Next, description will be given of the component-insertion guide unit 80 disposed on the apparatus base 102 so as to face the component insertion head 61 through the circuit board 6 fixed to the slide base. The component-insertion guide unit 80 includes two guide pins 81 provided on its upper end portion, a guide block 82 on which each guide pin 81 is fixed, and an up/down moving mechanism (not shown) for integrally moving up and down each guide pin 81 through an up-and-down operation of the guide block 82. It is noted that although this embodiment is described for a case where the component insertion section 60 is provided with the component insertion head 61 and the component-insertion guide unit 80, the case may instead be one in which the component insertion head 61 is provided with the component-insertion guide unit 80. The component insertion head 61 and the component-insertion guide unit 80 are those which are operated in association with each other to perform an insertion operation of the component 1, and therefore these two units can be said to be substantially mutually integral units. FIG. 18 shows a schematic side view showing a schematic configuration of an upper portion of the component-insertion guide unit 80.

As shown in FIG. 18, on an upper end of the guide block 82, there are provided two guide pins 81 having the same length and which are mounted in an approximately vertical direction (i.e., a direction approximately orthogonal to the surface of the circuit board 6 fixed to the slide base). As shown in FIG. 18, move-up driving of the guide block 82 by the up/down moving mechanism makes it possible to simultaneously move up each guide pin 81 so that the guide pin 81 goes through an insertion hole 6*a* of the component 1 formed on the circuit board 6, that is aligned with the guide pin 81. It is noted that up/down movement of the guide block 82, that is move-up and -down of each guide pin 81, is in the direction approximately orthogonal to the surface of the circuit board 6. Also, on a top end portion of each guide pin 81, there is formed a recess portion 81*a*, which is an example of an engagement portion and to which a top end portion of a lead wire 3 of the component 1 may be engaged. Also, an up/down operational axis of the guide block 82 is aligned with the up/down operational axis of the pusher 64. Further, as shown in FIG. 18, in a state that the lead wires 3 are engaged with the recess portion 81a of each guide pin 81 while the device portion 2 is pushed down by the pusher 64, the component 1 may be held. While this state is being maintained, the pusher 64 and each guide pin 81 are moved down, so that the lead wires 3 of the component 1 may be inserted into the insertion holes 6a of the circuit board 6. More specifically, the pusher 64 and the guide pins 81 may be moved down in a synchronized state. It is noted that in almost a middle of each guide pin 81, there is positioned an up/down operational axis of the component insertion head 61.

Also, in the above description, there has been described, as one example, a case where the guide block 82 is provided with two guide pins 81. However, a number of guide pins 8 provided is not limited to the number set in the above case, and therefore the above case may be replaced, for example, by a case where three guide pins 81 are provided corresponding to a number of through holes 77 formed on the guide chuck 66. In such case, operation of each guide pin 81 is unchanged.

Also, each guide pin 81 is fixed to the guide block 82 through an unshown elastic solid, e.g., a spring portion. Consequently, even if each lead wire 3 and each guide pin 81 are slightly different in terms of top end height when the top end of each lead wire 3 is engaged with the recess portion 81a of each guide pin 81, the guide pin 81 previously engaged with the lead wire 3 is pushed down and causes contraction of the spring portion, which makes it possible to align each top end height, thereby facilitating engagement of each lead wire 3 with each guide pin 81.

Figure 27:
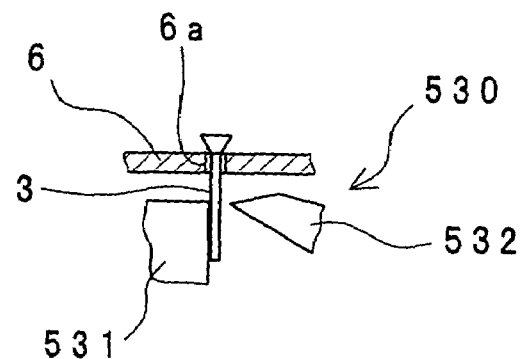
FIG. 27 is a schematic explanatory view showing a cut-and-clinch state of a cut-and-clinch device in the component insertion guide unit of the component insertion apparatus before cutting of a lead wire.

Also, as shown in FIG. 27, the component-insertion guide unit 80 is provided, at an upper portion of the guide block 82, with a cutting and bending unit 530 which is an example of a lead wire bending portion for cutting down the lead wires 3 of the component 1 inserted into the circuit board 6 to be an appropriate length and for bending each of these cut lead wires 3 in a direction opposite to each other so as to perform a process of preventing the component 1 from falling from the circuit board 6 (so-called cut-and-clinch). As shown in FIG. 27, the cutting and bending unit 530 is provided with a fixed blade 531 placed at an upper portion of the guide block 82, and a movable blade 532 which is placed at an upper portion of the guide block 82 so as to confront the fixed blade 531 and be movable in either approach to or separation from the fixed blade 531. Also, the fixed blade 531 and the movable blade 532 are placed at upper portions of the guide block 82 so that the lead wires 3 of the component 1 inserted into the insertion holes 6a of the circuit board 6 are therebetween. In such a state, the movable blade 532, when moved in approach toward the fixed blade 531, is enabled to cut the lead wires 3. Further, the movable blade 532 is also movable up and down so that after-cut lead wires 3 can be bent so as to be pushed upward.

(Slide Base)

Next, description will be given of slide base 83 exemplifying an alignment portion. As shown in FIG. 1, the slide base 83 is disposed between the component insertion head 61 and the component-insertion guide unit 80 on the apparatus base 102. The slide base 83 includes a fixing mechanism (not shown) for releasably fixing an end portion of the circuit board 6, and a transfer mechanism (not shown) for, together with the fixing mechanism, transferring this fixed circuit board 6 in the X-axis or Y-axis direction as viewed in this figure and adjusting a component insertion position formed on the circuit board 6, that is, aligning insertion hole 6a, the component insertion head 61, and the component-insertion guide unit 80. It is noted that the slide base 83 is disposed such that a part thereof seats below the conveyor belt 21 in the component conveyance section 20 so as to effectively use disposition space on the apparatus base 102. Also, the component insertion apparatus 101 includes a board feeding and conveying unit 84 for conveying the circuit board 6 fed to the component insertion apparatus 101 in a manner fixable to the slide base 83, and a board discharging and conveying unit 85 for releasing a circuit board 6, that was fixed to the slide base 83 and underwent an insertion operation, from a fixed state and discharging it from the component insertion apparatus 101. The board feeding and conveying unit 84 is provided with a pair of conveyance rails 84a for conveying, while supporting, both end portions in the Y-axis direction as viewed in FIG. 1 in the circuit board 6, whereas the board discharging and conveying unit 85 is also provided with a pair of conveyance rails 85a for conveying, while supporting, both end portions in the Y-axis direction as viewed in FIG. 1 in the circuit board 6.

(Control Section)

Figure 24:
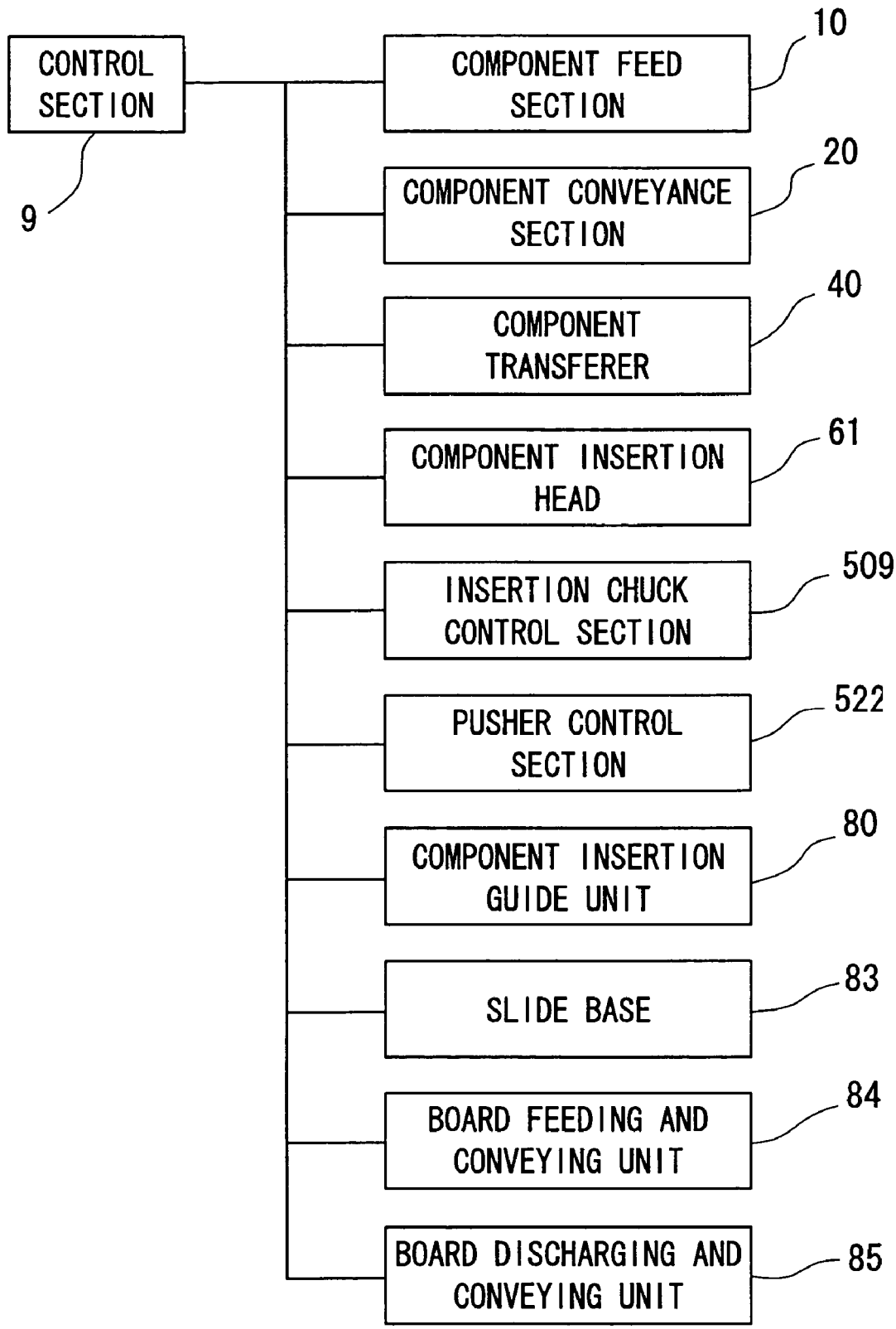
FIG. 24 is a block diagram showing a control system in the component insertion apparatus of the one embodiment.

Herein, FIG. 24 shows a block diagram of a control system in the component insertion apparatus 101. As shown in FIG. 24, the component insertion apparatus 101 has a control section 9 for controlling an insertion operation of the component 1. Also, the control section 9 is structured to be able to control a component feed operation in the component feed section 10, a component conveyance operation in the component conveyance section 20, a component transfer operation in the component transferer 40, an operation of the component insertion head 61, an operation of the component-insertion guide unit 80, and an alignment operation of the component insertion position by the slide base 83 in the component insertion section 60 and, a conveyance operation of the circuit board 6 in the board feeding and conveying unit 84 and the board discharging and conveying unit 85. While associating each of these operations with each other, the control section 9 controls an insertion operation of the component 1 into the circuit board 6. Further, the control section 9 is also enabled to exert control over each of the insertion chuck control section 509 and the pusher control section 522 provided in the component insertion head 61. The control section 9 is enabled to exert control of the these control sections (509 and 522) in association with each other and in an integrated manner, together with control of the aforementioned respective operations.

Figure 36:
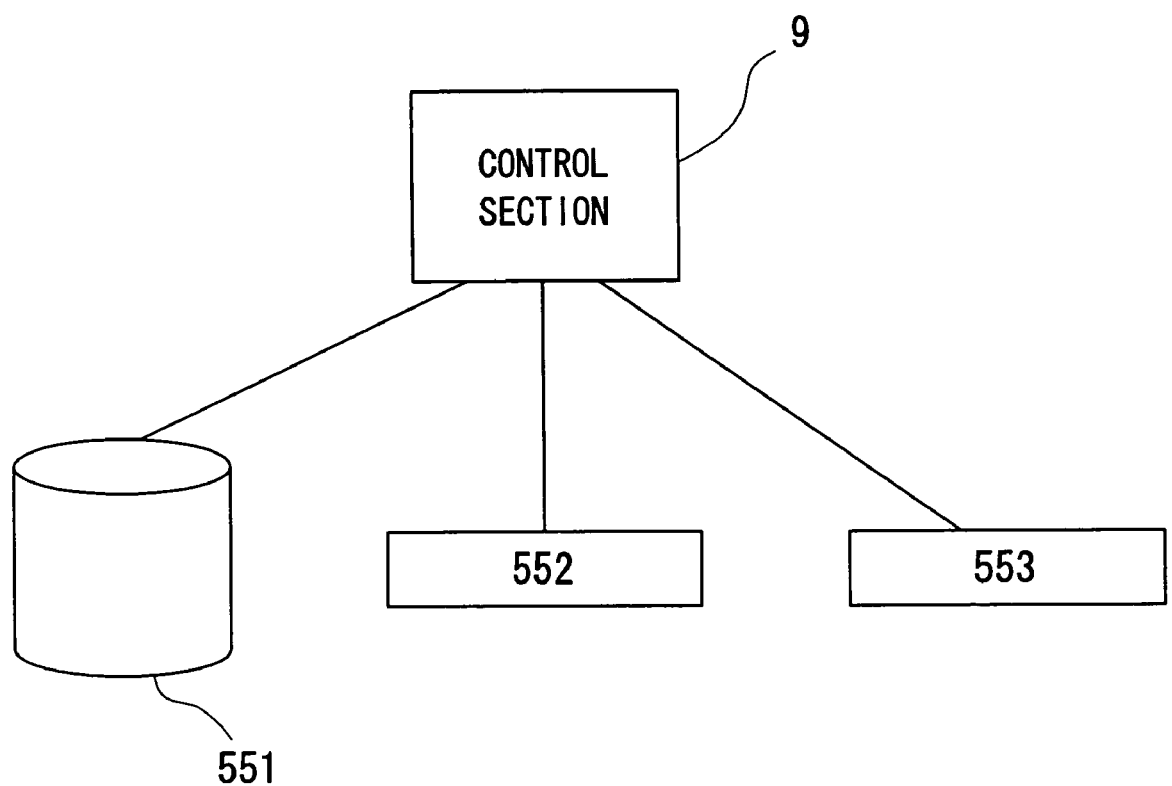
FIG. 36 is a block diagram showing structure of a control section in the component insertion apparatus of the one embodiment.

Further, with regard to structure of the control section 9, FIG. 36 shows a control block diagram schematically showing only its main part. As shown in FIG. 36, the control section 9 is provided with a database part 551 in which a plurality of kinds of insertion-operation programs to be executed in the component insertion apparatus 101 are retained (or stored) so as to be readable as a database, insertion-operation program determining means 552 for selecting and determining one of the insertion-operation programs suitable for the component 1 to be subjected to the insertion operation from among the plurality of kinds of insertion operation programs retained in the database part 551, and a memory part 553 in which information such as characteristic data (e.g., more simply, component identification numbers are allowable) of a plurality of kinds of components 1 to be subjected to the insertion operation is preliminarily inputted and readably stored. The insertion-operation program determining means 552 plays roles of reading information stored in the memory part 553, selecting and reading an insertion-operation program best suited to component 1 subjected to the insertion operation based on the information from the database part 551, and determining this read insertion-operation program as an insertion-operation program for the component 1. Based on the insertion-operation program determined in this way, control over respective constituent parts of the component insertion apparatus 101 including the insertion chuck control section 509 and the pusher control section 522 is exerted integrally by the control section 9, thus making it possible to execute a component insertion operation matching characteristics of the individual components 1. It is noted that the program determining operation by the insertion-operation program determining means 552 may be performed either on basis of each one component 1 or on basis of each change of a kind of the component 1.

(Component Insertion Operation in Component Insertion Apparatus)

Next, description will be given of a method for performing an insertion operation of the component 1 into the circuit board 6 by use of thus-structured component insertion apparatus 101. It is noted that each operation described hereinafter is controlled by the control section 9 provided in the component insertion apparatus 101.

(Operation from Component Feed Section to Component Conveyance Section)

First, description will be given of an operation for feeding the component 1 housed in the component feed section 10 to the component conveyance section 20.

As shown in FIG. 2, the taped component train 5 housed in the component housing section 12 is sent out to the component feeder 13 while being guided along the component feed guide 11. This sent-out taped component train 5 is sent out, with a portion of the taping member 4 being guided along the guide groove 14 of the component feeder 13, to an end portion of a component conveyance section 20 side. By the first cutting blade unit 15 disposed on the end portion, the taped component train 5 is cut and segmented, and this segmented taped component train 5 (i.e., separated component 1) is fed to the chuck 27 provided on the conveyor belt 21 in the component conveyance section 20 so as to be held thereby.

As shown in FIG. 1, the component conveyance section 20 is structured such that the conveyor belt 21 hung by three pulleys 23, 24, 25 is intermittently run and driven counterclockwise in this figure by intermittent driving of the pulley 22 that is intermittently driven by the motor 22. It is noted that intermittent running drive of the conveyor belt 21 is obtained by repeating an operation for running the conveyor belt 21 for an array pitch of each chuck 27 provided on the conveyor belt 21 and then stopping and running the conveyor belt 21 again. More specifically, a distance of one running drive of the conveyor belt 21 is equal to an array pitch of the chuck 27 and an array pitch of the component feeder 13. Therefore, with intermittent running drive of the conveyor belt 21, while each chuck 27 is positioned in front of each component feeder 13 in a section between the pulleys 25 and 23 on the conveyor belt 21, sequential transfer leftward in the X-axis direction viewed in the figure is performed.

As shown in FIG. 2, in the above section, the segmented taped component train 5 fed from the component conveyance section 20 is delivered to each chuck 27, and is held by each chuck 27 in a state that an array direction of a lead wire of the component 1 is approximately orthogonal to a longitudinal direction of the conveyor belt 21. After that, as shown in FIG. 1, each held and segmented taped component train 5 is fed to the holding position corrector 30 disposed below the conveyor belt 21 adjacent to the component feeder 13 on the left side in the X-axis direction in this figure in the above section. As shown in FIG. 4, in the holding position corrector 30, the segmented taping member 4 in a state of being held by the chuck 27 is placed on the placement base 31, and then the taping member 4 is released from the state of being held by the chuck 27 and moved along its longitudinal direction by each pusher 33 so that the lead wires 3 are moved to an appropriate position in the above direction for correction of a holding position, after which the chuck 27 is closed again to hold the lead wires 3. It is noted that this correction operation of the holding position is executed when intermittent running drive of the conveyor belt 21 is stopped.

The segmented taped component train 5 after correction (compensation) of the holding position by the chuck 27 is performed is conveyed again by the conveyor belt 21 to an upper side of the second cutting blade unit 34 disposed adjacent to the holding position corrector 30 on the left side in the X-axis direction as viewed in FIG. 1. As shown in FIG. 5, while being held by the chuck, the lead wires 3 of the component 1 is cut by the second cutting blade unit 34, so that the lead wires 3 are cut into a length suitable for being inserted into the circuit board 6, and the taping member 4 attached to the lower portion of the lead wires 3 is removed together with the lower portion of the lead wires 3 after cutting. This cutting operation of the lead wires 3 by the second cutting blade unit 34 is also executed when intermittent running drive of the conveyor belt 21 is stopped.

After that, in a state in which the lead wires 3 are held by the chuck 27 in FIG. 1, the component 1 is conveyed by intermittent running drive of the conveyor belt 21 through the pulley 23 to a component delivery position for delivery to the component transferer 40 placed between the pulley 23 and the pulley 24.

(Transfer Operation by Component Transferer from Component Conveyance Section to Component Insertion Section)

Next, description will be given of an operation in which the component 1 conveyed by the component conveyance section 20 to the component delivery position is transferred to the component transferer 40 at a component delivery position, and further an operation in which the component 1 is transferred by the component transferer 40 to the component insertion section 60.

Figure 19:
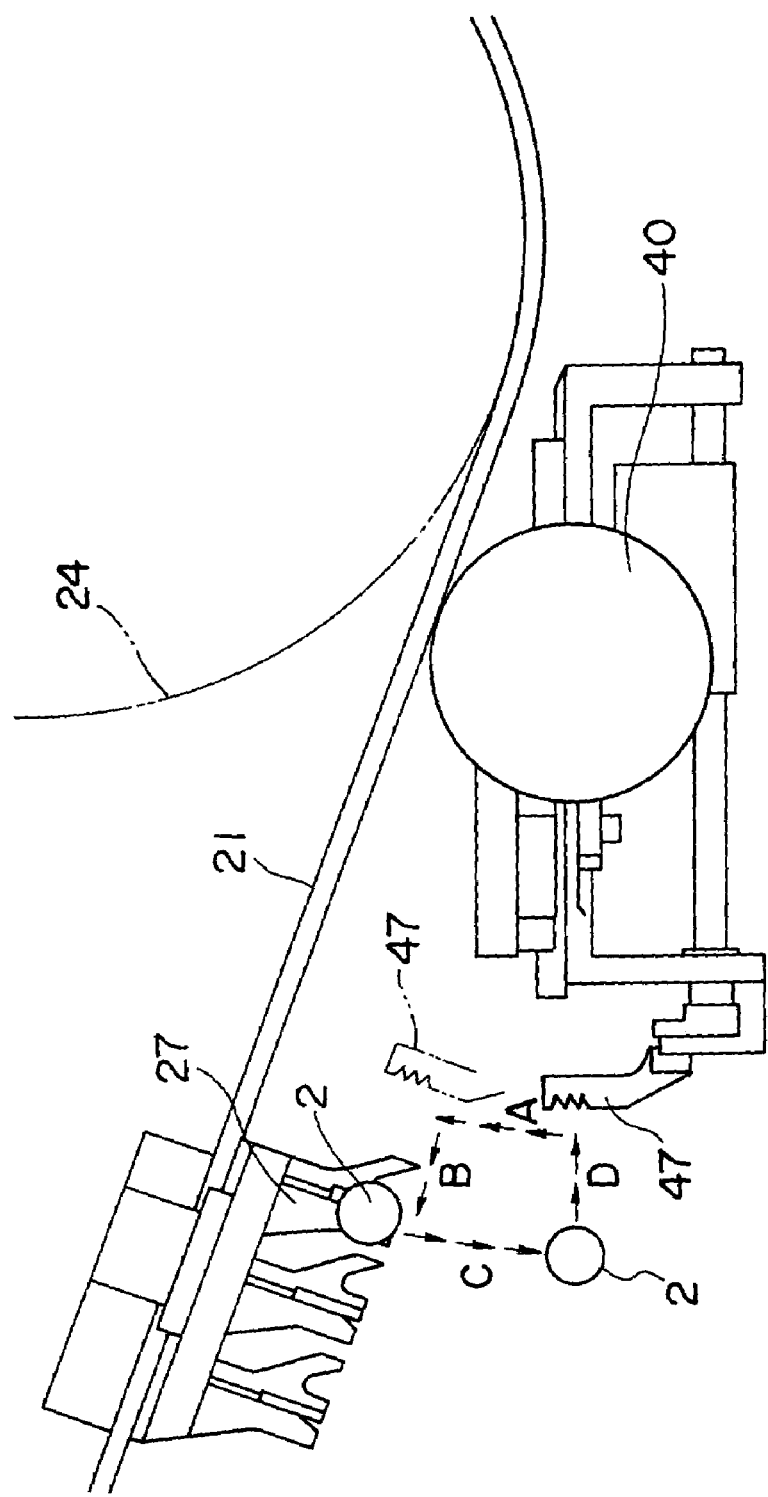
FIG. 19 is an explanatory view of a component transfer operation performed by the component transferee.

First, FIG. 19 shows a schematic explanatory view of an operation performed by the component transferer 40. As shown in FIG. 19, the component 1 held by the chuck 27 is positioned at the component delivery position on the conveyor belt 21. In such a state, first, around an axis 44 in the component transferer 40 shown in FIG. 9, the transfer chuck 47 is rotated in a direction along the surface of the circuit board 6 so as to move the transfer chuck 47 in an arrow A direction shown in FIG. 19. When the grasping claws 41, 42 of the transfer chuck 47 are positioned at a position that faces the component 1 placed at the component delivery position in the direction along the conveyor belt 21, this rotation is stopped. Along with this, axis 45 of FIG. 9 is moved down, so that through the moving lever 48, the transfer chuck 47 is moved in an arrow B direction shown in FIG. 19. This movement engages respective lead wires 3 of the component 1 held by the chuck 27 at the component delivery position with the grasping claw 41 and the support claw 43 of the transfer chuck 47. Also, axis 46 shown in FIG. 10 is moved down, so that through the lever 50, the rotational plate 52, the rotational axis 53, and the slide lever 54, the grasping claw 42 is slid, by which the lead wires 3 of the component 1 are grasped by the grasping claws 41, 42 and the support claw 43. In this state, each longitudinal direction of the grasping claws 41, 42 and the support claw 43 is approximately parallel to an array direction of the lead wires of the component 1. After that, in a state that lead wire 3 is grasped by the transfer chuck 47, around the axis 44, the above rotation of the transfer chuck 47 is performed in an arrow C direction (i.e., an opposite direction of the arrow A direction). This rotation releases holding of the component 1 by the chuck 27, and so the component 1 is moved to the component insertion section 60 in a state that the lead wires 3 are grasped by the transfer chuck 47. It is noted that after the component 1 is transferred to the component insertion section 60 by a later-described operation, the transfer chuck 47 is moved in an arrow D direction shown in FIG. 19 by move-up of the axis 45. It is noted that for transferring a plurality of components 1 in sequence from the component delivery position to the component insertion section 60, a moving operation of the transfer chuck 47 from the arrow A to arrow D direction is repeatedly performed. Also, this grasping operation of the component 1 by the transfer chuck 47 is performed when intermittent running drive of the conveyor belt 21 is stopped.

(Component-Insertion-Posture Correcting Operation in Component Insertion Section)

Next explained is an operation in which the component 1 moved by the component transferer 40 so as to be deliverable to the component insertion section 60 is delivered to the component insertion head 61 at the component insertion section 60.

Figure 20:
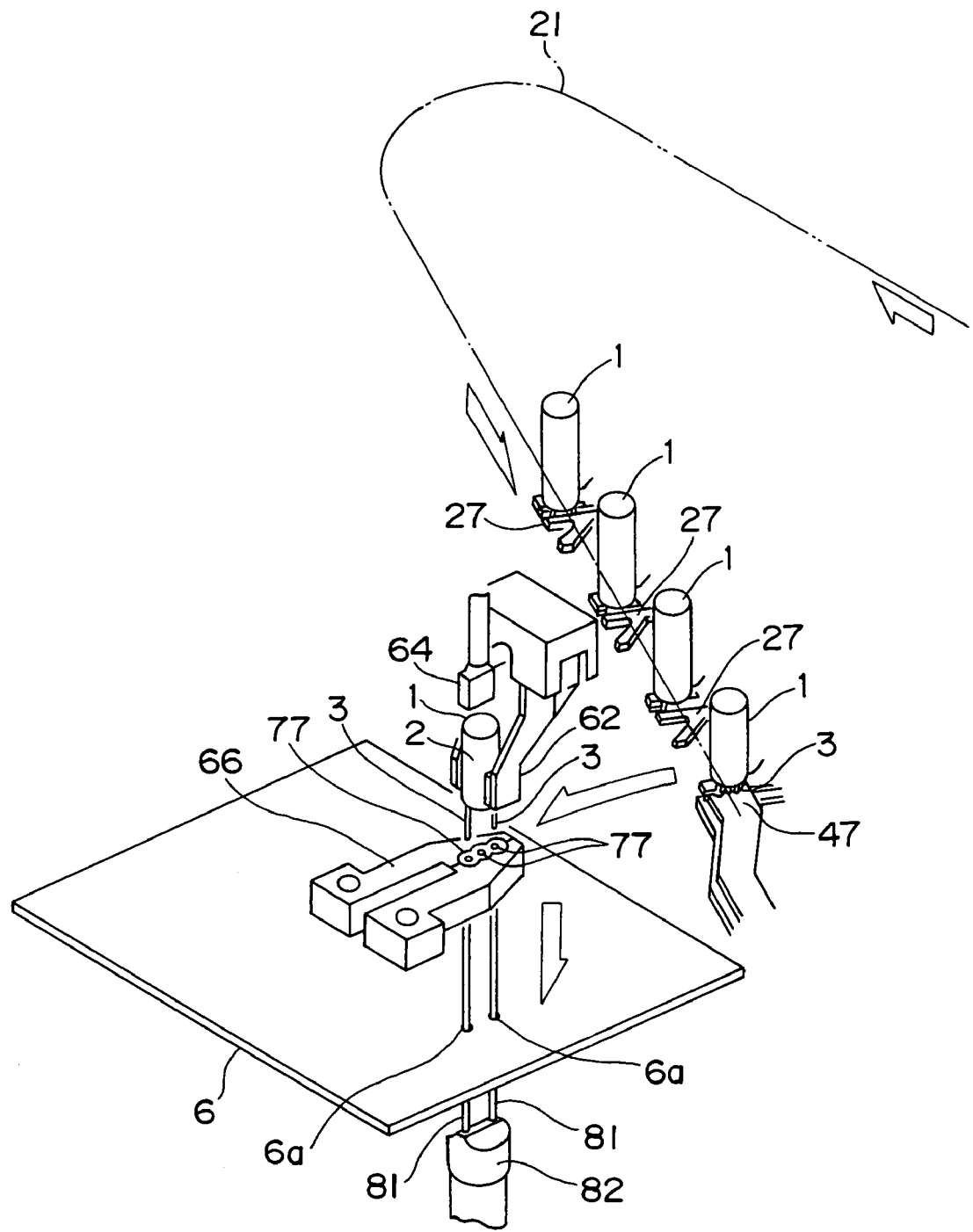
FIG. 20 is an explanatory view of an operation from component transfer to an insertion operation.

FIG. 20 shows a schematic explanatory view of a transfer operation of the component 1 to the component insertion head 61 by the component transferer 40, and a subsequent insertion operation of the component 1 to the circuit board 6. Also, FIG. 21 shows a schematic explanatory view of a delivery operation of the component 1 grasped by the transfer chuck 47 to the insertion chuck 62 of the component insertion head 61.

As shown in FIG. 20, the component 1 having its lead wires 3 grasped by the transfer chuck 47 is moved to the grasping position of the component 1 on the up/down operational axis of the insertion chuck 62 in the component insertion head 61. In the component insertion head 61, as shown in FIG. 21, the insertion chucks 62a and 62b are in an opened state, and this moved component 1 is so positioned that its device portion 2 is interposed between chuck end portions 62c and 62d of these opened insertion chucks 62a and 62b, respectively. In this state, as shown in FIG. 21, an arrangement direction of the lead wires of the component 1 is generally parallel to their corresponding chuck end portions 62c and 62d.

Thereafter, in the insertion chuck mechanism 63 of the component insertion head 61, closing operations of respective insertion chucks 62a and 62b are started, and grasping of the device portion 2 of the component 1 is performed by the chuck end portions 62c, 62d, respectively.

Figure 21:
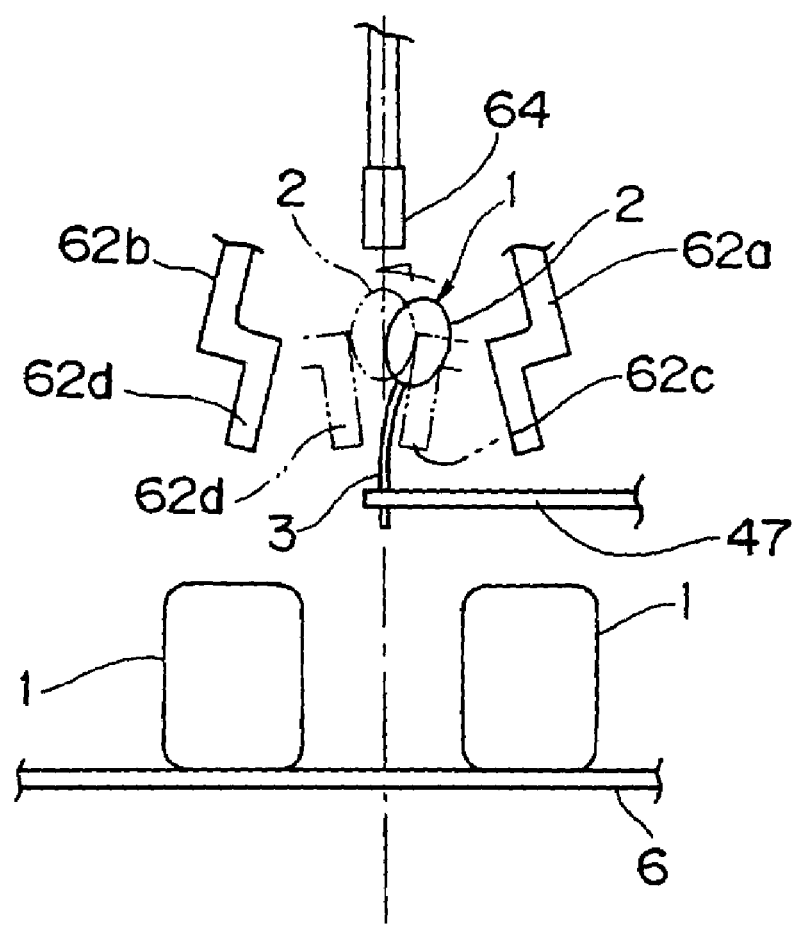
FIG. 21 is an explanatory view of an operation of correcting component insertion posture by the insertion chuck.

In this connection, as shown in FIG. 21, there are some cases where, for example, due to some external force applied to the component 1 during its conveyance process or the like, the lead wires 3 of the component 1 have been bent generally perpendicularly to the array direction of the lead wires with a result that the device portion 2 is inclined along that direction. In particular, the component 1 has a characteristic that the lead wires 3 are less likely to be bent by external force in the array direction of the lead wires because of the two lead wires 3 being arrayed, while the lead wires 3 are more likely to be bent even by a slight external force applied thereto because of no plurality of lead wires 3 being arrayed in a direction perpendicular to the array direction of the lead wires. When a subsequent insertion operation of the component 1 is performed with the device portion 2 inclined as shown above, there are some cases where a move-down operation of the device portion 2 by the pusher 64 may result in a mis-pushing, or an insertion of the component 1 into the circuit board 6 involves interference with another neighboring component 1 that has previously been inserted, thus resulting in an error of an insertion operation of the component 1. In order to prevent occurrence of such problems, an operation of correcting a bend of the lead wires 3, i.e., a correction of an insertion posture of the component 1, is performed during a grasping operation of the device portion 2 by a closing operation of the insertion chucks 62a and 62b by correcting the device portion 2 to a non-inclined position along with the grasping operation as shown in FIG. 21.

More specifically, as shown in FIG. 21, with the lead wires 3 grasped by the transfer chuck 47, the component 1, in which the device portion 2 is inclined rightward as viewed in this figure, is subjected to a closing operation of the insertion chucks 62a and 62b, while the chuck end portion 62c of the insertion chuck 62a positioned on the right side of the figure is first put into contact with this inclined device portion 2. Along with this, a bend of the bent lead wires 3 is corrected on a fulcrum given by a grasping position of the lead wires 3 by the transfer chuck 47, while the device portion 2 is being moved leftward as viewed in the figure by the chuck end portion 62c. The device portion 2 is positioned on an up/down operational axis, and moreover, in this position, the chuck end portion 62d of the insertion chuck 62b under the closing operation on the left side in the figure is also put into contact with the device portion 2, so that the device portion 2 is grasped by the chuck end portions 62c, 62d of respective chucks. As a result, the bend of the bent lead wires 3 is corrected, so that an inclination of the device portion 2 is corrected, by which an insertion posture of the component 1 has been corrected, while the component 1 can also be brought into a state that its device portion 2 is grasped by the insertion chucks 62a and 62b. In addition, although this embodiment has been described for a case where the insertion posture of the component 1 is corrected by a plurality of insertion chucks 62a and 62b, the case may instead be one in which correction of the insertion posture is not performed and the device portion 2 (or lead wire 3) of the component 1 is merely grasped so as to be pinched by the insertion chucks 62a and 62b.

Also, in grasping of the device portion 2 of the component 1 by a plurality of insertion chucks 62a and 62b, as shown in FIG. 25, opening and closing operations of the insertion chucks 62a and 62b, respectively, are performed by control of opening and closing operations of the mechanical valve 501 by the insertion chuck control section 509 in the insertion chuck driving section 71. Also, the above opening and closing operations are performed in a state that pressure of supplied compressed air is selected as either high pressure or low pressure by control of the opening and closing operations of the solenoid valve 505 by the insertion chuck control section 509. That is, a closing operation of the insertion chucks 62a and 62b can be effected with a larger grasping pressure in a case where the high-pressure compressed air is selectively supplied, while a closing operation of the insertion chucks 62a and 62b can be effected with a small grasping pressure in a case where the low-pressure compressed air is selectively supplied. Thus, since a magnitude of grasping pressure for the device portion 2 of the component 1 can be selectively controlled, it has become possible, for example, that components with low rigidity of the device portion 2 (in particular, components with low rigidity of the device portion 2 in its grasping direction) are grasped with smaller grasping pressure, while components having a need for securely and strongly grasping the device portion 2 are grasped with larger grasping pressure; that is, grasping can be achieved under control of the grasping pressure in accordance with characteristics of components 1. It is noted that a grasping pressure for grasping of the components 1 is determined by the insertion chuck control section 509 based on characteristic data of respective components 1 preliminarily inputted in the control section 9 or the like. Detailed description of such relationship between the components 1 and the grasping pressure will be given later.

After grasping of the device portion 2 of the component 1 by the insertion chucks 62a and 62b as shown above, grasping of the lead wires 3 of the component 1 by the transfer chuck 47 is released. This release of the grasping is performed by the grasping claw 42 being slidingly moved by up/down operations of the shaft 46 of the component transferer 40 in FIG. 10. Thereafter, the transfer chuck 47 is moved along a direction of arrow D in FIG. 19 from on the up/down operational axis in the component insertion head 61 by move-up of the shaft 45.

(Component Insertion Operation in Component Insertion Section)

Along with the above-described individual operations, the circuit board 6 into which a plurality of components 1 are to be inserted is fed to the component insertion apparatus 101. Referring to FIG. 1, the circuit board 6 is fed so that both its end portions are conveyably supported by the pair of rails 84a of the board feeding and conveying unit 84, and then the circuit board 6 is conveyed leftward along the X-axis direction in this figure by the board feeding and conveying unit 84 so as to be fed to the slide base 83. The circuit board 6 fed to the slide base 83 is positioned for its fixed position so as to be releasably fixed to the slide base 83. Thereafter, the circuit board 6 is moved in the X-axis direction or the Y-axis direction in the figure by a moving mechanism (not shown) of the slide base 83 in such a manner that a component insertion position at which the component 1 is to be first inserted, out of a plurality of component insertion positions of the circuit board 6 at which components 1 are to be inserted, is aligned with the component insertion head 61 and the component-insertion guide unit 80 with respect to a direction extending along the surface of the circuit board 6. After this positional alignment is performed, movement of the circuit board 6 by the moving mechanism is stopped, and this positionally aligned state is held. In this positionally aligned state, two insertion holes 6a formed at the component insertion position of the circuit board 6 are positioned generally vertically above the two guide pins 81 of the component-insertion guide unit 80, and a generally intermediate position between the two insertion holes 6a of the circuit board 6 is positioned on the up/down operational axis of the component insertion head 61.

In such a state (or, it may be before such a state is reached), first, in the component insertion head 61 of FIG. 14, the guide chucks 66a, 66b in their opened state are moved so as to approach each other until they butt together at a butting surface G, resulting in a state shown FIG. 17. As a result, the guide chucks 66a, 66b come to have respective through holes 77 formed at their respective butting surfaces G. Both through holes 77 positioned at both end portions out of the formed through holes 77 are positioned generally vertically above the guide pins 81, respectively, and moreover positioned generally vertically below (below along the up/down operational axis) the two lead wires 3 of the component 1 having its device portion 2 grasped by the insertion chucks 62a and 62b above the guide chucks 66a, 66b. In this state, first, the guide block 82 in the component-insertion guide unit 80 is moved up, so that their respective guide pins 81 are integrally moved up. These respective moved-up guide pins 81 have their respective tip end portions further moved up, upward of the circuit board 6, while passing through respective insertion holes 6a in the positionally aligned circuit board 6. Thereafter, tip end portions (i.e., recess portions 81a) of the respective guide pins 81 are inserted into the lower-side funnel-shaped holes 77b of the through holes 77 located at both end portions of the butting surface G of the guide chucks 66a, 66b, and the tip end portions of the guide pins 81 are guided by the lower-side funnel-shaped holes 77b, respectively, so that the tip end portions of the guide pins 81 are put into contact with each other in proximities to lower-side entrances of the small-diameter holes 77c, respectively. Thereafter, the move-up operation of the guide block 82 is stopped, so that the move-up operations of the respective guide pins 81 are stopped, with a thus resulting contact state being maintained. FIG. 20 shows this state. In addition, other than such a case, in a case where the small-diameter holes 77c are formed so that their inner diameters are slightly larger than, or generally equal to, diameters of their corresponding guide pins 81, the guide pins 81 are guided by the lower-side funnel-shaped hole 77b, respectively, until their tip end portions are led inward of the small-diameter holes 77c, respectively.

Next, from the state of FIG. 20, with the device portion 2 of the component 1 grasped as it is, move-down of the insertion chucks 62a and 62b is started. By this move-down, the component 1 is lowered along the up/down operational axis, so that the lead wires 3 of the component 1 are inserted into the upper-side funnel-shaped holes 77a of the through holes 77 located at both end portions of the butting surface G of the guide chucks 66a and 66b, respectively, and further the tip end portions of the lead wires 3 are guided by the upper-side funnel-shaped holes 77a, respectively, so as to be led to their corresponding small-diameter holes 77c. In this connection, the small-diameter holes 77c are formed so as to be slightly larger than the diameters of the lead wires 3, respectively. Therefore, the lead wires 3 are passed through the small-diameter holes 77c, respectively, so as to be inserted and engaged into the recess portions 81a of the guide pins 81, respectively, that have been in a contact state in proximities to the lower-side entrances of the small-diameter holes 77c, respectively. Thereafter, the move-down of the insertion chucks 62a and 62b is stopped, with a thus resulting engaged state being maintained.

Along with the move-down of the insertion chucks 62a and 62b, move-down of the pusher 64 is also started. The pusher 64 positioned upward of the device portion 2 of the component 1 grasped by the insertion chucks 62a and 62b is moved down along its up/down operational axis by the slide shaft 74 being moved down. Thereafter, an upper portion of the device portion 2 of the component 1, which is in a state that tip end portions of respective lead wires 3 are engaged with the recess portions 81a of the guide pins 81 within the through holes 77, respectively, is put into contact with an unshown depressed portion formed in a lower end surface of the pusher 64, and then the move-down operation of the slide shaft 74 is stopped and the move-down operation of the pusher 64 is stopped. As a result, the tip end portions of the lead wires 3 and the guide pins 81 and the recess portions 81a of the guide pins 81, respectively, are held in an engaged state so as to be sandwiched by the pusher 64 and the guide pins 81 in the direction along the up/down operational axis.

Thereafter, an opening operation is performed so that the guide chucks 66a, 66b are separated away from each other, by which their mutual butting state is released. Meanwhile, an opening operation is performed so that the insertion chucks 62a and 62b grasping the device portion 2 of the component 1 are also separated away from each other, by which grasping of the device portion 2 by the insertion chucks 62a and 62b is released. FIG. 18 shows this state. In this state, the component 1 is held so as to be sandwiched between the pusher 64 and respective guide pins 81.

Also, for maintaining engagement between the lead wires 3 and the recess portions 81a by move-down and contact of the pusher 64 against an upper portion of the device portion 2 of this component 1 as well as by pressing the component 1 toward the guide pins 81, as shown in FIG. 26, in the pusher up/down moving unit 73, a pressure (pressing force) applying operation for pressing by the pusher 64 is performed by opening and closing operations of the mechanical valve 515 being controlled by the pusher control section 522. Also, by opening and closing operations of the solenoid valve 519 being controlled by the pusher control section 522, the above applying operation is performed with pressure of supplied compressed air selected as either high pressure or low pressure. That is, this press applying operation performed on the device portion 2 by the pusher 64 is performed with a larger pressing force in such a case where high-pressure compressed air is selectively supplied, while the applying operation can be achieved with a smaller pressing force in such a case where low-pressure compressed air is selectively supplied. Since a pressing force in pressing of the device portion 2 of the component 1 can be controlled in terms of magnitude as shown above, it is made possible to perform the press applying operation of the device portion 2 while controlling the pressing force according to characteristics of the component 1, such as holding engagement with a small pressing force in a case of components having a low-rigidity device portion 2 (particularly, components in which the rigidity of the device portion 2 along a pressing direction is low) and holding the component with a large pressing force in a case of components that require securely and strongly holding the device portion 2. In addition, control is exerted by the pusher control section 522 determining the pressing force for pressing the device portion 2 of the component 1 based on characteristic data of individual components 1 preliminarily inputted in the control section 9 or the like. Detailed description of a relationship between such individual components 1 and the pressing force will be described later.

Figure 22:
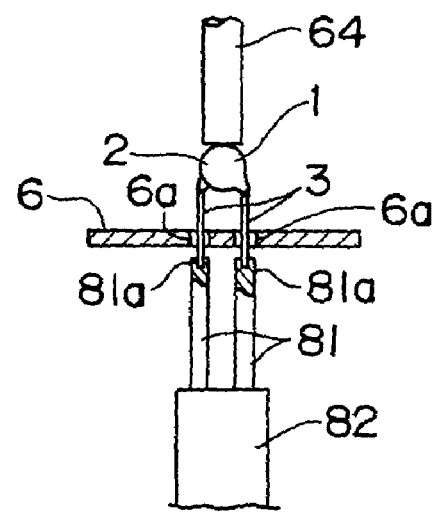
FIG. 22 is an explanatory view of a component insertion operation performed by the guide pin during insertion.
Figure 23:
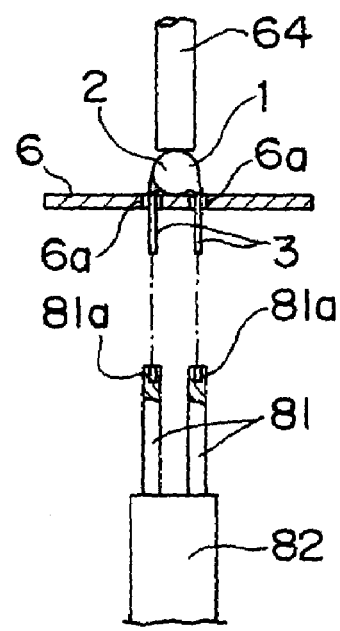
FIG. 23 is an explanatory view of a component insertion operation performed by the guide pin after insertion.
Figure 28:
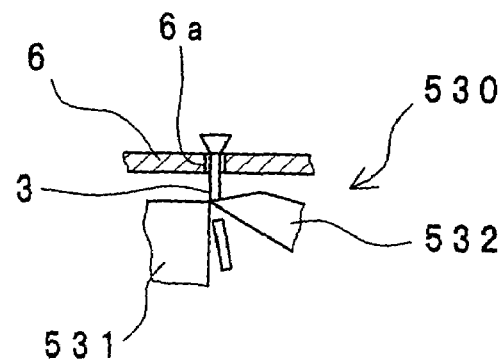
FIG. 28 is a schematic explanatory view showing a cut-and-clinch state of the cut-and-clinch device immediately after the cutting of the lead wire.
Figure 29:
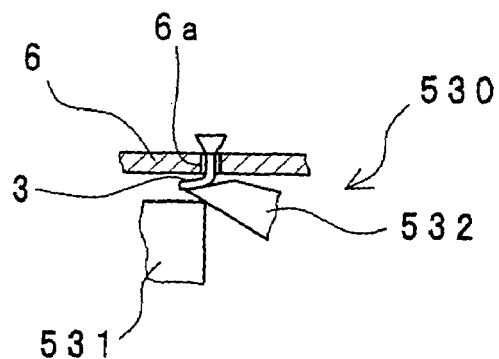
FIG. 29 is a schematic explanatory view showing a cut-and-clinch state of the cut-and-clinch device after the cutting of the lead wire.

Thereafter, while this holding state is maintained, the pusher 64 and the guide block 82 are moved down synchronously at the same speed, by which the lead wires 3 are led so as to pass through the insertion holes 6a, respectively, of the circuit board 6 as shown in FIG. 22. It is noted that this move-down operation of the pusher 64 is performed via the slide shaft 74 and the rod 75 by the one end of the up/down lever 511 of the pusher up/down moving unit 73 being moved downward, and even in this move-down operation, the device portion 2 is kept pressed by the pusher 64, by which engagement between the lead wires 3 and the guide pins 81, respectively, is held. Further, while this holding state is maintained, the pusher 64 and the guide block 82 are moved down at the same speed, by which a lower portion of the device portion 2 of the component 1 is brought into contact with the upper surface of the circuit board 6. Move-down of the pusher 64 is stopped by this contact, and the guide block 82 is further moved down, so that the engagement of the recess portions 81a of the guide pins 81 and tip end portions of the lead wires 3, respectively, is released. FIG. 23 shows this state. As a result, in the component insertion position of the circuit board 6, the lead wires 3 are inserted into the insertion holes 6a, respectively, and thus an insertion operation of the component 1 into the circuit board 6 has been achieved. Thereafter, the lead wires 3 that have been inserted into the insertion holes 6a, respectively, are cut to an appropriate length by the cutting and bending unit 530 in the component-insertion guide unit 80, and moreover the tip end portions of the respective lead wires 3 after this cutting are bent in directions opposite to each other (i.e., outward directions) so that the component 1 is fixed so as not to drop off from the circuit board 6. Now a so-called cut-and-clinch operation by such a cutting and bending unit 530 is explained with reference to schematic explanatory views of FIGS. 27 to 29. First, as shown in FIG. 27, the lead wires 3 that have been inserted into the insertion holes 6a, respectively, of the circuit board 6 are positioned each between the fixed blade 531 and the movable blade 532 in the cutting and bending unit 530. Thereafter, as shown in FIG. 28, the movable blade 532 is moved so as to approach the fixed blade 531, and the lead wires 3 are cut to the appropriate length. Further, after that, as shown in FIG. 29, the movable blade 532 is moved up so that the tip end portions of the respective lead wires 3 are pushed up by the movable blade 532, by which the respective lead wires 3 are bent and fixed to the circuit board 6. It is noted that during a process in which such a cut-and-clinch operation is performed, the device portion 2 of the component 1 is kept pressed into pressure contact against the top surface of the circuit board 6 by the pusher 64. By doing so, it is enabled to counter a force applied during the cut-and-clinch operation and derived from the movable blade 532, thereby allowing the cut-and-clinch operation to be performed with the component 1 held reliably.

The pressing force in the holding of the device portion 2 by such pressing of the pusher 64 can be controlled by selectively controlling a desired pressure by opening and closing operations of the solenoid valve 519. For example, for holding a component having a low-rigidity device portion 2, performing a closing operation of the solenoid valve 519 allows the pusher 64 to do the pressing by using low-pressure compressed air without causing plastic deformation of the device portion 2. Meanwhile, for example, for holding a component having high-rigidity lead wires 3 so that a larger force is applied to the component during the cutting and clinching, performing an opening operation of the solenoid valve 519 allows the device portion 2 to be held reliably with a larger pressing force by the pusher 64 by using high-pressure compressed air.

After the cut-and-clinch operation is performed, the slide shaft 74 is moved up, by which the pusher 64 is moved up from an upper end position of the device portion 2, and stopped at an original up position while the move-down operation of the guide block 82 is also stopped.

In a case where a plurality of components 1 are to be inserted to the circuit board 6, respective operations described above are performed continuously and iteratively so that insertion operations of respective components 1 into the circuit board 6 are achieved.

After the insertion operations of the respective components 1 into the circuit board 6 are performed, fixation of the circuit board 6 is released in the slide base 83, and the circuit board 6 is taken out from the board discharging and conveying unit 85 located adjacent thereto. This taken-out circuit board 6 is conveyed leftward in the X-axis direction as viewed in FIG. 1 with both its portions supported by the pair of rails 85a so as to be discharged from the component insertion apparatus 101.

(Control of Grasping Pressure or Pressing Force Based on Component Classification)

Next described is a relationship among types of individual components 1, which are to be inserted into the circuit board 6, a grasping pressure on the components 1 by individual insertion chucks 62a and 62b during an insertion operation, or a pressure of pressing (pressing force) on component 1 by the pusher 64 in the above-described component insertion apparatus 101 by taking a concrete example.

The individual components 1 to be inserted into the circuit board 6 come in various types, such as components having a low-rigidity device portion 2 and components having high-rigidity lead wires 3. Among such various types of components 1, components in which those rigidities have standard strengths such as lead-extended type components or pre-set volume type components are taken as standard components (an example of a first component), and components are classified into a plurality of component categories in the following description of several types of components having characteristics as to rigidity and the like relative to those standard components.

First, a component 1 belonging to a component category A is a component 1 (an example of a second component) having a characteristic that a formation thickness of a shell membrane of the device portion 2 of the component 1 is formed thinner than that of the standard components so that the device portion 2 is low in terms of rigidity (rigidity in a grasping direction is low or rigidity in a pressing direction is low). Such a component 1 is formed with a thin formation thickness of its shell membrane so as to have a necessary minimum rigidity, for example, for a purpose of reduction of a manufacturing cost of the component 1 and the like. The component 1 is exemplified by an electrolytic capacitor, oscillator, vibrator, related component and the like. As an example, whereas an electrolytic capacitor or the like as a standard component has a formation thickness of, e.g., 0.25 mm of its shell membrane, an electrolytic capacitor which is an example of the component 1 belonging to component category A is so formed as to have a thin formation thickness of, e.g., about 0.2 mm of its shell membrane.

Next, a component 1 belonging to a component category B is a component 1 (an example of the first component) having a characteristic that a weight of its device portion 2 is large. Such a component 1 is so formed that its device portion 2 has a relatively high rigidity according to a size of the device portion 2. This component 1 is exemplified by a large-sized electrolytic capacitor, shielded coil, related component, and the like.

Also, a component 1 belonging to a component category C is a component 1 (an example of a third component) having a characteristic that rigidity of the lead wires 3 of the component 1 is higher than that of the standard components. Such components 1 are of those types that have been less treated in conventional component mounting, but which have come to be increasingly treated due to diversification or multi-functionalization of component mounted boards. This component 1 is exemplified by a connector type component and the like. As an example, whereas the lead wires 3 in the standard components are formed with a diameter of about 0.45 mm (a formation material is a so-called C/P wire, i.e. iron-core nickel-coated solder plated wire, for example), the lead wires 3 of a component 1 belonging to component category C are formed with a thick diameter of about 0.8 mm (a formation material is iron wire, for example). It is noted that these are only one example, and there are various modes of a combination of wire diameter of the lead wires 3 and their formation material.

Further, a component 1 belonging to a component category D is a component 1 having a characteristic that rigidity of the lead wires 3 of the component 1 is lower than that of the standard components. Such a component 1 is, for example, a component in which its device portion 2 is formed smaller and the lead wires 3 are formed longer than that of the standard components, with this component being exemplified by an axial type component, floating type component and the like. As an example, whereas the lead wires 3 in the standard components are formed with a diameter of about 0.45 mm, the lead wires 3 of a component 1 belonging to component category D are formed with a thin diameter of about 0.3 mm (a formation material is annealed copper wire, for example).

FIG. 30 shows a schematic explanatory view in the form of a table showing a relationship of components 1 belonging to the above-shown individual component categories A-D with a grasping pressure by an insertion chuck 62. FIG. 31 shows a schematic explanatory view in the form of a table showing a relationship with a pressing force during press-down by the pusher 64. Further, FIG. 32 shows a schematic explanatory view in the form of a table showing a relationship with a pressing force by the pusher 64 during a cut-and-clinch operation. Furthermore, FIGS. 33 to 35 show schematic explanatory views in the form of a table showing relative relationships of a grasping pressure and respective pressing forces between the components 1 belonging to respective component categories A-D and the standard components.

As shown in FIG. 30, with regard to the component 1 belonging to component category A, since its device portion 2 is formed thin in terms of shell membrane formation thickness as compared with the standard components, the device portion 2 is low in terms of rigidity (particularly, low in terms of rigidity in the grasping direction), so that there are some cases where, for example, if grasping is performed with a strong grasping pressure by the respective insertion chucks 62a and 62b, the shell membrane cannot withstand the strong grasping pressure, thereby causing the device portion 2 to be plastically deformed. In such a case, there may occur grasping failures, which may cause a difficulty in smoothly releasing grasping of the component 1 or cause mis-insertions of the component 1 due to an unexpected posture of the grasping or, what is more, cause damage to the component 1 itself. In order to prevent occurrence of such problems, performing the grasping with a weakened grasping pressure allows the grasping to be fulfilled in a successful state without causing any plastic deformation of the device portion 2 due to the grasping. It is noted that a strength or weakness of the grasping pressure can be managed actually by selecting high pressure or low pressure for the compressed air supplied to the cylinder portion 70 of the insertion chuck driving section 71 in FIG. 25.

Also, as shown in FIG. 30, with regard to the component 1 belonging to component category B, since the formation size of its device portion 2 is large and the weight of the device portion 2 is heavy as compared with the standard components, it can occur that, for example, if the grasping is performed with a weak grasping pressure by the respective insertion chucks 62a and 62b, the grasping of the device portion 2 can become unstable, in which case a posture of the grasping may be positionally shifted, giving rise to grasping failures or insertion failures of the component 1. In order to prevent occurrence of such problems, performing the grasping securely with a strengthened grasping pressure allows the grasping posture to be stabilized so that the grasping can be performed in a successful state.

Also, as shown in FIG. 30, with regard to a component 1 belonging to component category C, indeed its lead wires 3 are formed high in terms of rigidity, but if, for example, the device portion 2 is formed low in terms of rigidity as in the component 1 belonging to component category A, then performing the grasping with a strong grasping pressure can cause the device portion 2 to be plastically deformed. Therefore, performing the grasping with a weakened grasping pressure allows occurrence of such a problem to be prevented.

Further, as shown in FIG. 30, with regard to the component 1 belonging to component category D, since its device portion 2 is formed small and the lead wires 3 are formed long as compared with the standard components, not the device portion 2 but the lead wires 3 are often grasped during grasping by the insertion chucks 62a and 62b. As an example, in a case where the lead wires 3 that are formed thin as compared with the device portion 2 like this are grasped, a weakened grasping pressure may cause sliding to occur so that a grasping posture of grasped component 1 may become unstable, giving rise to grasping failures or insertion failures. In order to prevent occurrence of such a problem, grasping the lead wires 3 with a stronger force by strengthening the grasping pressure allows occurrence of such sliding or the like to be prevented so that grasping can be performed in a successful state.

Next, as shown in FIG. 31, in a case where the device portion 2 of the component 1 is pressed by the pusher 64 so that the component 1 is pressed down to hold engagement between the guide pins 81 and the lead wires 3, although the component 1 belonging to component category A is grasped at its device portion 2 by the insertion chucks 62a and 62b at a time point during a press-down operation, this grasping is performed with a weak grasping pressure as described above. Therefore, if pressing is performed with a strong pressing force by the pusher 64, it can occur that this pressing force surpasses the grasping pressure by the insertion chucks 62a and 62b, in which case there may occur a slide of grasped component 1, giving rise to grasping failures. In order to prevent occurrence of such a problem, weakening the pressing force in accordance with the grasping pressure allows the pressing of the component 1 to be securely achieved. It is noted that the strength or weakness of the pressing force can be managed actually by selecting high pressure or low pressure for the compressed air supplied to the hollow portion of the slide shaft 74 of the pusher up/down moving unit 73 in FIG. 26.

Also, as shown in FIG. 31, with regard to a component 1 belonging to component category B, since its device portion 2 is formed large in formation size and heavy in weight, there are some cases where, for example, if engagement between the lead wires 3 of the component 1 and the guide pins 81 is maintained with a weak pressing force by the pusher 64, a holding posture of the component 1 may become unstable, giving rise to holding failures. In order to prevent occurrence of such a problem, performing pressing with a strengthened pressing force allows the engagement between the lead wires 3 and the guide pins 81 to be strengthened so that a secure holding can be achieved.

Further, as shown in FIG. 31, with regard to components 1 belonging to component category C and components 1 belonging to component category D, in a case where the grasping by the insertion chucks 62a and 62b is performed with a weak grasping pressure, if pressing is performed by the pusher 64 with the pressing force strong as in the case of the component 1 belonging to component category A, there can occur a slide of the grasping at a time of starting the pressing, which may lead to occurrence of grasping failures. Thus, weakening the pressing force in accordance with the grasping pressure allows the pressing of the component 1 to be securely achieved.

Also, as shown in FIG. 32, with regard to a component 1 belonging to component category C, in a case where the component 1 is subjected to a cut-and-clinch operation while being held by pressing the device portion 2 against the top surface of the circuit board 6 by the pusher 64, since its lead wires 3 are formed high in rigidity, such cut-and-clinch is performed with a stronger force applied, compared with a case where similar processing is performed on the standard components for example. Therefore, in a case where, for example, the pressing is done with a weak pressing force by the pusher 64, sufficient holding of the component 1 by the pusher 64 cannot be achieved, thereby causing a possibility that floating of the component 1 from the surface of the circuit board 6 or the like may occur during the cut-and-clinch, in which case bending of the lead wires 3 may become insufficient so that there may be occur a fixation failure of the component 1 to the circuit board 6. In order to prevent occurrence of such a problem, during the cut-and-clinch, strengthening the pressing force on the component 1 by the pusher 64 allows the component 1 to be held securely without yielding to an applied force so that the component 1 can securely be fixed.

Also, as shown in FIG. 32, with regard to a component 1 belonging to component category A, component category B or component category D, because of a low rigidity of the device portion 2 (particularly a low rigidity in the pressing direction) or a low rigidity of the lead wires 3, if pressing on the component 1 by the pusher 64 for holding of the component 1 during a cut-and-clinch is performed with a strong pressing force, it may occur that the device portion 2 is plastically deformed or that there occur buckling of the lead wires 3. Therefore, performing the pressing with a weak pressing force allows fixation of the component 1 to the circuit board 6 to be securely achieved.

Further, if the grasping pressure, the pressing force during press-down and the pressing force during cut-and-clinch relative to the standard components are assumed each as 100%, then an example of relative values (%) of the strength or weakness of the grasping pressure as well as the strength or weakness of the pressing force according to the component categories is as shown in FIGS. 33 to 35.

For the component 1 belonging to component category A having a characteristic that rigidity of the device portion 2 is weak, it is preferable to regulate or select a pressure of the compressed air so that the grasping pressure becomes 80%, the pressing force during the press-down becomes 80% and further the pressing force during the cut-and-clinch becomes 80%.

Also, for the component 1 belonging to component category B having a characteristic that the device portion 2 is large in formation size and heavy in weight, it is preferable to regulate or select a pressure of the compressed air so that the grasping pressure becomes 120%, the pressing force during the press-down becomes 120% and further the pressing force during the cut-and-clinch becomes 100%.

Also, for the component 1 belonging to component category C having a characteristic that the rigidity of the lead wires 3 is high, it is preferable to regulate or select a pressure of the compressed air so that the grasping pressure becomes 100%, the pressing force during the press-down becomes 100% and further the pressing force during the cut-and-clinch becomes 120%.

Also, for the component 1 belonging to component category D and having a characteristic that the device portion 2 is formed small in size with its rigidity lowered, it is preferable to regulate or select a pressure of the compressed air so that the grasping pressure becomes 100%, the pressing force during the press-down becomes 100% and further the pressing force during the cut-and-clinch becomes 80%.

This embodiment has been explained for an example of a mechanism that selectively supplies either high-pressure compressed air or low-pressure compressed air in each of the insertion chuck mechanism 63 and the pusher mechanism 65, as shown in the schematic explanatory views of FIGS. 25 and 26. However, it is apparent that providing a regulator or solenoid valve for medium pressure in addition to the above-shown mechanism makes it possible to constitute a mechanism that can selectively supply compressed air of any one pressure selected from among compressed airs of three levels of pressure. Further, with such a constitution, it is enabled to selectively supply compressed air of relative pressures of 80%, 100% and 120%. Furthermore, it is also allowable that the relative pressure of 100% is set for high-pressure side while 80% is set for low-pressure side, or that 100% is set for the low-pressure side while 120% is set for the high-pressure side.

It is noted that these relative values of the pressure, 120%, 100% and 80%, are only an example and not limiting. Further, if these 120%, 100% and 80% are assumed as strong/medium/weak for a grasping pressure, then a concrete example of a load applied to the component 1 by the insertion chuck 62 can be set as 0.15 N (strong)/0.1 N (medium)/0.07 N (weak), in which case a supply pressure of the compressed air can be set as 0.4 Pa (strong, i.e. high-pressure)/0.3 Pa (medium, i.e. medium-pressure)/0.2 Pa (weak, i.e. low-pressure). Also, if those 120%, 100% and 80% for the pressing force by the pusher 64 are assumed as strong/medium/weak, then a concrete example of a load applied to the component 1 by the pressing force can be set as 0.1 N (strong)/0.07 N (medium)/0.04 N (weak), in which case the supply pressure of the compressed air can be set as 0.4 Pa (strong, i.e. high-pressure)/0.25 Pa (medium, i.e. medium-pressure)/0.15 Pa (weak, i.e. low-pressure). These values, which are to be set according to the type of components treated in the component insertion apparatus 101, needless to say, may be set in combinations of various values.

(Relationship Among Component Insertion Operation, Grasping Pressure and Pressing Force)

Next, FIGS. 6 (A) and 6 (B) show a timing chart of change states of a grasping pressure of the insertion chucks 62a and 62b and a pressing force of the pusher 64 during an insertion operation of the component 1 into the circuit board 6. It is noted that the component 1 to be described in this timing chart is, for example, a standard component described above. However, this timing chart is only one example and, needless to say, not limited to such a case and may be given in various forms.

Figure 6A:
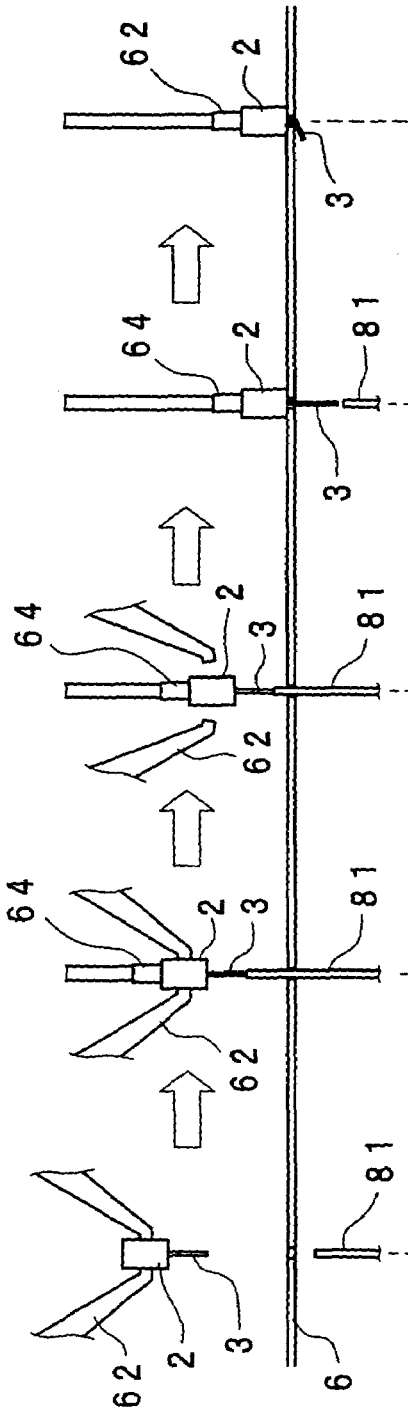
Figure 6B:
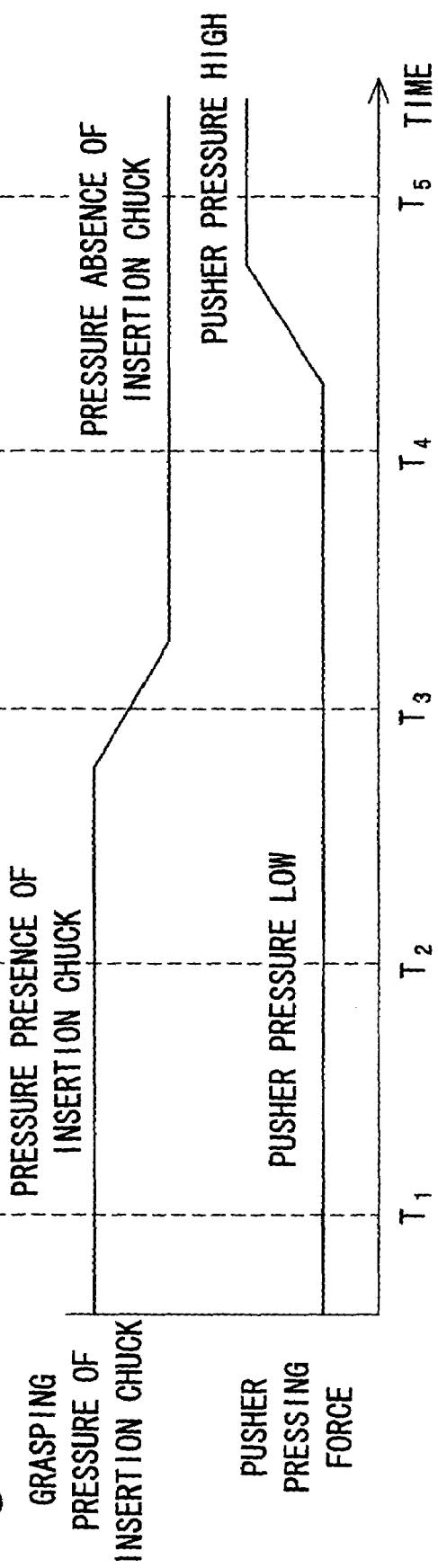

FIGS. 6A and 6B show a relationship among states of respective insertion operations at respective time points T1 to T5, the grasping pressure and the pressing force, where a time base is taken along the horizontal axis. In particular, FIG. 6A is a schematic explanatory view showing respective insertion operation states, and FIG. 6B shows a timing of change of states of presence or absence of the grasping pressure as well as change of states of high-pressure/low-pressure (i.e. strong/weak) of the pressing force.

As shown in FIGS. 6A and 6B, at time T1 is shown a state in which the component 1 fed to the component insertion head 61 is grasped by the insertion chuck 62. Thereafter, at time T2, the insertion chuck 62 is moved down while the device portion 2 of the component 1 is pressed by the pusher 64 so as to be pushed down, by which engagement between the lead wires 3 and the guide pins 81 is maintained. In such a state, the grasping pressure is present and the pressing force is at low pressure.

Further thereafter, at time T3, grasping of the component 1 by the insertion chuck 62 is released, so that the grasping pressure changes to a non-applied state. Meanwhile, engagement between the lead wires 3 and the guide pins 81 by pressing on the device portion 2 by the pusher 64 is maintained, and move-down for insertion of the component 1 is performed with the pressing force maintained at low pressure. Subsequently, at time T4, the lead wires 3 of the component 1 are inserted into the circuit board 6 by the move-down, so that a lower portion of the device portion 2 is brought into contact with a top face of the circuit board 6. In this state, the state of non-applied grasping pressure as well as a state of low-pressure pressing force remain unchanged.

After that, at time T5, a cut-and-clinch is performed on the lead wires 3 of the component 1, wherein this operation is performed with the pressing force changed to high pressure so that the device portion 2 of the component 1 is pressed against the circuit board 6 by the pusher 64 so as to be securely held.

(Modification of Pusher Mechanism)

A modification of the component insertion apparatus 101 according to the present invention is, for example, a component insertion apparatus equipped with a component insertion head having a pusher mechanism 65 which is so constructed that, in the pusher mechanism 65 shown in FIG. 26, for pressing of the device portion 2 of the component 1 by the pusher 64, the pusher 64 is preparatorily placed to a position above and near the device portion 2 of the component 1, the pusher 64 is moved down slightly from this position, by which pressing can be achieved.

In such a component insertion head, with the pusher 64 preparatorily placed to an up/down height position near the device portion 2, and by moving down the pusher 64 from the up/down height position, a shock that occurs upon contact of the pusher 64 with the upper portion of the device portion 2 due to the move-down can be relieved so that the component 1 can be maintained in terms of quality.

Such a constitution can be fulfilled, for example, by an arrangement in which the pusher mechanism 65 shown in FIG. 26 is equipped with a sensor capable of detecting the up/down position of the slide shaft 74 (e.g., a sensor capable of detecting a rotation driving amount of the up/down cam portion 513, or the like) and a mechanism capable of driving the up/down cam portion 513 by a desired rotation driving amount according to the sensor.

Further, from the above description about this embodiment, the "second component" can be said to be a component which is equipped with a device portion lower in rigidity than the device portion of the "first component" and which has such a rigidity that, for example, given a grasping pressure P of the device portion of the first component, the grasping pressure of the device portion of the second component has to be not more than about $0.8 \times P$ in order to prevent occurrence of plastic deformation of the device portion due to the grasping.

(Transfer Operation of Component by Component Conveyor)

Next, several characteristic operations of the component insertion apparatus 101 having such constitution and operation as shown above are described in more detail in comparison with operations of conventional component insertion apparatuses.

First, a transfer operation of the component 1 from the component conveyance section 20 to the component insertion section 60 by the component transferer 40 is explained. FIG. 38 shows a schematic explanatory view schematically showing a transfer operation of the component 1 by a transfer chuck 247 in a conventional component insertion apparatus. FIG. 39 shows a schematic explanatory view of a transfer operation of the component 1 by the transfer chuck 47 in the component insertion apparatus in the above embodiment. Further, FIG. 40A shows a timing chart of individual operations of the transfer chuck in the conventional transfer operation, and FIG. 40B shows a timing chart of the operation in this embodiment. It is noted that FIGS. 40A and 40B show relationships of individual timings among the individual operations of the transfer chuck 247 and the transfer chuck 47, i.e., with respect to items of transfer chuck opening-andclosing operation, rotating operation and back-and-forth moving operation with a time base represented by the horizontal axis. It is also noted that a time base in each of FIGS. 40A and 40B is given by the same time base for an easy comparison therebetween. For these operations, description is made of a case in which the component 1 is a radial component.

As shown in FIG. 38, the conventional component insertion apparatus performs an operation of delivering the component 1, which is a radial component and whose lead wires 3 are grasped by the transfer chuck 247, to an insertion chuck 262 of a component insertion head (not shown) at a place above a component insertion position of circuit board 6. This operation in the prior art is explained below with reference to FIG. 38 and FIG. 40A.

Referring first to FIG. 38, a closing operation of respective claws of the transfer chuck 247 (i.e., transfer chuck closing operation) is performed, by which the lead wires 3 of the component 1 positioned at a component delivery position of a component conveyance section 220 are grasped by the transfer chuck 247 (corresponding to time interval T0-T1 in FIG. 40A). Thereafter, with the component 1 kept grasped, the transfer chuck 247 is rotated in a direction of arrow G (time interval T1-T2). When the transfer chuck 247 is positioned rightward of the insertion chuck 262 in FIG. 38 in the figure as a result of this rotation, the rotation is stopped (time T2). Thereafter, a forward movement of the transfer chuck 247 is performed in a direction of arrow H so that the transfer chuck 247 approaches the insertion chuck 262; that is, goes away from a center of rotation for a rotation of the transfer chuck 247 (time interval T2-T4). Subsequent to this forward movement, a delivery operation of the component 1 to the insertion chuck 262 is performed (time interval T4-T5), and subsequent to this delivery operation, an opening operation of respective claws of the transfer chuck 247 (i.e., transfer chuck opening operation) is performed so that grasping of the lead wires 3 of the component 1 is released (time interval T5-T6). Thereafter, the transfer chuck 247 is moved back in a direction of arrow I (time interval T6-T7). In this case, since the component 1 has been delivered to the insertion chuck 262, the transfer chuck 247 alone is moved back. When this backward movement is stopped, the transfer chuck 247 is rotated in a direction of arrow E so that the transfer chuck 247 is moved to a position opposed to the component delivery position (time interval T7-T9). Thereafter, the transfer chuck 247 is moved forward in a direction of arrow F, where a grasping of a next component 1 positioned at the component delivery position is performed (time interval T9-T10). After this, respective operations as described above are iterated in succession, by which a transfer operation for a plurality of components 1 is performed.

Next, a transfer operation of the component 1 from the component conveyance section 20 to the body chuck 62 (or insertion chuck 62, hereinafter) of the component insertion head 61 by the transfer chuck 47 in the component insertion apparatus 101 of this embodiment is explained with reference to FIGS. 39 and 40B.

Referring first to FIG. 39, a closing operation of respective claws of the transfer chuck 47 (i.e., transfer chuck closing operation) is performed, by which the lead wires 3 of the component 1 positioned at a component delivery position of a component conveyance section 20 are grasped by the transfer chuck 47 (corresponding to time interval T0-T1 in FIG. 40B). Thereafter, with the component 1 kept grasped, the transfer chuck 247 is rotated in a direction of arrow C (time interval T1-T2). By this rotation, the component 1 grasped by the transfer chuck 47 is positioned at a grasping position of the body chuck 62, where the rotation is stopped (time T2). Thereafter, a grasping of the component 1 by the body chuck 62 is performed, and a delivery operation of the component 1 from the transfer chuck 47 to the body chuck 62 is performed (time interval T2-T3). Subsequent to this delivery operation, an opening operation of the respective claws of the transfer chuck 47 (i.e., transfer chuck opening operation) is performed, by which the grasping of the lead wires 3 of the component 1 is released (time interval T3-T4). Thereafter, the transfer chuck 47 is moved back in a direction of arrow D (time interval T4-T6). In this case, since the component 1 has been delivered to and grasped by the body chuck 62, the transfer chuck 47 alone is moved back. When this backward movement is stopped, the transfer chuck 47 is rotated in a direction of arrow A so that the transfer chuck 47 is moved to a position opposed to the component delivery position (time interval T6-T8). Thereafter, the transfer chuck 47 is moved forward in a direction of arrow B, where a grasping of a next component 1 positioned at the component delivery position is performed (time interval T8-T9). After this, respective operations as described above are iterated in succession, by which a transfer operation for a plurality of components 1 is performed.

In comparison between the transfer operation of the component 1 by the conventional transfer chuck 247 and the transfer operation of the component 1 by the transfer chuck 47 of this embodiment, the conventional operation involves a rotational operation of the transfer chuck 247 in the direction of arrow G and its forward-move operation in the direction of arrow H during a course from the component delivery position to the insertion chuck 262, thus requiring a time duration from time T0 to T5 from a start of grasping of the component 1 to its delivery. In the operation of this embodiment, on the other hand, it is only required to rotate the transfer chuck 47 in the direction of arrow C from the component delivery position to the grasping position of the body chuck 62, thus taking no more than a time duration from T0 to T3 during a course from a start of grasping of the component 1 to its delivery. That is, the component delivery position and the grasping position by the body chuck 62 are placed respectively on a circular arc formed by rotation of the transfer chuck 47, thus making it possible to perform a transfer movement of the component 1 only by rotation in the direction of arrow C. Therefore, according to the transfer operation of the component 1 of this embodiment, time required for the transfer operation can be reduced, and this time reduction makes it possible to also reduce time required for an insertion operation of the component 1 in the component insertion apparatus 101. Thus, an efficient, high-productivity component insertion operation can be performed.

(Polarity Inverting Operation of Component)

Next, a polarity inverting operation of the component 1, which is a radial component, is explained.

The component 1, which is a radial component, has, for example, two lead wires 3 which are to be inserted and connected to the circuit board 6. However, in some cases among such components 1, the two lead wires 3 have their respective polarities. Examples of such components having polarities are capacitors, tantalum capacitors, diodes, light emitting diodes, and the like. For such components 1, there are some cases where component 1 has a directionality for insertion, for example, whichever one of the two lead wires 3 should be inserted into a positive insertion hole 6a while the other should be inserted into a negative insertion hole 6a. In such a case, it is necessary that the lead wires 3 be inserted at their respective component mounting positions in the circuit board 6 with the polarities taken into consideration. However, in a case of a component 1 having two lead wires 3 like this, after the component 1 is grasped by the body chuck 62 regardless of its polarity, the component insertion head 61 itself can be rotated with its up/down operational axis taken as a center of rotation so that the polarity of the component 1 is put into a proper state.

However, there are some cases where the component 1 has three terminals formed equidistantly in an array direction of lead wires of device portion 2 of the component 1, and where respective lead wires 3 are formed at central terminal and either one of both-end terminals out of the three terminals (i.e., two lead wires 3). In case where such a component 1 is grasped by the body chuck 62 and thereafter the component insertion head 61 is rotated for polarity adjustment as described above, some positional shift of the lead wires 3 may occur due to rotation for a reason that the lead wires 3 are not disposed symmetrically with respect to a center of the component 1.

Figure 41:
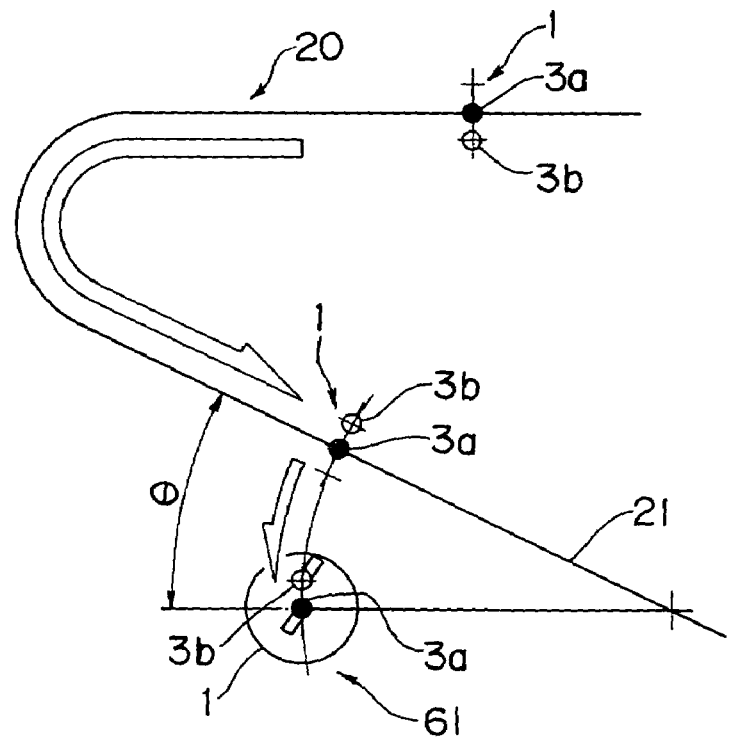
FIG. 41 is an explanatory view of a component polarity inverting operation without an inverting operation of a component.

As an example, FIG. 41 shows a schematic explanatory view schematically showing an operation of setting such a component 1 (i.e., component 1 in which the lead wires 3 are formed only at the central terminal and the one of both-end terminals) into an insertable state at the component insertion head 61 by performing polarity adjustment on the component 1. In FIG. 41, a lead wire 3 formed at the central terminal of the component 1 is referred to as center-side lead wire 3a (marked by a black circle in the figure), and a lead wire 3 formed at the end-portion terminal is referred to as terminal-side lead wire 3b (marked by a white circle in the figure).

The component 1 that has been delivered from the component feed section 10 and held at the component conveyance section 20, with the center-side lead wire 3a directed upward of the terminal-side lead wire 3b as viewed in FIG. 41, is transferred to a component delivery position. At the component delivery position, the component 1 is held with the center-side lead wire 3a directed generally downward of the terminal-side lead wire 3b as viewed in FIG. 41, where in a transfer operation of the component 1 to the component insertion head 61 is performed by a rotational operation, for example, angle-θ rotational operation of the transfer chuck 47. In the component insertion head 61, the terminal-side lead wire 3b is directed upward of the center-side lead wire 3a, as viewed in FIG. 41, in which state an insertion operation of the component 1 is performed. It is noted that FIG. 41 shows an example of a case where insertion is performed with a proper polarity state without performing an inversion operation of the component 1 (i.e., inversion operation of the component 1 by the component insertion head 61).

Figure 42:
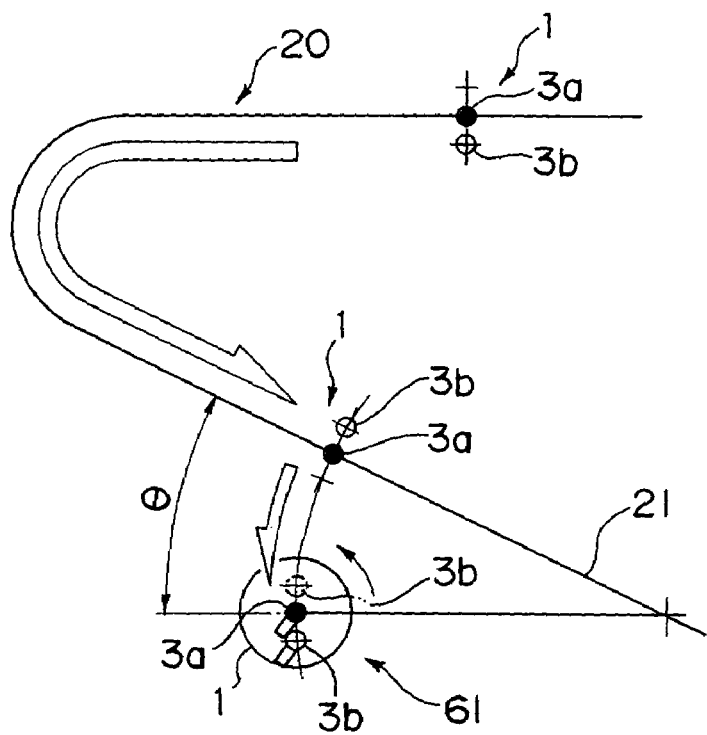
FIG. 42 is an explanatory view of component polarity inverting operation with an inverting operation of a component.

Next, FIG. 42 shows an example of a case where an inversion operation of the component 1 is necessary for proper setting of the polarity. It is noted that operations up to a transfer operation of the component 1 to the component insertion head 61 are the same as in the case of FIG. 41, and so their description is omitted. The component 1 that has been delivered to the component insertion head 61 is in a state in which the terminal-side lead wire 3b is positioned on an upper side with respect to the center-side lead wire 3a as viewed in FIG. 42. Thereafter, an inversion of the component 1 is performed for proper setting of polarity so that the terminal-side lead wire 3b is positioned on a side shown in FIG. 42 with respect to the center-side lead wire 3a. However, in such a case, there would occur positional shifts of insertion positions of respective lead wires 3 so that an insertion operation of the component 1 could not be performed normally. Also, for example, even if the insertion operation of the component 1 is performed, there would be a case where individual lead wires 3 after insertion are bent in the same direction due to the fact that the component has not been inserted normally. In such a case, sufficient fixation of the component 1 to the circuit board 6 could not be achieved.

Accordingly, for a solution of such problems, applying a polarity adjustment method, which has been applied to the conventional component insertion apparatus, to this embodiment results in a case as shown in FIG. 43. As shown in FIG. 43, with the component 1 to be subjected to an insertion operation of the component 1 for polarity adjustment, correction of a holding position for the component conveyance section 20 is performed in the component conveyance section 20 in advance with an allowance for a positional shift involved in an inversion operation. At the component insertion head 61, the component 1 that has been subjected to correction of a holding position is delivered with the terminal-side lead wire 3b upward of the center-side lead wire 3a as viewed in FIG. 43. Then, the component 1 is inverted so that respective lead wires 3 are inverted in their position. Even in such a case, since correction has been performed with allowance for a positional shift amount, there occurs no positional shift in the component insertion head 61. Therefore, the insertion operation of the component 1 can be performed in a state that polarity adjustment has been achieved.

However, in such a method, although the insertion operation of the component 1 can be performed normally in a state that the polarity adjustment has been achieved, it is necessary to equip the component insertion apparatus with a holding-position correcting device or the like that performs correction of the holding position in advance with allowance for a positional shift amount as described above. Installing such a device would cause an obstacle to constructional simplification of the component insertion apparatus, and additionally an obstacle to downsizing of the component insertion apparatus, problematically.

Accordingly, in the component insertion apparatus 101 of this embodiment, as shown in FIG. 44, occurrence of positional shift of the component 1 is prevented by utilizing a rotational angle of the transfer chuck 47 instead of the correction of the holding position in the component conveyance section 20. More specifically, for rotation of the component 1 positioned at the component delivery position by the transfer chuck 47, whereas the component 1 would originally be rotated by, for example, an angle θ, a positional shift amount is allowed for in advance and rotation angle is adjusted by an angle α corresponding to the positional shift amount instead. In the case of FIG. 44, rotation of the component 1 is performed with a rotation angle of the transfer chuck 47 set to an angle (θ−α). Thereafter, the component 1 is inverted for polarity adjustment. Since the rotation angle has been adjusted with allowance of the positional shift amount in advance, an insertion operation of the component 1 can be achieved normally.

According to such a method, even in a case where inversion for polarity adjustment of the component 1 is performed, there is no need for installing any special device for performing correction in advance with allowance for a positional shift amount that occurs due to such inversion, and polarity adjustment of the component 1 can be achieved only by making it possible to achieve rotation with any arbitrary rotational angle by the transfer chuck 47. Thus, a constructional simplification of the component insertion apparatus 101 can be achieved while a downsizing of the apparatus can also be achieved at the same time.

(Height Adjustment of Slide Base)

In the component insertion apparatus 101, insertion of various components 1 is performed, and such various components 1 have various sizes, and particularly, their device portions 2 have various heights. A positional relationship between a height size of the device portion 2 of the component 1 and the component insertion head 61 or the component conveyance section 20 in their heightwise direction is shown in FIG. 45.

Figure 45:
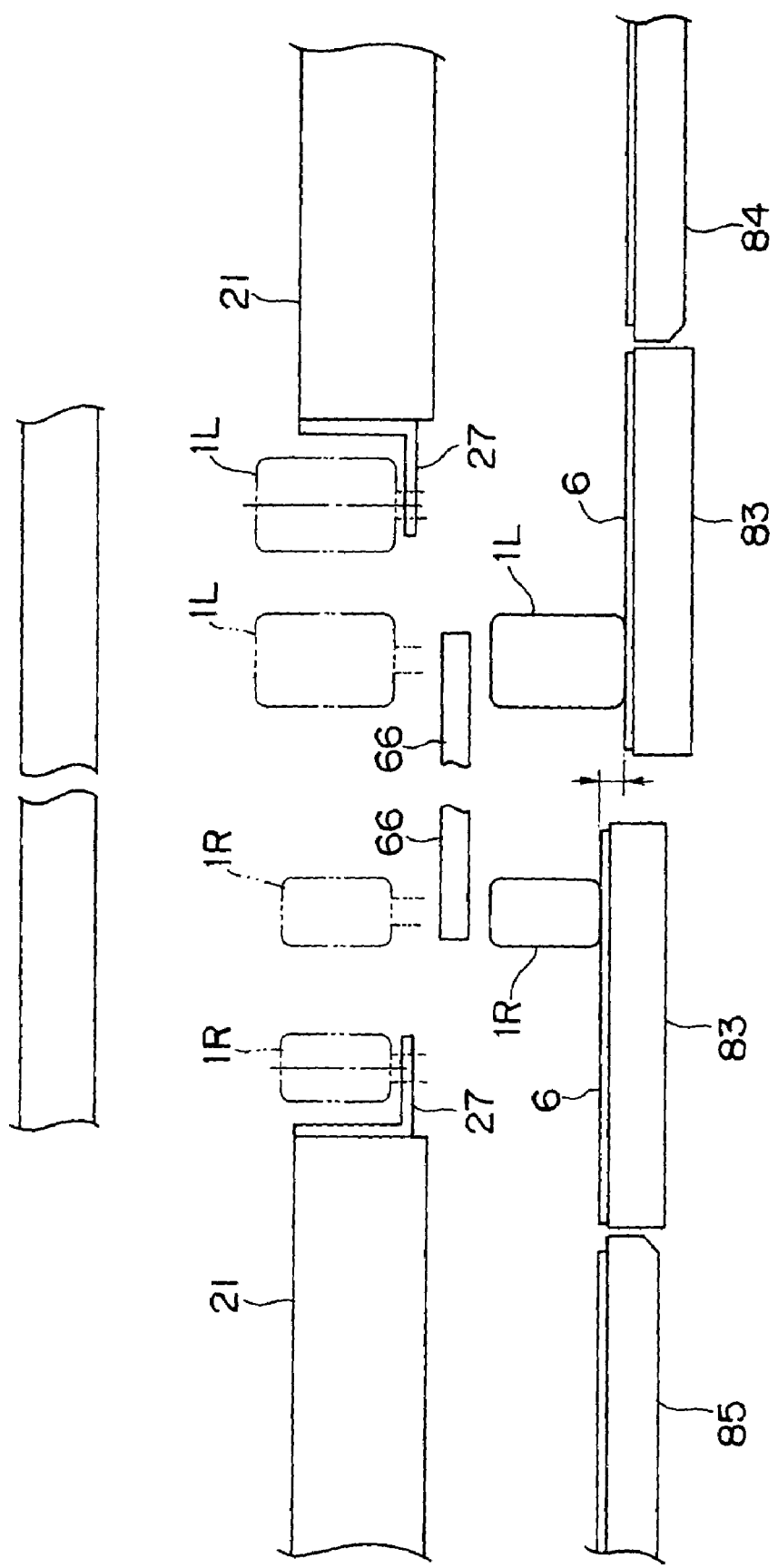
FIG. 45 is a schematic view of a slide base, a component insertion head, and a height relationship of components in the component insertion apparatus.

As shown in FIG. 45, standard-size components 1R are shown on the left side in the figure, while large-size components 1L are shown on the right side in the figure. Further, as shown in FIG. 45, the slide base 83 for fixing the circuit board 6 is enabled to adjust a fixed height of the circuit board 6. In contrast to circuit boards 6 into which the standard-size components 1R are to be inserted, circuit boards 6 into which large-size components 1L are to be inserted are adjusted to a low fixed height by the slide base 83, so that inserted large-size components 1L can be prevented from interfering with the conveyor belt 21 of the component conveyance section 20 or the like even in such cases where the circuit boards 6 into which the large-size components 1L have been inserted are moved in the X-axis direction or Y-axis direction.

Also, by virtue of adjustability of the fixed height of the circuit boards 6 by the slide base 83 as shown above, the large-size components 1L inserted into the circuit boards 6 can also be prevented from interfering with the guide chuck 66 in the component insertion head 61. In the conventional component insertion apparatus, means for preventing above-described interference in conjunction with changes in height of components 1 would be implemented by changing height of the component insertion head itself or its replacement, which has involved much time and labor for such measures and has been a cause of lowered productivity. By contrast, in the component insertion apparatus 101 of this embodiment, only adjusting the height of the slide base 83 will easily do without performing height changes of the component insertion head 61 or its replacement. Therefore, a component insertion operation in the component insertion apparatus 101 can be efficiently achieved, so that productivity can be improved.

(Modification Example of Component Conveyance Section)

Figure 46:
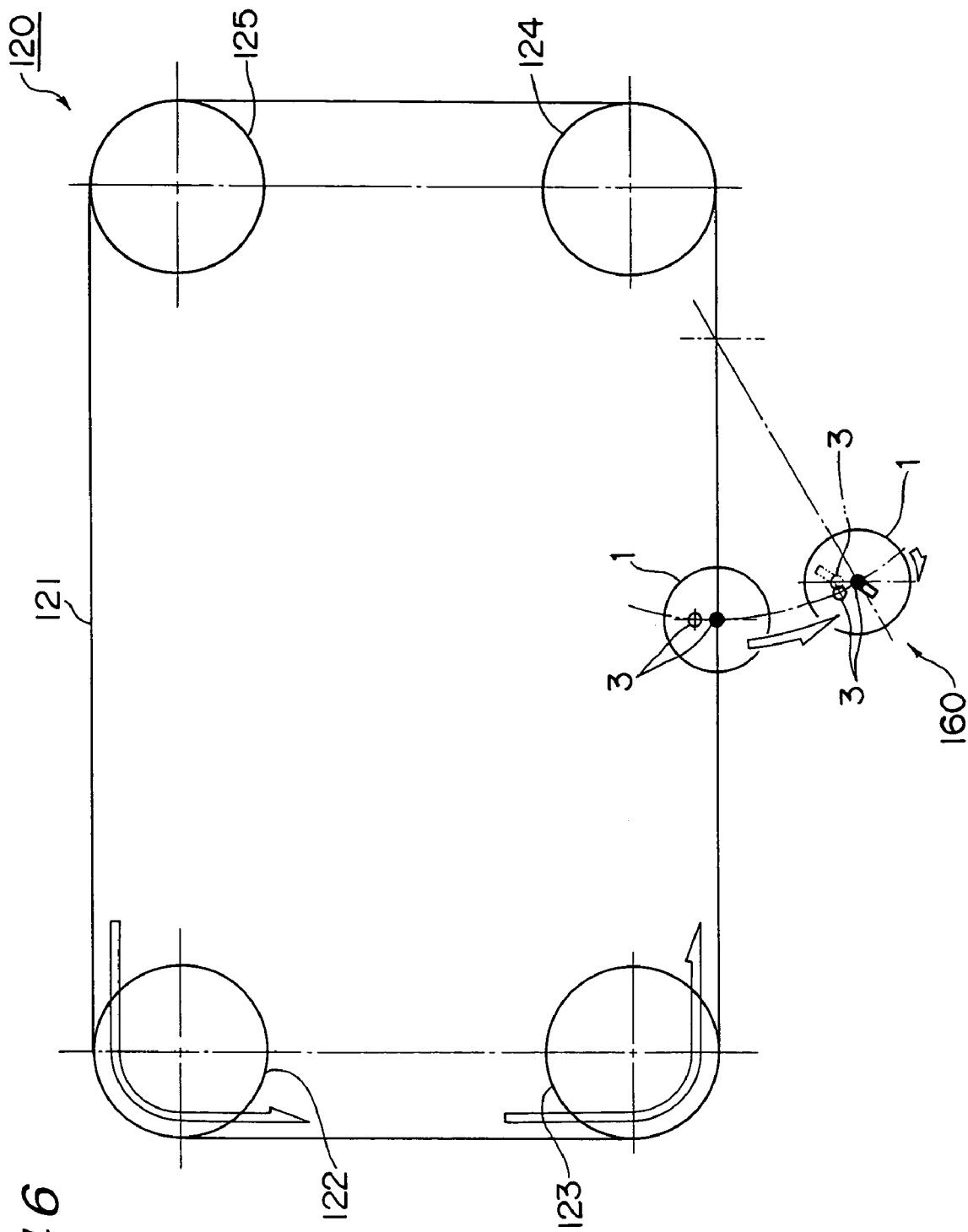
FIG. 46 is a schematic view of a component conveyance section in a component insertion apparatus in a modified example of the one embodiment.

In the component insertion apparatus 101 of this embodiment, the above description has been made for a case where the apparatus is equipped with a component conveyance section 20 in which the conveyor belt 21 is driven to run by the three pulleys 23, 24, 25. However, the component conveyance section is not limited to only such configuration. For instance, as a modification example of the component conveyance section, a schematic configuration of a component conveyance section 120 is shown in FIG. 46. As shown in FIG. 46, the component conveyance section 120 has four pulleys 122, 123, 124, 125 and a conveyor belt 121 stretched over these pulleys 122, 123, 124, 125. The conveyor belt 121 is stretched planarly in a generally rectangular shape, as shown in FIG. 46, and driven to run counterclockwise as viewed in the figure by an unshown drive means (motor etc.). It is noted that this running drive is an intermittent one, and the chuck 27 is attached to the conveyor belt 121, as in the component conveyance section 20.

Also, the component 1 that has been conveyed up to a component delivery position located in an interval between the pulleys 123 and 124, as it is held on a chuck by the conveyor belt 121, is transferred to a component insertion section 160 by a component transferer (not shown). Since the conveyor belt 121 is stretched in a generally rectangular shape, an array direction of lead wires of the component 1 is inclined in the component insertion section 160 as shown in FIG. 46 by rotational movement of the component transferer, wherein rotating the component 1 by a component insertion head (not shown) allows an inclined state to be corrected.

Thus, even in a case where the component conveyance section 120 is equipped with the four pulleys 122 to 125 and the conveyor belt 121 stretched in a generally rectangular shape, a transfer operation of the component 1 can be performed.

(Modification Example of Body Chuck)

Figure 37:
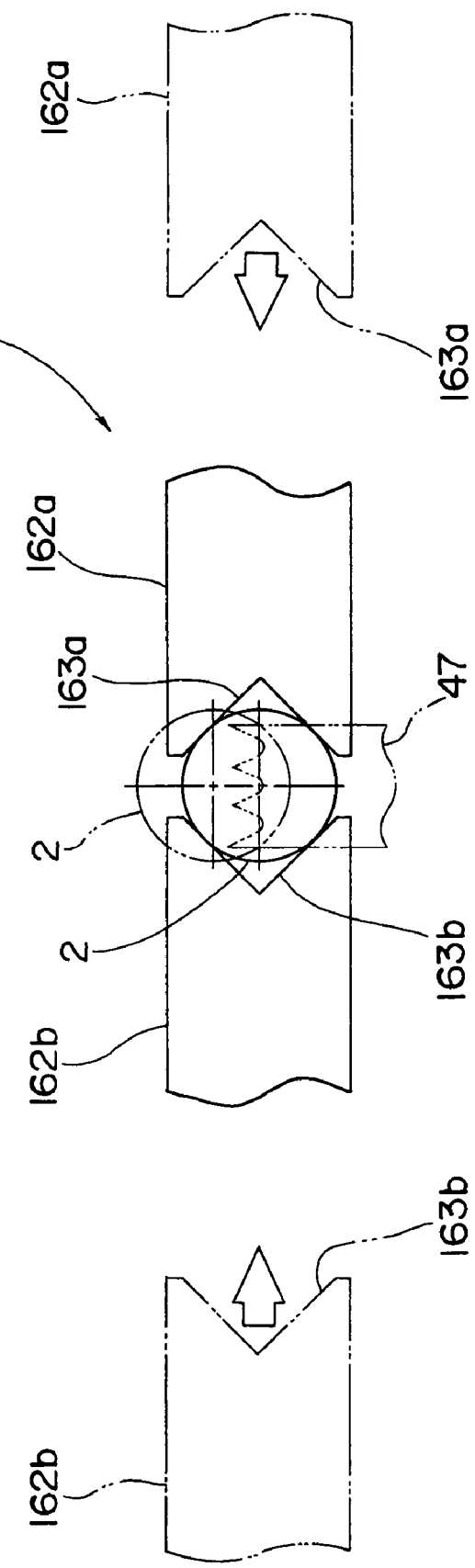
FIG. 37 is a schematic view showing a modification example of the body chuck in the component insertion apparatus of the one embodiment.

Next, as a modification example of the body chuck 62 in the component insertion head 61, a schematic configuration diagram of a body chuck 162 is shown in FIG. 37. As shown in FIG. 37, the body chuck 162 includes two body chucks 162a, 162b faced to each other, and the body chucks 162a, 162b are enabled to grasp the device portion 2 of the component 1 by being made to approach each other, and to release grasping of the device portion 2 of the component 1 by being made to separate from each other, as in the body chuck 62. However, the body chuck 162 differs therefrom in that V-shaped cut-in portions 163a, 163b are formed in mutually facing component grasping surfaces of the body chucks 162a, 162b. The body chuck 162 differs therefrom also in that respective body chucks 162a, 162b are moved (i.e. moved so as to approach or separate from each other) along an array direction of lead wires of the component 1. That is, the V-shaped cut-in portions 163a, 163b formed at tip end portions of the body chucks 162a, 162b, respectively, as shown in FIG. 37 allows grasping of the device portion 2 of the component 1 to be achieved while its inclination is corrected by the cut-in portions 163a, 163b.

Thus, even in a case where the body chucks 162a, 162b are arranged so as to be moved along the array direction of the lead wires of the component 1, an inclination correction of the device portion 2 of the component 1 can be performed in the same manner as in the case of the body chucks 62a and 62b by virtue of formation of the V-shaped cut-in portions 163a, 163b.

(Application Examples of Component Insertion Method)

Next, several examples of a component insertion method that can be performed based on the component insertion method described in this embodiment are described below. Schematic explanatory views of such application examples of the component insertion method are shown in FIGS. 47A to 47D, respectively. It is noted that FIG. 47A is a schematic explanatory view of the component insertion method of this embodiment that has already been described above.

First, in the component insertion method shown in FIG. 47B, the component insertion apparatus 101 does not include the component transferer 40 for transferring the component 1, which has been conveyed to the component delivery position by the component conveyance section 20, to the component insertion section 60, which has been included in this embodiment, but includes a lead chuck 247 for performing the above-described transfer operation of the component 1 instead of the component transferer 40 (in this application example, the lead chuck 247 is an example of transfer chuck 247). The component insertion method differs from the foregoing only in that this lead chuck 247 is used in the insertion operation of the component 1.

As shown in FIG. 47B, the lead chuck 247 has grasping portions formed in one pair so as to be able to grasp the lead wire 3 of the component 1 at its tip end portion, and is further enabled to move the component 1, whose lead wire 3 is grasped, from the component delivery position of the component conveyance section 20 to the component conveyance section 20 by an unshown moving device. Furthermore, the moving device is enabled also to perform up/down operations of the lead chuck 247.

Insertion operation of the component 1 using such a lead chuck 247 is described below.

First, the lead chuck 247 is moved by the moving device to a position where the lead wire 3 of the component 1 that has been conveyed to the component delivery position by the component conveyance section 20 is graspable. After the lead chuck 247 has been moved to this position, the lead wire 3 of the component 1 is releasably grasped by tip end portions of the lead chuck 247. Along with this grasping, the lead chuck 247 is moved to the component insertion section 60 by the moving device, so that the component 1 with the lead wire 3 kept grasped is moved to the component insertion section 60. It is noted that this movement of the component 1 is performed so that the tip end portion of the lead wire 3 of the component 1 coincidentally comes upon the up/down operational axis of the pusher 64 in the component insertion head 61.

Along with this, the guide chuck 66 is put into a state that its butting surfaces G are butted to each other. Then, a tip end portion of the guide pin 81 that has been moved up through the insertion hole 6a of the circuit board 6 is inserted into a through hole 77 from an underside of the guide chuck 66 in a butted state so as to be engaged with the through hole 77.

Thereafter, the lead chuck 247 that has moved the lead wire 3 with its tip end portion coincidentally upon the up/down operational axis is moved down along the up/down operational axis by the moving device. The tip end portion of the lead wire 3 is inserted into the through hole 77 of the guide chuck 66, where the tip end portion of the lead wire 3 is engaged with a recess portion 31a (not shown) of the tip end portion of the guide pins 81 previously engaged with the through hole 77. Thus, the move-down of the lead chuck 247 by the moving device is stopped.

Thereafter, the pusher 64 is moved down along the up/down operational axis so that an upper portion of the device portion 2 of the component 1, with the tip end portion of the lead wire 3 engaged with the recess portion 81a of the tip end of the guide pin 81 in the through hole 77, is brought into contact with an unshown depressed portion formed in a lower end portion of the pusher 64. Thus, the component 1 is sandwiched by the pusher 64 and the guide pin 81 in a direction along the up/down operational axis, so that the tip end portion of the lead wire 3 and the recess portion 81a of the guide pin 81 are held engaged with each other.

After this engagement is held, a butting state of the guide chuck 66 is released and further grasping of the lead wire 3 of the component 1 by the lead chuck 247 is released. Thereafter, with an engagement holding state maintained, the pusher 64 and the guide pin 81 are moved down synchronously at the same speed, by which the component 1 is moved down while the lead wire 3 of the component 1 is led so as to pass through the insertion hole 6a of the circuit board 6. Thereafter, the component 1 is fixed to the circuit board 6 in the same procedure as in the above-described component insertion method, wherein an insertion operation of the component 1 to the circuit board 6 is completed.

In such a component insertion method, a transfer operation of the component 1, which has been conveyed to the component delivery position by the component conveyance section 20, to the component insertion section 60 can be performed by the lead chuck 247 instead of the component transferer 40, and moreover the component 1 can be delivered so as to be holdable by the pusher 64 and the guide pin 81.

The above component insertion method has been described for a case where correction of any bend of the lead wire 3 of the component 1 is not performed. However, the case may otherwise be that correction of any bend of the lead wire 3 of the component 1 is performed. A schematic explanatory view of the component insertion method in which the correction of bend is performed is shown in FIG. 47C.

As shown in FIG. 47C, in a state that the component 1 with the lead wire 3 grasped by the lead chuck 247 has been moved to the component insertion section 60, a closing operation of the body chuck 62 provided in the component insertion head 61 is performed, by which the device portion 2 of the component 1 is grasped by the body chuck 62. In a case where the lead wire 3 of the component 1 is bent and inclined, a bend of bent lead wire 3 can be corrected by this grasping operation of the body chuck 62 on a fulcrum given by a grasping position of the lead wire 3 by the lead chuck 247.

It is noted that this grasping of the device portion 2 by the body chuck 62 is released at a timing during a period after correction of the bend until engagement between the pusher 64 and the recess portion 81a of the guide pin 81 is put into a holding state.

In such a component insertion method, even in a case where the lead chuck 247 is used instead of the component transferer 40 as described above, correction of the bend of the lead wire 3 of the component 1 can be achieved as in the case of the component insertion method of this embodiment. Thus, reliable insertion of the component 1 can be achieved, so that a component insertion method with enhanced productivity can be provided.

Next, a component insertion method shown in FIG. 47D is a component insertion method using such a lead chuck 347 that the lead chuck 247 is further given a structure of being capable of fulfilling a function of the guide chuck 66.

As shown in FIG. 47D, the lead chuck 347 is in common to the lead chuck 247 of FIGS. 47B and 47C in that those lead chucks can reliably grasp the lead wire 3 of the component 1 at their tip end portion. The lead chuck 347 is further formed into such a shape that a through hole 377 similar in shape to the through hole 77 of the guide chuck 66 can be formed at its tip end portion.

More specifically, in the lead chuck 347 equipped with one pair of grasping positions, in state that their respective grasping positions are butted against each other, an upper-side small-diameter hole 377a with a diameter generally equal to or slightly smaller than a diameter of the lead wire 3 of the component 1 is formed on an upper side of a butting surface of the lead chuck 347. Also, a lower-side funnel-shaped hole 377b similar in shape to the lower-side funnel-shaped hole 77b of the guide chuck 66 is formed on a lower side of the butting surface of the lead chuck 347. It is noted that the upper-side small-diameter hole 377a and the lower-side funnel-shaped hole 377b are integrally formed so as to extend to and from each other, by which a through hole 377 is formed. This through hole 377 is formed half by half on butting surfaces of respective grasping positions so that the through hole 377 is made up only when the pair of grasping positions in the lead chuck 347 are butted against each other.

The lead chuck 347, as a result of being formed in this way, is enabled to fulfill the function of the guide chuck 66 as well. In this application example, the lead chuck 347 is an example of a transfer chuck.

Next, a component mounting operation using the lead chuck 347 as described above is explained.

First, the lead chuck 347 is moved by a moving device so that the tip end portion of the lead wire 3 of the component 1 that has been conveyed to the component delivery position by the component conveyance section 20 becomes graspable at the upper-side small-diameter hole 377a of the through hole 377 of the lead chuck 347. After this movement, the tip end portion of the lead wire 3 of the component 1 is releasably grasped at an inner side of the upper-side small-diameter hole 377a formed by the pair of grasping positions of the lead chuck 347 being butted against each other. Along with this grasping, the lead chuck 347 is moved to the component insertion section 60 by the moving device, so that the component 1 with the lead wire 3 kept grasped is moved to the component insertion section 60. It is noted that this movement of the component 1 is performed so that the tip end portion of the lead wire 3 of the component 1 coincidentally comes upon the up/down operational axis of the pusher 64 in the component insertion head 61.

Along with this, a tip end of the guide pin 81 that has been moved up through the insertion hole 6a of the circuit board 6 is inserted into the lower-side funnel-shaped hole 377b formed by the pair of grasping positions of the lead chuck 347 being butted against each other. A recess portion 81a (not shown) of the tip end of this inserted guide pin 81 is guided by an inner circumferential surface of the lower-side funnel-shaped hole 377b so as to be engaged with the lead chuck 347 of the component 1 that has been inserted in the upper-side small-diameter hole 377a.

As shown in FIG. 47D, thereafter, the pusher 64 is moved down along the up/down operational axis, so that an upper portion of the device portion 2 of the component 1, which is in a state that the tip end portion of the lead wire 3 is engaged with the recess portion 81a of the tip end portion of the guide pin 81 within the through hole 377, is put into contact with an unshown depressed portion formed in a lower end surface of the pusher 64. Then, the tip end portions of the lead wires 3 and the recess portion 81a of the guide pin 81 are held in this engaged state in such a way that the component 1 is sandwiched by the pusher 64 and the guide pin 81 in the direction along the up/down operational axis.

After this engagement is held, grasping of the lead wire 3 of the component 1 by the lead chuck 347 is released. Thereafter, with an engagement holding state maintained, the pusher 64 and the guide pin 81 are moved down synchronously at the same speed, by which the component 1 is moved down while the lead wire 3 of the component 1 is led so as to pass through the insertion hole 6a of the circuit board 6. Thereafter, the component 1 is fixed to the circuit board 6 in the same procedure as in the above-described component insertion method, wherein an insertion operation of the component 1 to the circuit board 6 is completed.

In such an insertion method for the component 1, the lead chuck 347 has, in addition to a function of grasping the lead wire 3 of the component 1, another function of aiding the engagement between lead wire 3 of the component 1 and the recess portion 81a of the guide pin 81, i.e., the function of the guide chuck 66, at the same time in combination, thus eliminating a need for the guide chuck 66 and allowing structure of the component insertion head to be simplified.

Furthermore, in such a component insertion method using the lead chuck 347, performing a grasping operation of the device portion 2 of the component 1 by the body chuck 62 in combination makes it possible to achieve correction of a bend of the lead wire 3 of the component 1 as in the case of the foregoing individual component insertion methods. Thus, a reliable insertion operation of the component 1 can be achieved, so that a component insertion method with enhanced productivity can be provided.

(Working Effects by this Embodiment)

According to the above embodiment, following various working effects can be obtained.

First, in the component insertion head 61 of the component insertion apparatus 101, since the insertion chuck mechanism 63 for performing a grasping operation of fed component 1 is so constructed as to be able to control a grasping pressure of the component 1 by the respective insertion chucks 62a and 62b, the grasping pressure can be controlled to an optimum pressure according to characteristics (or type or properties) of fed and grasped individual components 1. Thus, for various types of components 1, a reliable grasping can be achieved and a component insertion operation can be managed flexibly.

More specifically, with regard to components 1 which belong to component category A and which, as have been increasing in recent years, are thin in formation thickness of a shell membrane of the device portion 2 with a view to reducing a manufacturing cost of the component 1, since rigidity of its device portion 2 is lower as compared with standard components, grasping of such a component 1 by the insertion chucks 62a and 62b can be performed by exerting such control that the grasping pressure becomes lower based on information as to the components 1 inputted in the control section 9 or the like. Controlling the grasping pressure lower like this makes it possible to prevent damage or the like of the components 1 due to occurrence of plastic deformation or the like of the device portion 2 of the component 1 during grasping, so that the grasping can be managed flexibly for various types of components 1.

Also, such a constitution that the grasping pressure in the insertion chuck mechanism 63 is made controllable can be achieved by providing in the cylinder portion 70 of the insertion chuck driving section 71a mechanism that makes high- or low-pressure compressed air selectable, and by this mechanism being made controllable by the insertion chuck control section 509, and by supplying compressed air selected from high- or low-pressure compressed air to the cylinder portion 70 according to characteristics of various types of components 1.

Also, the above working effects can be achieved on basis that the grasping pressure of the respective insertion chucks 62a and 62b which are driven by the low-pressure compressed air selectively supplied from the mechanism to the cylinder portion 70 is such a pressure that the device portion 2 of the component 1 is not plastically deformed.

Also, based on controllability of a strength/weakness of the grasping pressure as shown above, performing grasping with a grasping pressure selected as a proper one suited for individual components 1 belonging to component category B, C or D other than the component category A (components 1 in which the device portion 2 is large and heavyweight, components 1 in which rigidity of the lead wires 3 is high, and components 1 in which the device portion 2 is small and the lead wires 3 are long) makes it possible to stabilize a grasping posture or to prevent occurrence of slides during grasping, so that a secure grasping operation can be achieved.

Further, on basis that, in the component insertion head 61 of the component insertion apparatus 101, the pusher mechanism 65 equipped with the pusher 64 for pressing the device portion 2 of the component 1 fed and grasped (or grasping-released) by the insertion chucks 62a and 62b is so constructed as to be able to control a pressing force during pressing, it becomes implementable to control the pressing force to an optimum pressure according to characteristics (or type or properties) of pressed individual components 1. Thus, for various types of components 1, a reliable pressing can be achieved and a component insertion operation can be managed flexibly.

More specifically, with regard to components 1 belonging to component category A, since rigidity of its device portion 2 is lower as compared with the standard components, pressing of such a component 1 by the pusher 64 can be performed by exerting such control that a pressing force becomes lower based on information as to the components 1 inputted in the control section 9 or the like. Controlling the pressing force lower like this makes it possible to prevent damage or the like of the components 1 due to occurrence of plastic deformation or the like of the device portion 2 of the component 1 during grasping, so that pressing can be managed flexibly for various types of components 1.

Also, with regard to the components 1 belonging to component category C, since its lead wires 3 are formed higher in rigidity as compared with the standard components, pressing can be performed by exerting such control that a pressing force becomes higher when cut-and-clinch of the lead wires 3 is performed with the device portion 2 pressed and held on the top surface of the circuit board 6 by the pusher 64 in a state that the lead wires 3 of such a component 1 are inserted in the insertion holes 6a of the circuit board 6. Controlling the pressing force higher like this makes it possible to hold the component 1 while countering a large force applied to the lead wires 3 during the cut-and-clinch, so that pressing can be managed flexibly for various types of components 1.

Also, such a constitution that a pressing force in the pusher mechanism 65 is made controllable can be achieved by providing at the hollow portion of the slide shaft 74 of the pusher up/down moving unit 73 a mechanism that makes high- or low-pressure compressed air selectable, by this mechanism being made controllable by the pusher control section 522, and by supplying compressed air selected from high- or low-pressure compressed air to the hollow portion according to characteristics of the various types of components 1.

Also, the above working effects can be achieved on basis that a pressing force of the pusher 64 which is applied by the low-pressure compressed air selectively supplied from the mechanism to the hollow portion of the slide shaft 74 is such a pressure that the device portion 2 of the component 1 belonging to component category A is not plastically deformed.

Also, based on controllability of strength/weakness of the pressing force as shown above, performing pressing with a pressing force selected as a proper one suited for individual components 1 belonging to component category B, C or D other than component category A (components 1 in which the device portion 2 is large and heavyweight, components 1 in which rigidity of the lead wires 3 is high, and components 1 in which the device portion 2 is small and the lead wires 3 are long) makes it possible to stabilize a posture in which engagement between the guide pins 81 and the lead wires 3 is maintained or to prevent occurrence of sliding of the component 1 grasped during pressing or to prevent occurrence of buckling of the lead wires 3 during cut-and-clinch operation, so that a secure pressing operation can be achieved.

Also, particularly in the component insertion head apparatus in conventional component insertion apparatuses, a mechanical spring member is often used in a mechanism for grasping the device portion 2 of such a component 1 or in a mechanism for pressing the same, thereby making it difficult to adjust its spring pressure in that spring member. In this connection, there is produced a working effect in that issue of difficulty in adjusting a grasping pressure or a pressing force can be solved.

Further, in a case where the component 1 is a radial component, during operations in which the component 1 with its respective lead wires 3 grasped by the transfer chuck 47 is moved to the component insertion head 61 by movement of the transfer chuck 47, and that a grasping operation of the component 1 for an insertion operation of the component 1 is performed by the body chuck 62 in the component insertion head 61, it becomes possible to perform correction of an insertion posture of the component 1 along with this grasping.

More specifically, after the component 1, which is a radial component and which has its respective lead wires 3 grasped by the transfer chuck 47, has been positioned between the one pair of mutually opposing insertion chucks 62a and 62b, the insertion chucks 62a and 62b are moved so as to approach each other, by which grasping of the device portion 2 of the component 1 is performed. For the component 1, there are some cases where, for example, due to some external force applied to the component 1 during its prior conveyance process, the device portion 2 has been inclined. Even in such a case, through an approaching operation of the respective insertion chucks 62a and 62b, an insertion posture of the component 1 can be corrected while this inclined device portion 2 is being pressed by either one of the insertion chucks 62a and 62b on a fulcrum given by a grasping position of the lead wires 3 by the transfer chuck 47 in such a manner that a bend of the lead wires 3 is corrected. Along with this, grasping of the device portion 2 of the component 1 whose insertion posture has been corrected can be achieved.

By performing correction of the insertion posture of the component 1 before its insertion operation into the circuit board 6 as shown above, occurrence of miss pushing upon push-down of the device portion 2 by the pusher 64 during insertion operation can be prevented, and interference of the component 1 inserted into the circuit board 6 with neighboring other components 1 can also be prevented, so that reliable, accurate component insertion can be achieved.

In particular, in some conventional component insertion apparatuses, measures for such correction of an insertion posture of the component 1 are taken by installing an exclusive device for performing such correction in a component conveyance section or by other like means. However, in this embodiment, there is no need for providing such device, and correction can be achieved by using the body chuck 62 provided in the component insertion head 61 to perform the insertion operation of the component 1, thus allowing a construction of the component insertion apparatus 101 to be simplified. Moreover, since a space on the apparatus base 102 can be utilized effectively, a downsizing of the component insertion apparatus 101 can be implemented.

Further, since the correction can be performed along with grasping of the component 1 by the body chuck 62 serving for the insertion operation of the component 1, no working time is required for performing the correction alone, so that time required for the insertion operation of the component 1 can be reduced, and productivity of the component insertion apparatus 101 can be improved.

Generally, the component 1 has a characteristic in that the lead wires 3 are easier to bend in a direction perpendicular to the array direction of the lead wires, depending on the array of the lead wires 3. In the above embodiment, since the body chucks 62a and 62b are disposed in such a way that the component 1 to be grasped by those body chucks 62a and 62b is grasped in a direction perpendicular to the array direction of the lead wires, a correction of an insertion posture of the component 1 can be performed in the perpendicular direction, so that more effective correction of the insertion posture can be achieved, and productivity of the component insertion apparatus 101 can be improved.

Also, the component conveyance section 20 and the component insertion section 60 are disposed so that a component delivery position of the component conveyance section 20 and a grasping position (delivery position) of the component 1 by the body chuck 62 in the component insertion section 60 are each placed on a rotational arc that is a locus of rotation of the transfer chuck 47. In conventional component insertion apparatuses, a combination of rotation and forward or backward motion of a transfer chuck would be involved in movement operations of similar components 1. However, according to this embodiment, by virtue of the above arrangement, transfer movement operations of the component 1 can be performed only by a rotational operation of the transfer chuck 47. Accordingly, time required for a transfer operation of the component 1 can be reduced, and a component insertion apparatus 101 capable of performing more efficient, higher-productivity component insertion operation can be provided.

Also, in the component insertion apparatus 101, as the component feed method, not a random access method but a sequence method is adopted. In the random access method, a component feed section is moved along an array direction of individual taped component trains (i.e., a widthwise direction of the apparatus), by which selection of components to be fed is performed a the feed operation of components is performed. Therefore, to ensure space for this movement, the component insertion apparatus would be elongated in a widthwise direction, posing a problem in that an apparatus size would be increased.

Further, in the random access method, since the component feed operation is performed by movement of the component feed section as described above, replacement of components (taped component train) in the component feed section cannot be performed during operation of the component insertion apparatus, and component replacement needs to be performed after the apparatus under operation is once halted, which would be one of causes that obstruct productivity improvement in the component insertion apparatus as another problem.

By contrast, in the sequence method adopted in this embodiment, since the component feed section does not move in the widthwise direction of the apparatus for a component feed operation, there is no need for ensuring space therefor and, moreover, component replacement work can be performed even during operation of the apparatus. Accordingly, a further downsizing of the apparatus becomes implementable, and a component insertion apparatus with high productivity can be provided.

By properly combining arbitrary embodiments of the aforementioned various embodiments, effects possessed by the embodiments can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The invention claimed is:

1. A method for inserting components to a board, comprising:
- at a component grasping position, releasably grasping a first component, having a device portion and a lead wire at said device portion, by applying a first grasping pressure to the device portion of said first component;
- while releasably grasping said first component, performing a first positional alignment in a direction along a surface of the board to align said lead wire of said first component and a first lead-wire insertion hole of said board;
- after said performing of said first positional alignment, inserting said lead wire of said first component into said first lead-wire insertion hole of said board;
- at said component grasping position, releasably grasping a second component, having a device portion and a lead wire at said device portion, by applying a second grasping pressure to the device portion of said second component;
- while releasably grasping said second component, performing a second positional alignment in a direction along said surface of said board to align said lead wire of said second component and a second lead-wire insertion hole of said board;
- after said performing of said second positional alignment, inserting said lead wire of said second component into said second lead-wire insertion hole of said board; and
- for at least one of said first and second components, correcting an insertion posture of the component prior to said inserting of the lead wire of the component into the respective one of the first and second lead-wire insertion holes,
- wherein said correcting of the insertion posture of the component includes grasping said lead wire of said component and performing positional alignment in a direction along a surface of the board between the lead wire of the component and the respective lead-wire insertion hole of the board, and grasping the device portion of the component whose lead wire is grasped so as to move the device portion in the direction along the surface of the board about a fulcrum defined at a grasped position of the lead wire to correct a bend of the lead wire such that the device portion is placed at a component insertion position,
- wherein said device portion of said first component is lower in rigidity than said device portion of said second component,
- wherein said releasably grasping of said first component and said releasably grasping of said second component are carried out such that said first grasping pressure applied to said first component is lower than said second grasping pressure applied to said second component,
- wherein said first and second grasping pressures are such that said releasably grasping of said first component and said releasably grasping of said second component are carried out without plastically deforming configurations of the device portions of said first and second components,
- wherein said first and second components comprise radial components, respectively.

2. The component insertion method according to claim 1, wherein
- after the correction of the insertion posture of the component, an end portion of the lead wire of the component is held by a guide pin through the insertion hole of the board, and the grasping of the device portion and the grasping of the lead wire are released; and
- the guide pin is moved so that the end portion of the lead wire is guided to the insertion hole of the board, thereby inserting the lead wire of the component into the insertion hole.

3. The component insertion method according to claim 1, wherein
- each of the components that are radial components has a plurality of the lead wires formed so as to be arrayed in one line, and
- the correction of the insertion posture of the component is performed by moving the device portion in a direction extending along a surface of the board and generally perpendicular to the array direction of the lead wires.

* * * * *